US006420763B1

(12) United States Patent
Yamashita et al.

(10) Patent No.: US 6,420,763 B1
(45) Date of Patent: *Jul. 16, 2002

(54) SEMICONDUCTOR DEVICE HAVING A RETROGRADE WELL STRUCTURE AND METHOD OF MANUFACTURING THEREOF

(75) Inventors: Tomohiro Yamashita; Shigeki Komori; Masahide Inuishi, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/917,528

(22) Filed: Aug. 26, 1997

(30) Foreign Application Priority Data

Aug. 26, 1996 (JP) ............................................. 8-223939

(51) Int. Cl.⁷ ........................... H01L 29/76; H01L 29/94

(52) U.S. Cl. ........................ 257/375; 257/345; 257/404

(58) Field of Search ................................. 257/345, 369, 257/371, 372, 373, 375, 404, 548, 917, 927; 438/199, 223, 224, 227, 228, 217, 286

(56) References Cited

U.S. PATENT DOCUMENTS

| | | | |
|---|---|---|---|
| 4,442,591 A | * 4/1984 | Haken | 257/371 |
| 4,470,191 A | * 9/1984 | Cottrell et al. | 257/372 |
| 4,562,638 A | 1/1986 | Schwabe et al. | 438/200 |

(List continued on next page.)

FOREIGN PATENT DOCUMENTS

| | | | |
|---|---|---|---|
| DE | P 33 40 560.3 | | 5/1985 |
| DE | P 41 21 292.4 | | 1/1992 |
| JP | 1-96962 | * | 4/1989 |
| JP | 07058212 | | 3/1995 |
| JP | 7-183393 | | 7/1995 |

OTHER PUBLICATIONS

"Vertical Isolation in Shallow n–Well CMOS Circuits," *IEEE Electron Device Letters*, Lewis et al., vol. EDL–8, No. 3, Mar. 1987, pp. 107–109.
"A Highly Latchup–Immune 1μm CMOS Technology Fabricated With 1 MeV Ion Implantation and Self–Aligned TiSi₂," *IEEE*, Lai et al., 1985, pp. 513–516.
"Trends in Advanced Process Technology–Submicrometer CMOS Device Design and Process Requirements," Proceedings of the IEEE, Brown et al., vol. 74, No. 12, Dec. 1986, pp. 1678–1702.
"A Twin–Well CMOS Process Employing High–Energy Ion Implantation," IEEE, Stolmeijer, vol. ED–33, No. 4, Apr. 1986, pp. 450–457.
K. Tsukamoto et al., "High–Energy Ion Implantation For ULSI" 1991 pp. 584–591.
F.S. Lai et al. "A Highly Latchup–Immune 1 μm CMOS Technology Fabricated With 1 MeV Ion Implantation and Self–Aligned TiSi₂ " pp. 513–516 1985.

*Primary Examiner*—Steven Loke
*Assistant Examiner*—Hung Kim Vu
(74) *Attorney, Agent, or Firm*—McDermott, Will & Emery

(57) ABSTRACT

A semiconductor substrate is of a first conductivity type and has a retrograde well impurity concentration. A first of the first conductivity type and having a second impurity concentration with an impurity concentration peak is formed on a main surface of the semiconductor substrate. A first impurity layer of a third impurity concentration comes into contact with the underside of the retrograde well. The third impurity concentration is smaller than the impurity concentration peak of the first impurity concentration and the second impurity concentration. An element is formed on the retrograde well.

27 Claims, 44 Drawing Sheets

U.S. PATENT DOCUMENTS

| | | | |
|---|---|---|---|
| 4,633,289 A | 12/1986 | Chen | 257/375 |
| 4,710,477 A | 12/1987 | Chen | 438/220 |
| 4,764,482 A * | 8/1988 | Hsu | 257/371 |
| 4,907,058 A * | 3/1990 | Sakai | 257/370 |
| 5,281,842 A | 1/1994 | Yasuda et al. | 257/371 |
| 5,304,833 A | 4/1994 | Shigeki et al. | 257/371 |
| 5,393,679 A | 2/1995 | Yang | 438/217 |
| 5,404,042 A | 4/1995 | Okumura et al. | 257/571 |
| 5,478,759 A | 12/1995 | Mametani et al. | 438/228 |
| 5,654,213 A * | 8/1997 | Choi et al. | 257/369 |
| 5,675,172 A * | 10/1997 | Miyamoto et al. | 257/402 |
| 5,767,556 A * | 6/1998 | Yanagigawa | 257/404 |

\* cited by examiner

PHOSPHORUS IMPLANTATION

BORON IMPLANTATION

SEMICONDUCTOR DEVICE HAVING A RETROGRADE WELL STRUCTURE AND METHOD OF MANUFACTURING THEREOF

TECHNICAL FIELD

This invention relates to a semiconductor device having a retrograde well structure and a method of manufacturing thereof.

BACKGROUND ART

In an integrated circuit for memory retention such as a DRAM, and so forth, a so-called soft error may arise wherein information stored in the integrated circuit is accidentally lost. A typical cause of soft error is an α-ray.

For example, when a memory element comprising a NMOSFET is formed on a p type semiconductor substrate, if the α-ray enters the p type semiconductor substrate, the α-ray interacts with an atom in the p type semiconductor substrate, energy in the α-ray is lost, and the α-ray slows down. Many electron-hole pairs are produced in the above process. An electron as a minority carrier in the produced electron-hole pairs reaches an n type diffusion layer, and stored information (potential) in the memory element is reversed.

Further, in a CMOS structure, a parasitic PNP bipolar transistor, which comprises a source/drain of a PMOS, a N-well, and a p-well and a parasitic NPN bipolar transistor which comprises a source/drain of a NMOS, a p-well, and a n-well continuously arranged, establishes a thyristor. As a result, current flows between power supply terminals or the like in the CMOS circuit, and a so-called latch up phenomenon is easily caused. When the impurity concentration of the well is low, latch-up easily occurs, because resistance at the time current flows into the well becomes high, and voltage drop becomes large. If latch up occurs, circuit performance is checked, according to circumstance, and an integrated circuit containing the latch up will be destroyed.

As a means for solving the above problem, an impurity concentration of the bottom of a well is increased, such that a so-called retrograde well structure is adopted. In this manner, the impurity is implanted in a semiconductor substrate with high energy by ion implantation. Almost all retrograde well structures are formed by the means.

The retrograde well structure and a method of manufacturing it based on the above means are disclosed in K. Tsukamoto et al., "High energy iron Implantation for ULSI" Nucl. Instr. and Meth., pp. 584–591, 1991, for example.

FIG. 77 shows a sectional view of a semiconductor device of a CMOS structure forming a retrograde well. The semiconductor device includes a p type semiconductor substrate 101; a retrograde p well 103; a retrograde n well 104; an field oxide film 124; a source/drain 125; a gate oxide film 126; and a gate electrode 127. FIG. 78 shows an impurity density distribution of the depth direction in a substrate section of a X–X' cross-section of the semiconductor device in FIG. 77. FIG. 79 shows an internal potential in the X–X' cross-section.

As shown in FIGS. 77–79, in the retrograde p well 103, an impurity is implanted by high energy ion implantation, and a peak of the impurity concentration can be formed at the depth desired in the substrate. Consequently when a transistor of a CMOS structure on the retrograde p well 103 is formed, resistance is controlled and voltage drop becomes small in a high concentration part of the bottom of the retrograde p well 103. Therefore common emitter current gain of a parasitic bipolar transistor is minimized, and latch up does not easily occur.

Further, when a memory cell is formed on the retrograde p well 103 instead of the CMOS structure, electrons, which are minority carriers, are interrupted before reaching the source/drain 125 by a potential barrier generated from a difference in Fermi level between the peak of the impurity concentration of the bottom of the retrograde p well 103 and a substrate impurity region, whereby soft error resistance is improved.

Furthermore, improvement of soft error resistance is disclosed in Japanese Patent Application Laid-Open No. 212453/1992. In the Japanese Patent Application Laid-Open, describing an impurity structure of a semiconductor substrate and a method of manufacturing, it is stated that an n type impurity layer surrounds a retrograde p well.

FIG. 80 shows a sectional view of a part of a substrate of a semiconductor device. The semiconductor device includes an n type impurity layer 105 surrounding the retrograde p well 103. A NMOS is formed on the retrograde p well 103, and a memory region is formed. FIG. 81 shows an impurity density distribution of the depth direction in a Y–Y' cross-section of the semiconductor device in FIG. 80.

According to this structure, minority carriers are generated by an α-ray or the like, that is, electrons are absorbed by the n type impurity layer 105. Therefore, electron flow is interrupted before reaching a source/drain layer (not shown) formed on a surface of the retrograde p well 103, and soft error resistance is improved.

To improve latch up resistance, there is a structure forming a low concentration well on a surface of a semiconductor substrate having a very high impurity concentration. The structure is disclosed in F. S. Lai et al., "A Highly latch up-immune 1 μm CMOS technology fabricated with 1 Mev ion implantation and self-aligned $TiSi_2$," IEDM Tech. Dig., pp. 513–516, 1985, for example.

FIG. 82 shows a sectional view of a part of a substrate of a semiconductor device. The semiconductor device includes an impurity layer which is formed on a surface of the substrate having a very high p type impurity concentration. The semiconductor device includes a retrograde n well 104; a high concentration p type substrate 106; and a p well 113. A PMOS is formed on the retrograde n well 104. A NMOS formed on the p well 113. The CMOS is formed by the PMOS and the NMOS. FIG. 83 shows an impurity density distribution of the depth direction in a Z–Z' cross-section of the semiconductor device in FIG. 82.

In the semiconductor device, according to using the high concentration p type substrate 106, substrate resistance is reduced, voltage drop produced by current in the substrate becomes small, and a latch up phenomenon of the CMOS circuit can be controlled.

However, as integrated circuits are reduced in size, soft error resistance and latch up resistance both fall in the conventional retrograde well structure. Further, when an impurity structure is produced by an n type impurity layer surrounding a retrograde p well, a semiconductor device needs a terminal for potential of the N type impurity layer as a middle layer. Therefore, complexity of a structure increases.

Furthermore, it is possible to manufacture of an integrated circuit having a memory element and a calculation circuit of a high density being formed on the same chip by advanced circuit design and processing. However, in the integrated circuit, high soft error resistance and high latch up resistance are required at the same time.

Therefore, when a structure having a low impurity concentration surface layer formed on a high impurity concentration substrate is used, the structure is effective in a CMOS structure, because high latch up resistance can be obtained. However, the structure is not effective for improvement of soft error resistance. Conversely, a potential barrier is formed by a difference in Fermi level between the two layers, diffusion of minority carriers into the substrate is interrupted by the potential barrier, and the minority carrier is diffused into an element formation region. As a result, soft error resistance is degraded.

DISCLOSURE OF THE INVENTION

Accordingly, one object of the present invention is to provide a semiconductor device having a substrate impurity structure that has both soft error resistance and latch up resistance and that prevents faulty circuit operation when the semiconductor device is formed with a fine structure.

Another object of this invention is to provide a method of manufacturing the semiconductor device.

These and other objects and advantages are achieved by providing a new and improved semiconductor device including a semiconductor substrate of a first conductivity type and having a first impurity concentration. A retrograde well of the first conductivity type and having a second impurity concentration with an impurity concentration peak is formed in a main surface of the semiconductor substrate. A first impurity layer of a third impurity concentration comes into contact with the underside of the retrograde well. The third impurity concentration is smaller than the impurity concentration peak of the first impurity concentration and a concentration peak of the second impurity concentration. Finally, an element is formed on the first impurity layer.

The present invention also provides a semiconductor device including a semiconductor substrate of a first conductivity type and having a first impurity concentration. A first impurity layer of the first conductivity type and having a second impurity concentration with an impurity concentration peak smaller than the first impurity concentration is formed in a main surface of the semiconductor substrate. A second impurity layer of a second conductivity type and having a third impurity concentration with an impurity concentration peak smaller than the first impurity concentration comes into contact with the underside of the first impurity layer. Finally, a MOS transistor is formed on the first impurity layer.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BEST MODE FOR CARRYING OUT THE INVENTION

First Embodiment

A first embodiment of the present invention is first described with reference to FIGS. 1–8.

Figure 1:
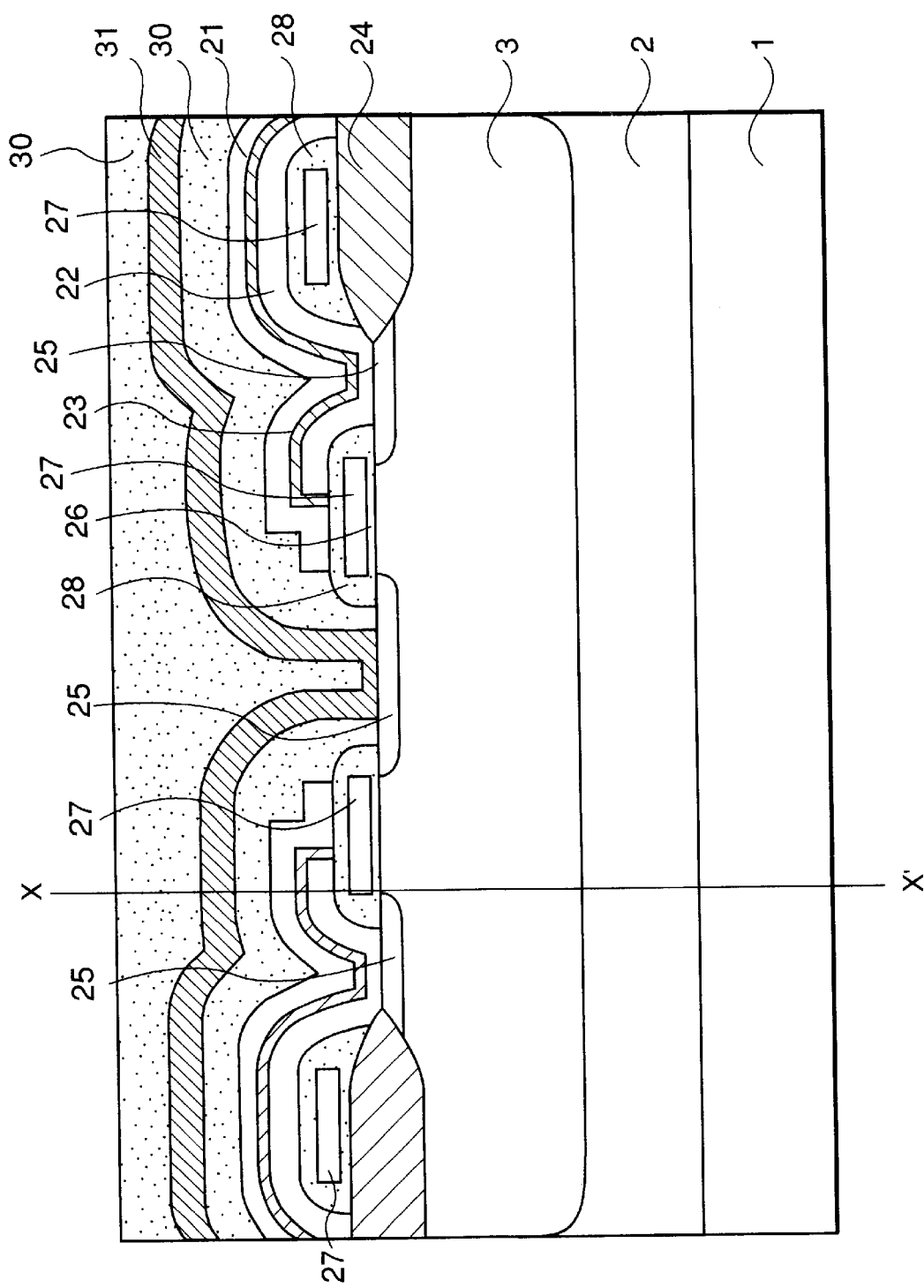
FIG. 1 is a sectional view of a semiconductor device of a first embodiment of the present invention.

FIG. 1 shows a sectional view of a semiconductor device of the first embodiment of the present invention, including a p type semiconductor substrate 1; a p type impurity layer 2; a retrograde p well 3; a cell plate 21; a storage node 22; a capacitor insulating film 23; an field oxide film 24; a source/drain 25; a gate oxide film 26; a gate electrode 27; a silicon oxide film 28; an interlayer dielectric film 30; and a bit line 31. The p type impurity layer 2 is formed in the p type semiconductor substrate 1. The retrograde p well 3 is formed in the p type semiconductor substrate 1. The storage node 22, the capacitor insulating film 23 and the plate cell 21 constitute a capacitor.

Figure 2:
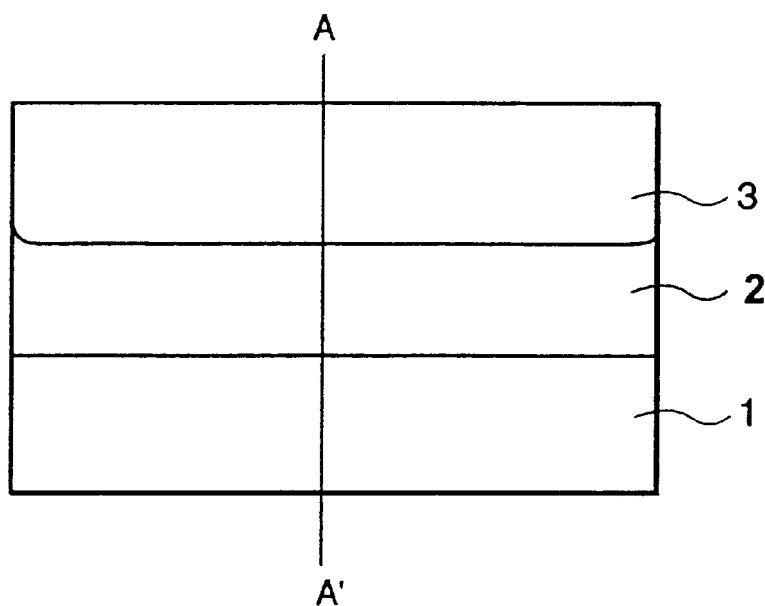
FIG. 2 is a sectional view of a semiconductor substrate of the semiconductor device in FIG. 1.
Figure 3:
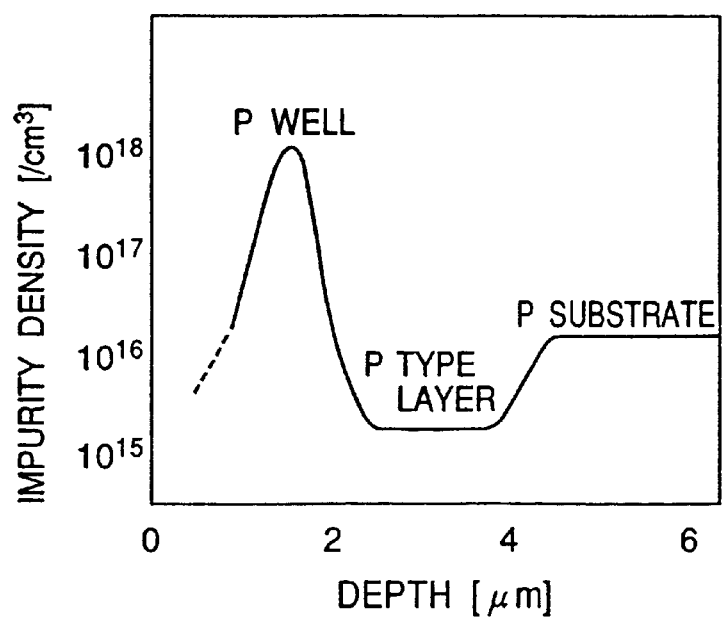
FIG. 3 is an impurity density distribution of an A–A' cross-section of the semiconductor device in FIG. 2.
Figure 4:
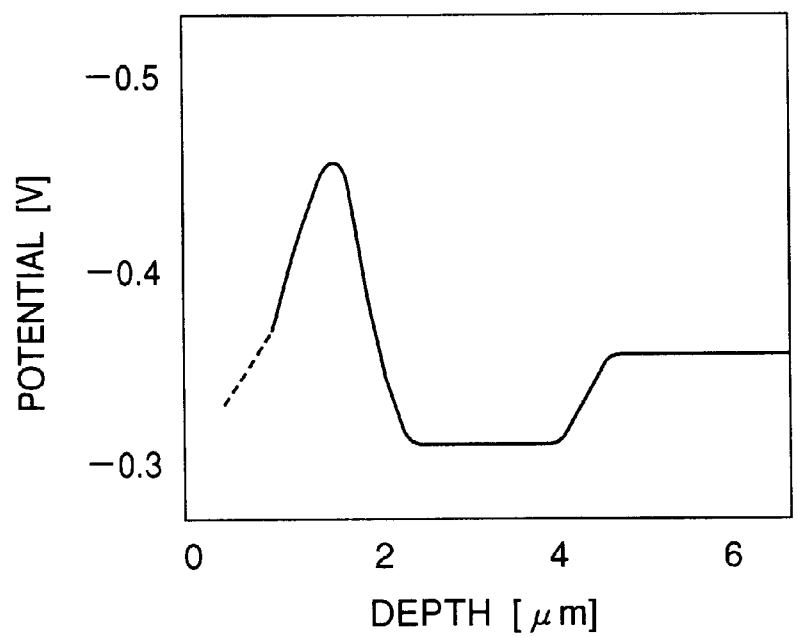
FIG. 4 is an internal potential in the A–A' cross-section.

FIG. 2 shows a sectional view of a semiconductor substrate of the semiconductor device in FIG. 1. FIG. 3 shows an impurity density distribution of an A–A' cross-section of the semiconductor device in FIG. 2. FIG. 4 shows an internal potential in the A–A' cross-section.

A substrate of the semiconductor device comprises the p type semiconductor substrate 1 containing boron of a concentration on the order of $1 \times 10^{16}/cm^3$, the p type impurity layer 2 containing boron of a concentration on the order of $1 \times 10^{15}/cm^3$ and the retrograde p well 3 containing boron of a concentration on the order of $1 \times 10^{18}/cm^3$.

In FIG. 1, two transistors are shown on the retrograde p well 3. As an actual structure, many transistors are formed on the retrograde p well 3. In the retrograde p well 3, a channel implantation layer for punch-through prevention and threshold control is formed at the depth of 0~0.2 μm from the substrate as needed. In addition, an impurity layer of a channel cut implantation or the like for control of formation of a channel is formed under the field oxide film 24. This impurity layer may or may not be combined with the retrograde p well 3. The p type impurity layer 2 comes into contact with the bottom of the retrograde p well 3, but the p type impurity layer 2 may or not come into contact with the side of the retrograde p well 3.

According to the substrate structure of the semiconductor device, as shown in FIG. 4, soft errors based on electrons can be controlled, because a potential barrier of electrons, generated by α-rays or the like in the p type semiconductor substrate 1, with respect to the upper side of the retrograde p well 3 becomes large by the existence of the p type impurity layer 2. Further, electron flow to the source/drain 25 on the retrograde p well 3 is interrupted.

Further, the p type semiconductor substrate 1, the p type impurity layer 2 and the retrograde p well 3 are in electrical continuity, because the p type semiconductor substrate 1, the p type impurity layer 2 and the retrograde p well 3 are of the same type conductivity. Therefore, no setting of potentials independently of each other is required. Accordingly, restriction of element layout under the conditions of increased number of terminals disappears, and the above is effective in a fine semiconductor device.

Figure 5:
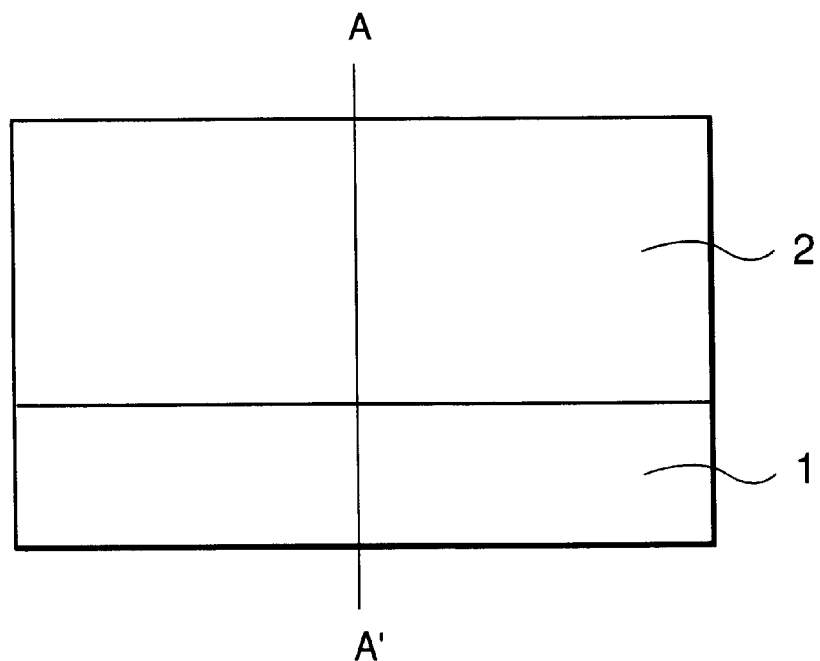
FIG. 5 is a sectional view of a first process step of manufacturing the substrate of the semiconductor device in the first embodiment.
Figure 6:
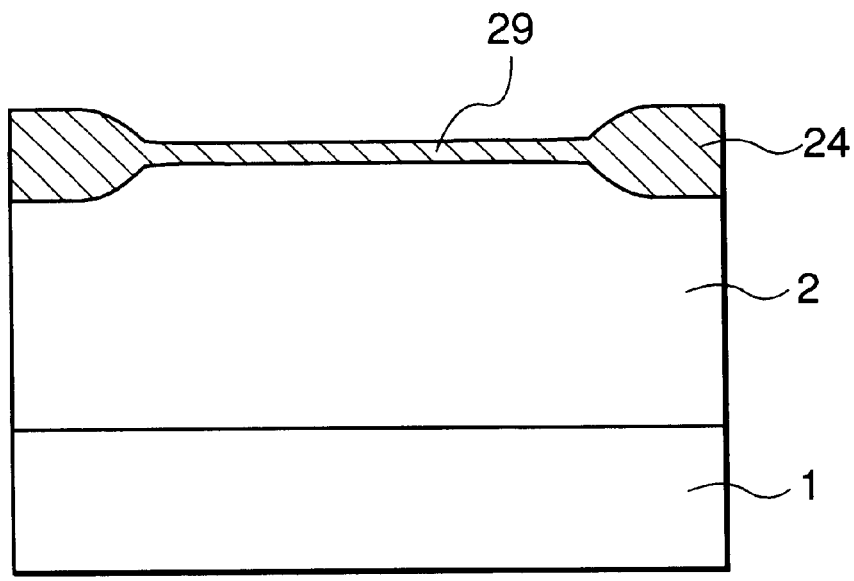
FIG. 6 is a sectional view of a second process step of manufacturing the substrate of the semiconductor device in the first embodiment.
Figure 7:
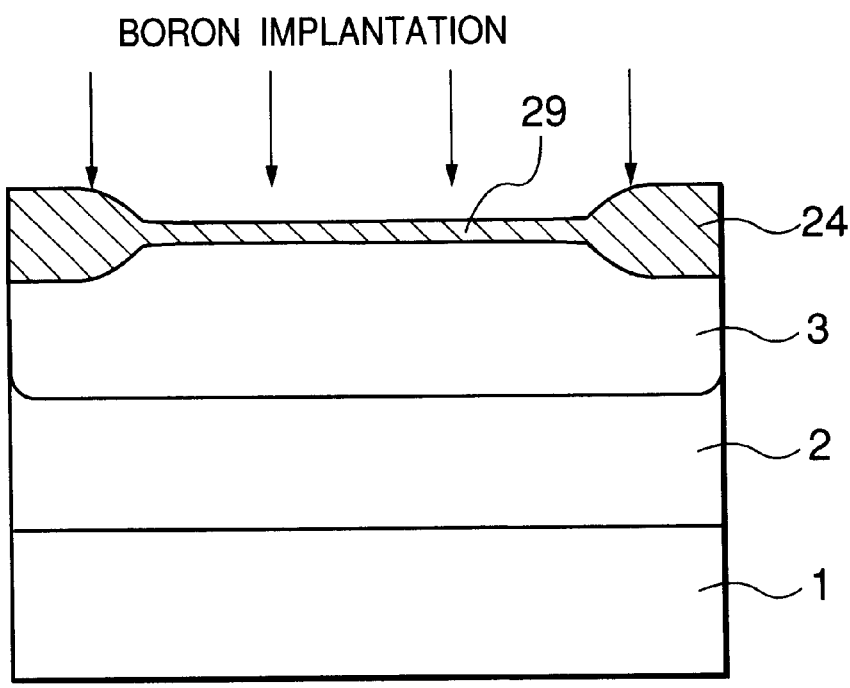
FIG. 7 is a sectional view of a third process step of manufacturing the substrate of the semiconductor device in the first embodiment.

FIGS. 5–7 show sectional views of steps of manufacturing the substrate of the semiconductor device of the first embodiment.

Figure 8:
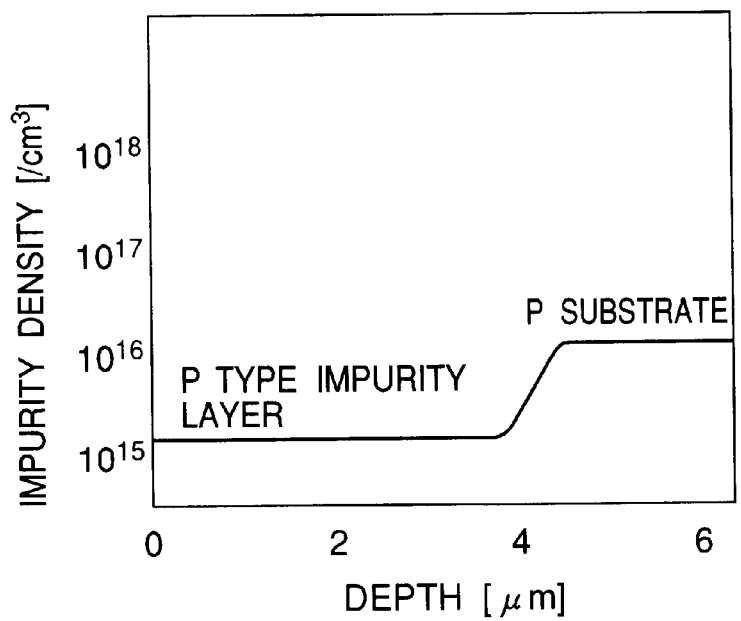
FIG. 8 is an impurity density distribution of an A–A' cross-section of the semiconductor substrate in FIG. 5.

FIG. 8 shows an impurity density distribution of an A–A' cross-section of the semiconductor substrate in FIG. 5.

As shown in FIG. 5, the p type impurity layer 2 containing boron of a concentration on the order of $1 \times 10^{15}/cm^3$ is formed on the p type semiconductor substrate 1 containing boron of a concentration on the order of $1 \times 10^{16}/cm^3$ by epitaxial growth. The thickness of the p type impurity layer 2 is 2~10 μm. As shown in FIG. 6, the field oxide film 24 is formed on a separation region of a surface of the p type impurity layer 2, and an oxide film 29 for the gate oxide film 26 is formed on an active region. The field oxide film 24 may be formed first; conversely, the oxide film 29 may be formed first.

As shown in FIG. 7, a mask is formed by a patterning of a resist. The mask has an opening portion on the upper side of a formation region of the retrograde p well 3. Boron, which is a p type impurity ion, is implanted with high energy through the opening portion in the formation region by conditions of 200 keV~1.5 MeV, $1 \times 10^{12}$~$1 \times 10^{14}/cm^2$, and the retrograde p well 3 is formed. After that, the transistor, the interlayer dielectric film 30, a contact hole and the capacitor or the like are formed, and a wiring is formed (not shown).

According to the method of manufacturing of the semiconductor device in this embodiment, the semiconductor device which controls soft errors based on electrons can be obtained, because the potential barrier of electrons, which is generated by the α-rays or the like in the p type semiconductor substrate 1, with respect to the upper side of the retrograde p well 3 becomes large, and electron flow to the source/drain 25 on the retrograde p well 3 is interrupted.

Further, the p type semiconductor substrate 1, the p type impurity layer 2 and the retrograde p well 3 are in continuity electrically, because the p type semiconductor substrate 1, the p type impurity layer 2 and the retrograde p well 3 are of the same type conductivity. Therefore, no setting of each potential independently is required. Accordingly, restriction of element layout under increasing number of terminals disappears, and it is also possible to manufacture a fine semiconductor device.

Furthermore, the semiconductor device can obtain the p type semiconductor substrate 1 having a high concentration and the retrograde p well 3 having the low impurity concentration surface for forming the transistor, because the p type impurity layer 2 is formed by epitaxial growth. Therefore, the p type semiconductor substrate 1 and the retrograde p well 3 are easy to make in electrical continuity, degradation of transistor threshold voltage or the like can be protected and range of process conditions, for example control of impurity concentration, can be set broadly in a manufacturing process.

Second Embodiment

Figure 9:
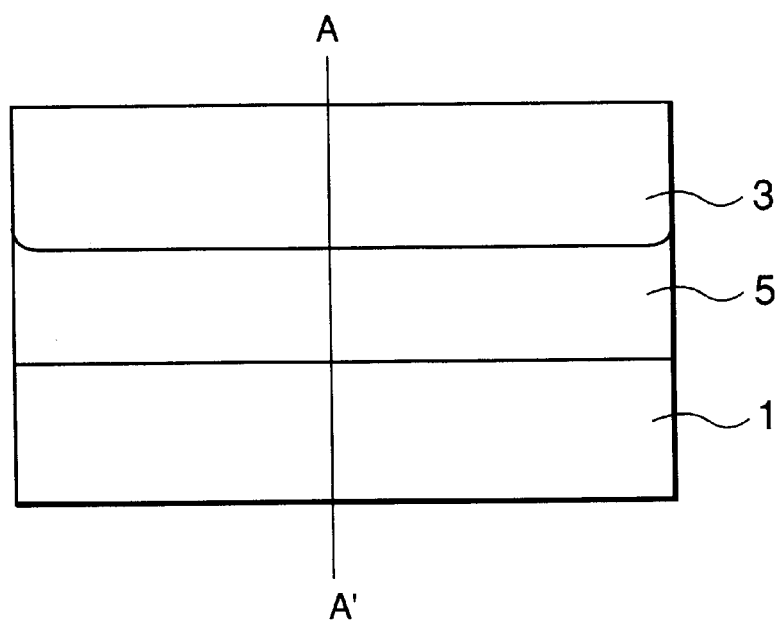
FIG. 9 is a sectional view of a first semiconductor device of a second embodiment of the present invention.

FIG. 9 shows a sectional view of a process step of manufacturing a substrate of a semiconductor device of the second embodiment of the present invention, including an n type impurity layer 5. The remaining structure is the same structure shown in the first embodiment. An n type impurity density in the n type impurity layer 5 is of low density enough. The p type semiconductor substrate 1 is not isolated electrically from the retrograde p well 3. The same elements in the first embodiment are formed on the retrograde p well 3 (not shown).

Figure 10:
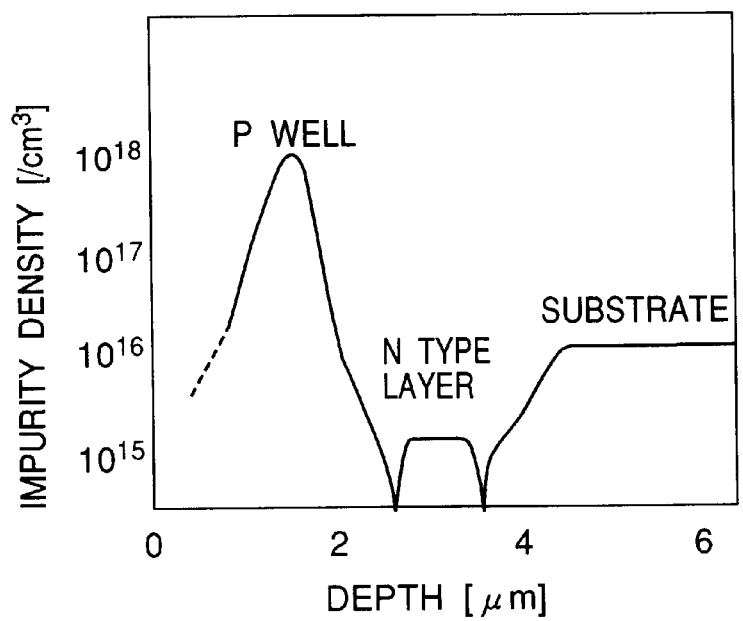
FIG. 10 is an impurity density distribution of an A–A' cross-section of the first semiconductor device in FIG. 9.
Figure 11:
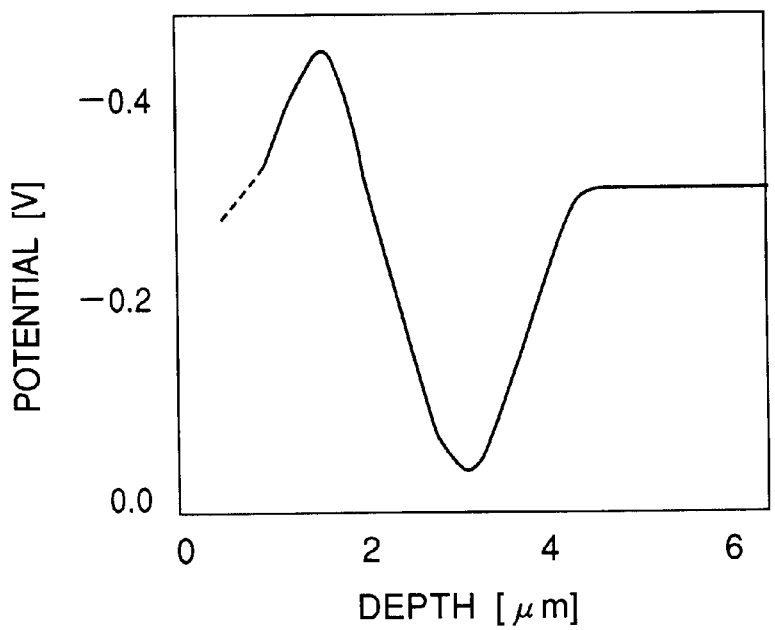
FIG. 11 is an internal potential of the substrate in the A–A' cross-section in FIG. 9.

FIG. 10 shows an impurity density distribution of an A–A' cross-section of the semiconductor device in FIG. 9. FIG. 11 shows an internal potential of the substrate in the A–A' cross-section.

A substrate of the semiconductor device comprises the p type semiconductor substrate 1 containing boron of a concentration on the order of $1 \times 10^{16}/cm^3$, the n type impurity layer 5 containing phosphorus of a concentration on the order of $1 \times 10^{15}/cm^3$ and the retrograde p well 3 containing boron of the concentration on the order of $1 \times 10^{18}/cm^3$.

In the retrograde p well 3, as in the first embodiment, the channel implantation layer for the punch-through prevention and threshold control is formed at a depth of 0~0.2 $\mu$m from the substrate as needed. In addition, the impurity layer of the channel cut implantation or the like for control of formation of the channel is formed under the field oxide film 24. This impurity layer may or may not be combined with the retrograde p well 3.

The n type impurity layer 5 comes into contact with the bottom of the retrograde p well 3, but the n type impurity layer 5 may or not come into contact with the side of the retrograde p well 3.

According to the substrate structure of the semiconductor device, as shown in FIG. 11, soft error based on electrons can be controlled, because a potential barrier of the electrons, generated by α-rays or the like in the p type semiconductor substrate 1, with respect to the upper side of the retrograde p well 3 becomes greater by the existence of the n type impurity layer 5, and electron flow to the source/drain 25 on the retrograde p well 3 is interrupted.

Further, the n type impurity layer 5 is different from the semiconductor substrate 1 and the retrograde p well 3 in a conductivity type. However, the concentration of the n type impurity layer 5 is low enough for electrical continuity with respect to the semiconductor substrate 1 and the retrograde p well 3. Therefore, no setting of each potential independently is required. Accordingly, restriction of element layout under increasing number of terminals disappears, and it is also possible to manufacture a fine semiconductor device.

Figure 16:
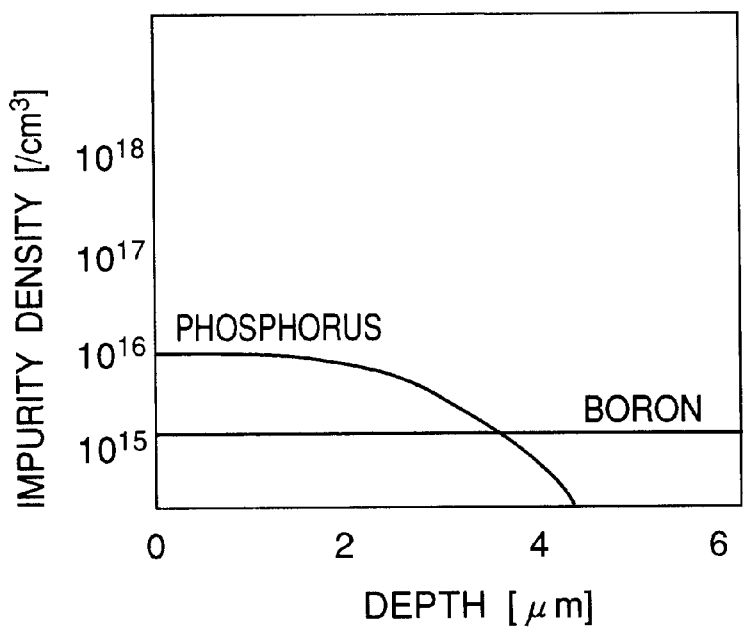
FIG. 16 is an impurity density distribution of boron and phosphorus in an A–A' cross-section of the first semiconductor substrate in FIG. 14.
Figure 17:
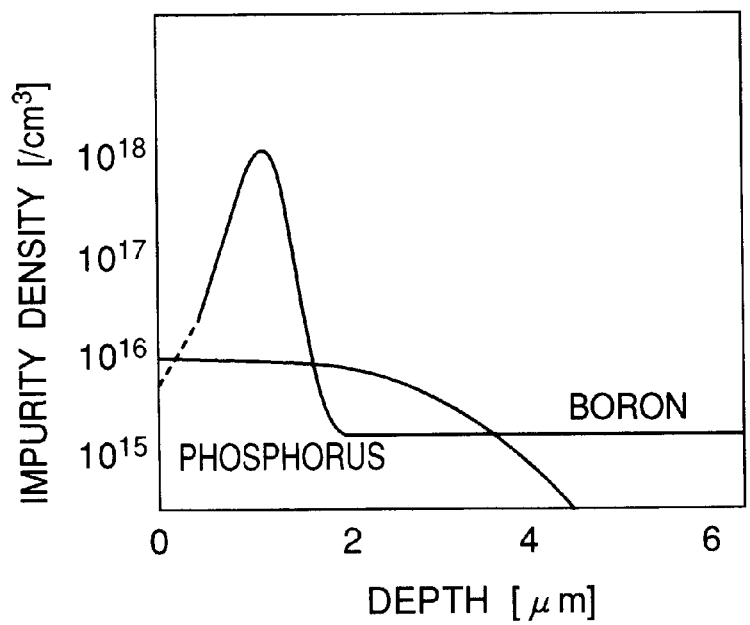
FIG. 17 is an impurity density distribution of boron and phosphorus with respect to the depth direction of semiconductor substrate in FIG. 15.

FIGS. 12–15 show sectional views of process steps of manufacturing the substrate of the semiconductor device of the second embodiment. FIG. 16 shows an impurity density distribution of boron and phosphorus in an A–A' cross-section of the semiconductor substrate in FIG. 14. FIG. 17 shows an impurity density distribution of boron and phosphorus with respect to the depth direction of semiconductor substrate in FIG. 15.

Figure 12:
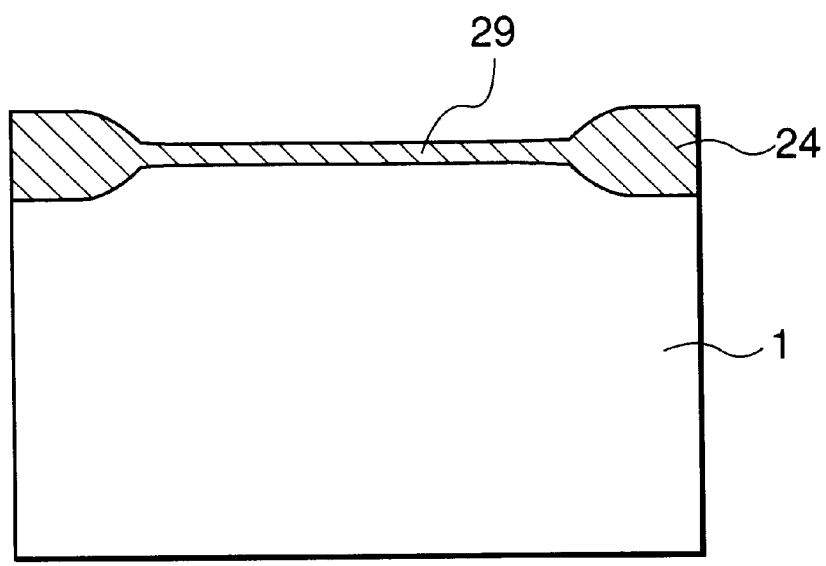
FIG. 12 is a sectional view of a first process step of manufacturing the substrate of the first semiconductor device of the second embodiment.

As shown in FIG. 12, as in the first embodiment, the field oxide film 24 is formed on the separation region on the main surface of the p type semiconductor substrate 1, and the oxide film 29 for the gate oxide film 26 is formed on the active region. The field oxide film 24 may be formed first, conversely, the oxide film 29 may be formed first.

Figure 13:
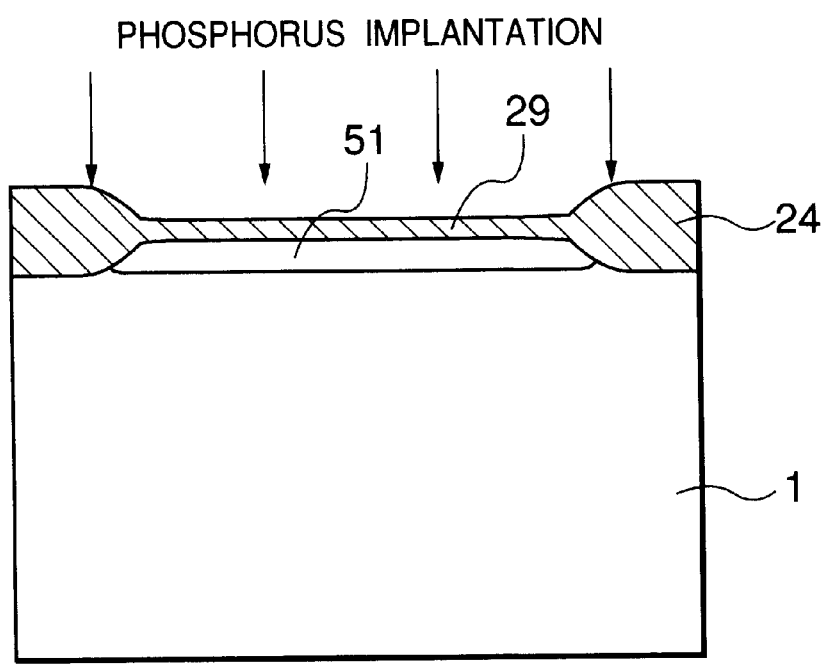
FIG. 13 is a sectional view of a second process step of manufacturing the substrate of the first semiconductor device of the second embodiment.
Figure 14:
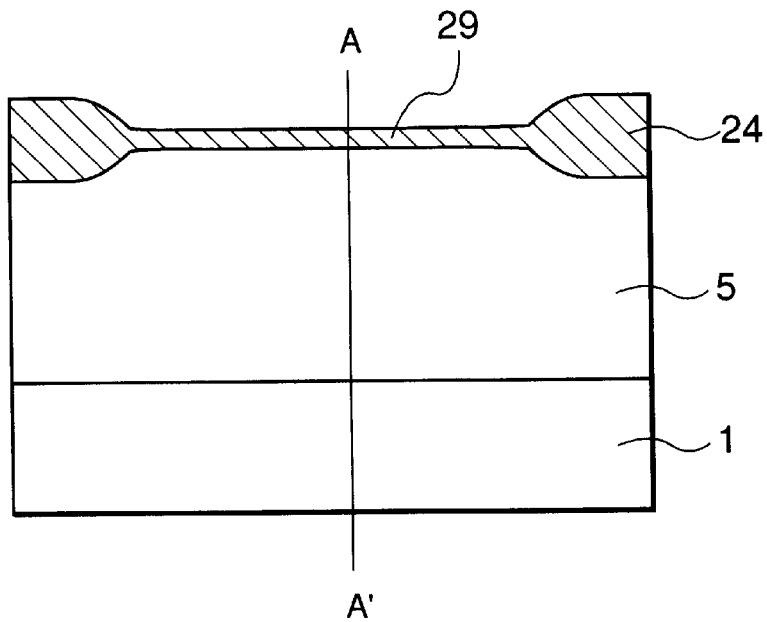
FIG. 14 is a sectional view of a third process step of manufacturing the substrate of the first semiconductor device of the second embodiment.

As shown in FIG. 13, a mask is formed by a patterning of the resist. The mask has an opening portion on the upper side of a formation region of the n type impurity layer 5. Phosphorus, which is an n type impurity ion, is implanted through the opening portion in the formation region by conditions of 50 keV~200 keV, $1 \times 10^{11}$~$5 \times 10^{12}/cm^2$, and an n type impurity layer 51 is formed. After that, as shown in FIG. 14, phosphorus is diffused by a thermal annealing on the order of 1100° C.~1200° C. and 0.5~3 hours, and the n type impurity layer 5 is formed.

When impurity concentration of implanted phosphorus is low and the thermal annealing temperature is high or the thermal annealing time is long, as shown in the first embodiment, there is a case that the p type impurity layer 2 is formed in the formation region for the n type impurity layer 5. However, there is no problem about the formed p type impurity layer 2.

Figure 15:
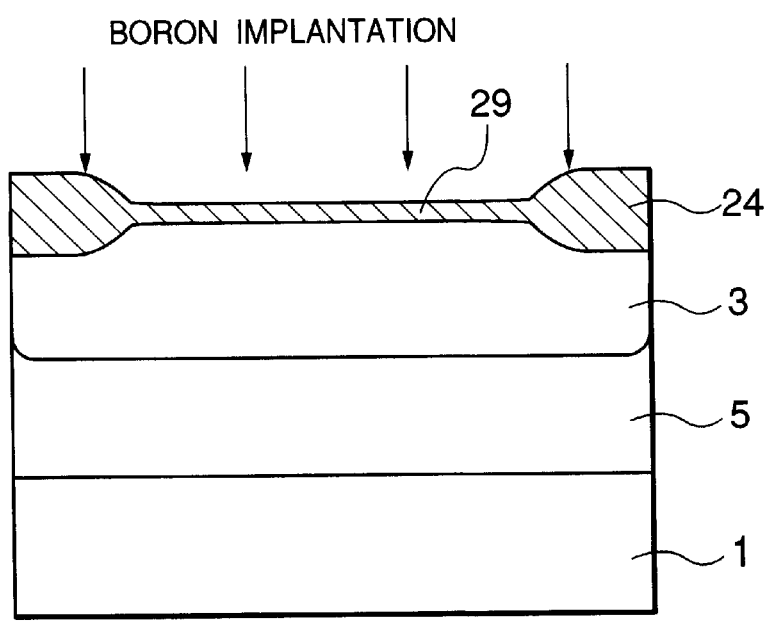
FIG. 15 is a sectional view of a fourth process step of manufacturing the substrate of the first semiconductor device of the second embodiment.

As shown in FIG. 15, as in the first embodiment, the mask is formed by patterning of the resist. The mask has the opening portion on the upper side of the formation region of the retrograde p well 3. Boron, which is of p type impurity ion, is implanted with high energy through the opening portion in the formation region by conditions of 200 keV~1.5 MeV, $1 \times 10^{12}$~$1 \times 10^{14}/cm^2$, and the retrograde p well 3 is formed. After that, the same elements as the first embodiment are formed (not shown).

According to the method of manufacturing of the semiconductor device in the second. embodiment, it is possible to manufacture a semiconductor device keeping the continuity of the semiconductor substrate 1 and the retrograde p well 3 and forming the n type impurity layer 5 between the semiconductor substrate 1 and the retrograde p well 3. Therefore, as mentioned above, the method of manufacturing the semiconductor device which controls soft error based on electrons also can be obtained, because the potential barrier of the electrons, generated by α-rays or the like in the p type semiconductor substrate 1, with respect to the upper side of the retrograde p well 3 becomes larger, and electron flow to the source/drain 25 on the retrograde p well 3 is interrupted.

Further, as mentioned above, the n type impurity layer 5 is different from the semiconductor substrate 1 and the retrograde p well 3 in the conductivity. However, the concentration of the n type impurity region 5 is low enough for electrical continuity with respect to the semiconductor substrate 1 and the retrograde p well 3. Therefore, independent setting of potential is not required. Accordingly, restriction of element layout under increasing number of terminals disappears, and it is also possible to manufacture a fine semiconductor device.

Figure 18:
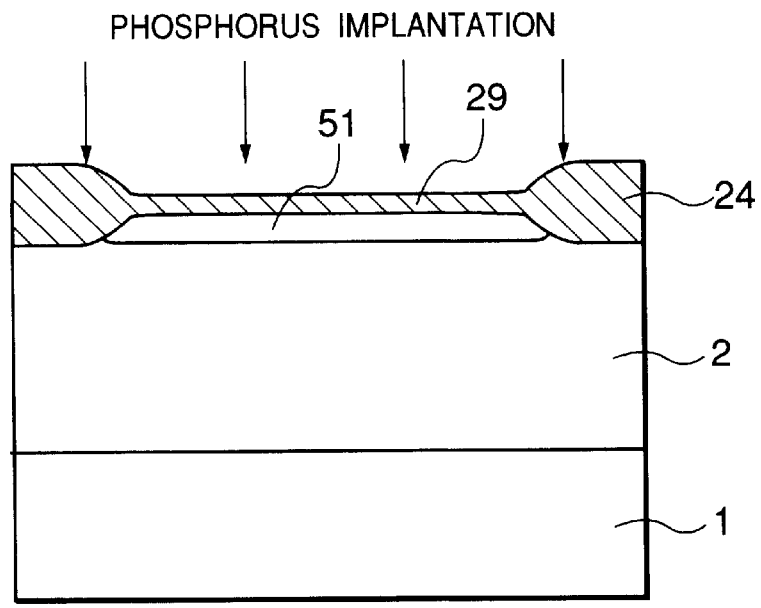
FIG. 18 is a sectional view of a first process step of manufacturing a substrate of a second semiconductor device of the second embodiment.
Figure 19:
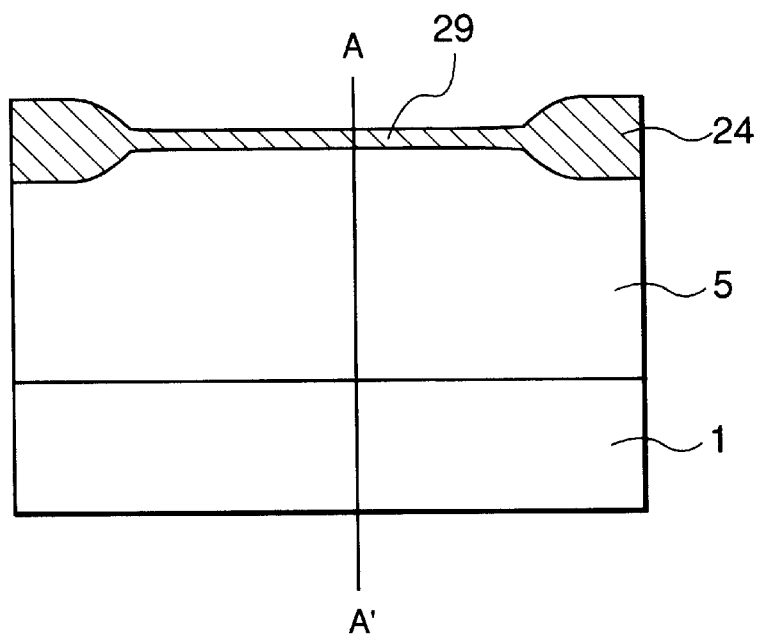
FIG. 19 is a sectional view of a second process step of manufacturing the substrate of the second semiconductor device of the second embodiment.
Figure 20:
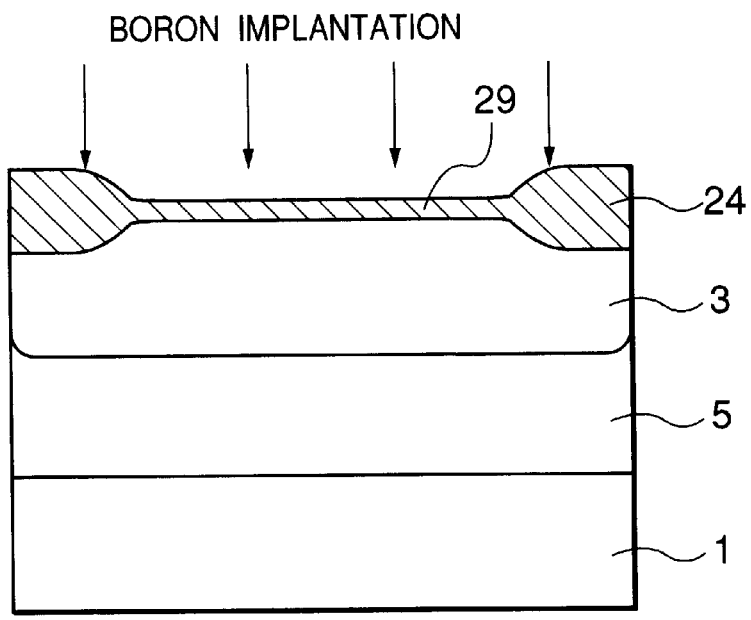
FIG. 20 is a sectional view of a third process step of manufacturing the substrate of the second semiconductor device of the second embodiment.
Figure 21:
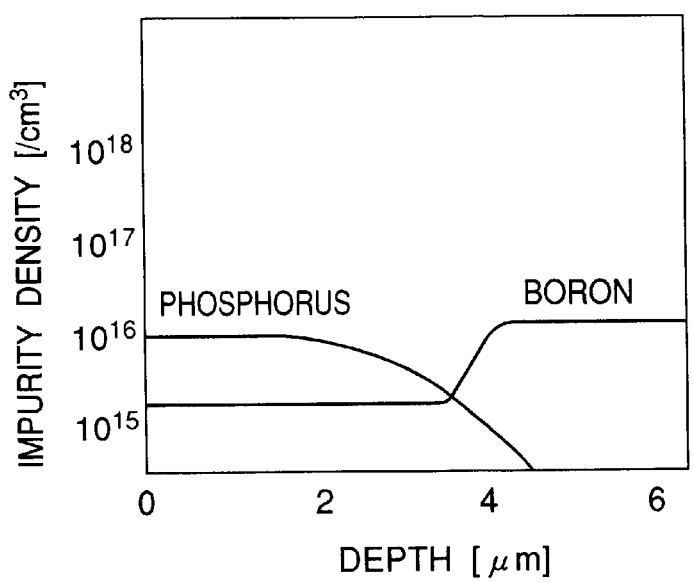
FIG. 21 is an impurity density distribution of boron and phosphorus in an A–A' cross-section of the second semiconductor substrate in FIG. 19.
Figure 22:
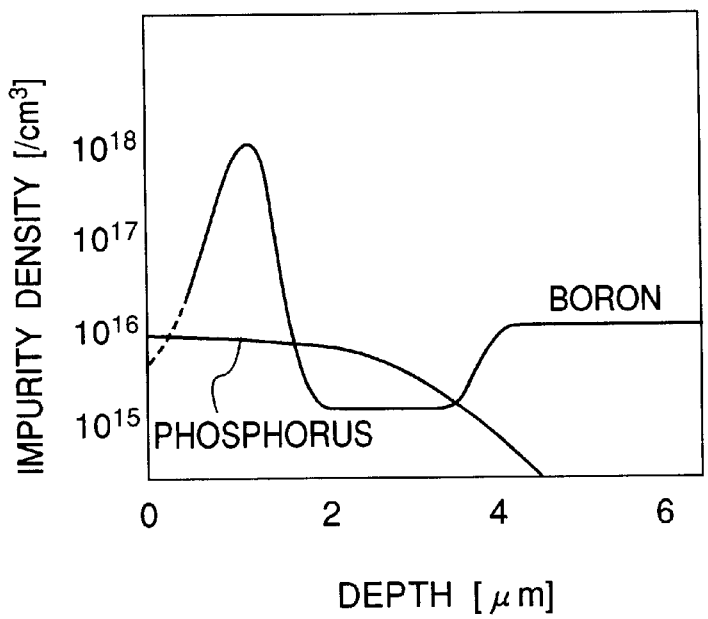
FIG. 22 is an impurity density distribution of boron and phosphorus with respect to the depth direction of the second semiconductor substrate in FIG. 20.

FIGS. 18–20 show sectional views of other process steps of manufacturing a substrate of a semiconductor device of the second embodiment. FIG. 21 shows an impurity density distribution of boron and phosphorus in an A–A' cross-section of the semiconductor substrate in FIG. 19. FIG. 22 shows an impurity density distribution of boron and phosphorus with respect to the depth direction of the semiconductor substrate in FIG. 20.

As in the first embodiment, the p type impurity layer 2 containing boron of a concentration of the order of $1 \times 10^{15}/cm^3$ is formed on the p type semiconductor substrate 1 containing boron of a concentration on the order of $1 \times 10^{15}/cm^3$ by epitaxial growth. The thickness of the p type impurity layer 2 is 2~10 $\mu$m. After that, the field oxide film 24 is formed on the separation region of the surface of the p type impurity layer 2, and the oxide film 29 for the gate oxide film 26 is formed on the active region. The field oxide film 24 may be formed first; conversely, the oxide film 29 may be formed first.

As shown in FIG. 18, a mask is formed by a patterning of the resist. The mask has an opening portion on the upper side of a formation region of the n type impurity layer 5. Phosphorus, which is an n type impurity ion, is implanted through the opening portion in the formation region by conditions of 50 keV~200 keV, $1 \times 10^{11}$~$1 \times 10^{13}/cm^2$, and the n type impurity layer 51 is formed.

After that, as mentioned above, and as shown in FIG. 19, phosphorus is diffused by thermal annealing on the order of 1100° C.~1200° C. and 0.5~3 hours, and the n type impurity layer 5 is formed.

When an impurity concentration of implanted phosphorus is of a low concentration and the thermal annealing temperature is of a high temperature or the thermal annealing time is long, as shown in the first embodiment, there is a case that the p type impurity layer 2 is formed in the formation region for the n type impurity layer 5. However, there is no problem about the formed p type impurity layer 2.

As shown in FIG. 20, as in the first embodiment, the mask is formed by patterning of the resist. The mask has the opening portion on the upper side of a formation region of the retrograde p well 3. Boron, which is a source of p type impurity ions, is implanted with high energy through the opening portion in the formation region by conditions of 200 keV~1.5 MeV, $1\times10^{12}$~$1\times10^{14}$/cm$^2$, and the retrograde p well 3 is formed. After that, the same elements as the first embodiment are formed (not shown).

According to the method of manufacturing of the semiconductor device in the second embodiment, as the above other method of the second embodiment, the method of manufacturing of the semiconductor device which controls soft error based on electrons can be obtained, because the potential barrier of the electrons, generated by α-rays or the like in the p type semiconductor substrate 1, with respect to the upper side of the retrograde p well 3 becomes large, and electron flow to the source/drain 25 on the retrograde p well 3 is interrupted.

Further, since the n type impurity layer 5 is formed after the epitaxial growth, the semiconductor device can obtain the p type semiconductor substrate 1 having a high concentration and the retrograde p well 3 having the low impurity concentration surface for forming the transistor. Therefore, the p type semiconductor substrate 1 and the retrograde p well 3 are easy to make in electrical continuity, degradation of transistor threshold voltage or the like can be protected and range of process conditions, for example control of impurity concentration, can be set broadly in a manufacturing process.

Furthermore, as in the above other method of the second embodiment, the n type impurity layer 5 is different from the semiconductor substrate 1 and the retrograde p well 3 in the conductivity type. However, since the concentration of the n type impurity layer 5 is low enough for electrical continuity with respect to the semiconductor substrate 1 and the retrograde p well 3. Therefore, setting of potential independently is not required. Accordingly, restriction of element layout under increasing number of terminals disappears, and it is also possible to manufacture a fine semiconductor device.

Figure 23:
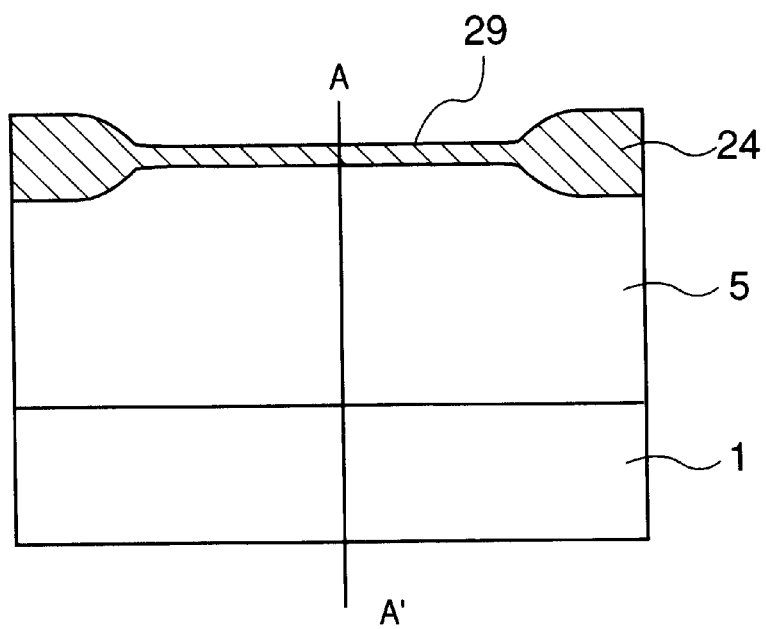
FIG. 23 is a sectional view of a first process step of manufacturing a substrate of a third semiconductor device of the second embodiment.
Figure 24:
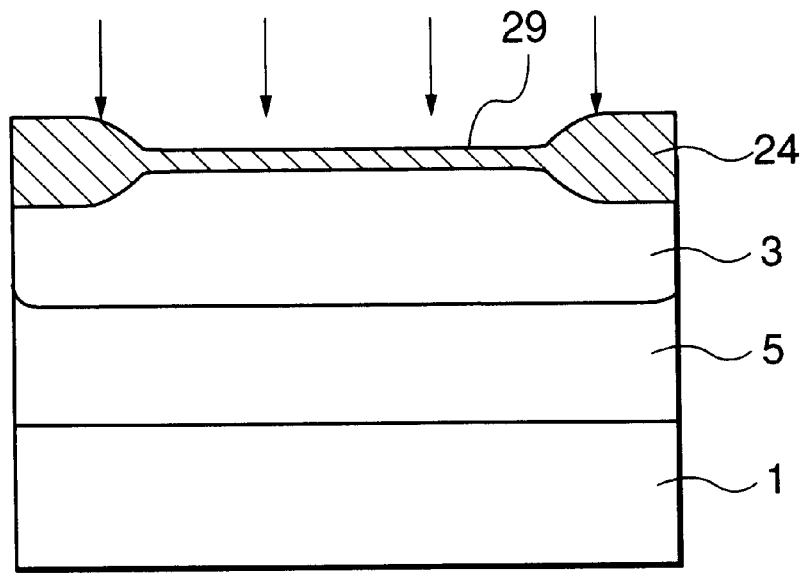
FIG. 24 is a sectional view of a second process step of manufacturing the substrate of the third semiconductor device of the second embodiment.
Figure 25:
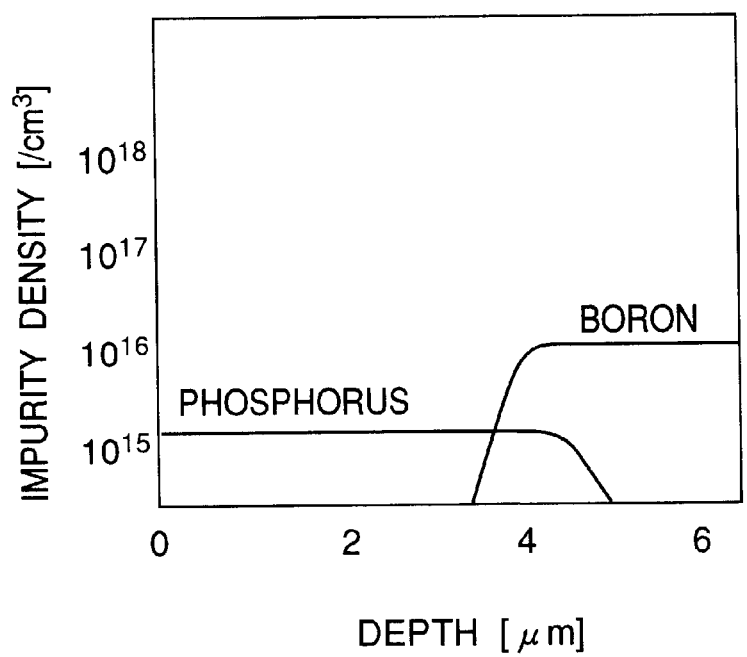
FIG. 25 is an impurity density distribution of boron and phosphorus in an A–A' cross-section of the third semiconductor substrate in FIG. 23.
Figure 26:
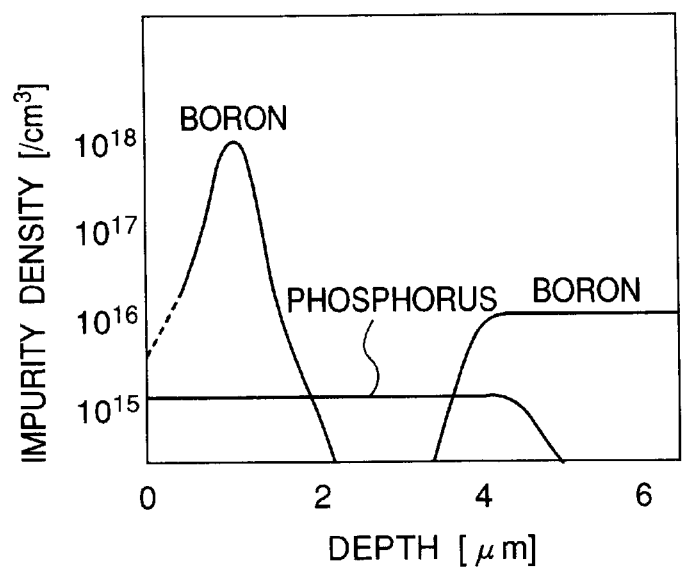
FIG. 26 is an impurity density distribution of boron and phosphorus with respect to the depth direction of the third semiconductor substrate in FIG. 24.

FIGS. 23–24 show sectional views of other process steps of manufacturing a substrate of a semiconductor device of the second embodiment. FIG. 25 shows an impurity density distribution of boron and phosphorus in an A–A' cross-section of the semiconductor substrate in FIG. 23. FIG. 26 shows an impurity density distribution of boron and phosphorus with respect to the depth direction of the semiconductor substrate in FIG. 24.

As shown in FIG. 23, the n type impurity layer 5 containing phosphorus of a concentration on the order of $1\times10^{15}$/cm$^3$ is formed on the p type semiconductor substrate 1 containing boron of a concentration on the order of $1\times10^{16}$/cm$^3$ by epitaxial growth. The thickness of the n type impurity layer 5 is 2~5 μm.

After that, as in the first embodiment, the field oxide film 24 is formed on a separation region of a surface of the n type impurity layer 5, and the oxide film 29 for the gate oxide film 26 is formed on an active region. The field oxide film 24 may be formed first; conversely, the oxide film 29 may be formed first.

As shown in FIG. 24, as in the first embodiment, the mask is formed by patterning of the resist. The mask has the opening portion on the upper side of the formation region of the retrograde p well 3. Boron, which is a source of p type impurity ions, is implanted with high energy through the opening portion in the formation region by conditions of 200 keV~1.5 MeV, $1\times10^{12}$~$1\times10^{14}$/cm$^2$, and the retrograde p well 3 is formed.

After that, the same elements as the first embodiment are formed (not shown).

According to the method of manufacturing of the semiconductor device in the second embodiment, as in the above other method of the second embodiment, the semiconductor device which controls soft error based on the electrons can be obtained, because the potential barrier of electrons, generated by α-rays or the like in the p type semiconductor substrate 1, with respect to the upper side of the retrograde p well 3 becomes large, and electron flow to the source/drain 25 on the retrograde p well 3 is interrupted.

Furthermore, since the n type impurity layer 5 is formed by epitaxial growth, the semiconductor device can obtain the p type semiconductor substrate 1 having the high concentration and the retrograde p well 3 having the low impurity concentration surface for forming a transistor. Therefore, the p type semiconductor substrate 1 and the retrograde p well 3 are easy to make in continuity, degradation of transistor threshold voltage or the like is protected, a short process is possible, and the range of process conditions, for example control of impurity concentration, can be set broadly in the manufacturing process.

Further, as in the above other method of the second embodiment, the n type impurity layer 5 is different from the semiconductor substrate 1 and the retrograde p well 3 in the conductivity type. However, the concentration of the n type impurity layer 5 is low enough for electrical continuity with respect to the semiconductor substrate 1 and the retrograde p well 3. Therefore, no setting of each potential independently is required. Accordingly, restriction of element layout under increasing number of terminals disappears, and it is also possible to manufacture a fine semiconductor device.

Third Embodiment

Figure 27:
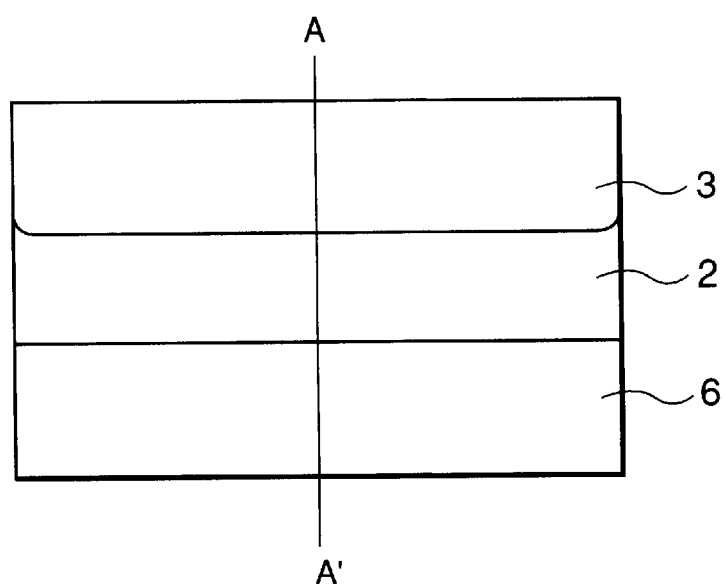
FIG. 27 is a sectional view of a substrate of a semiconductor device of a third embodiment of the present invention.

FIG. 27 shows a sectional view of a substrate of a semiconductor device of the third embodiment of the present invention, including a p type semiconductor substrate 6; the p type impurity layer 2 formed in the p type semiconductor substrate 6; and the retrograde p well 3 formed in the p type semiconductor substrate 6.

Figure 28:
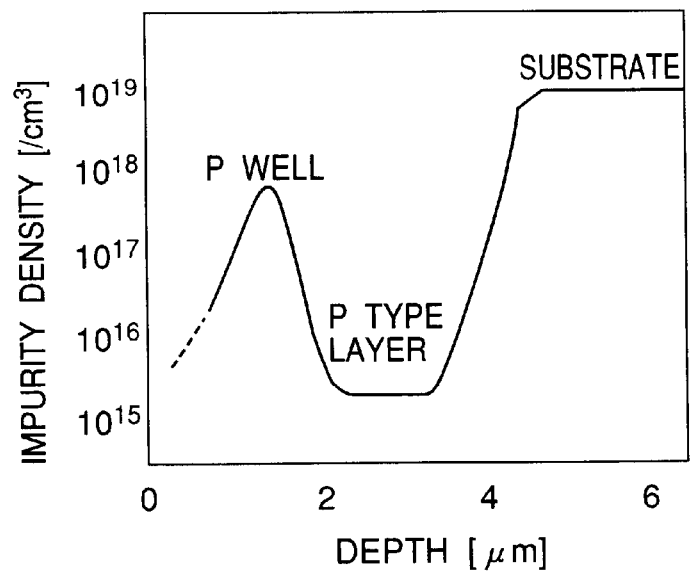
FIG. 28 is an impurity density distribution of an A–A' cross-section of the semiconductor device in FIG. 27.

FIG. 28 shows an impurity density distribution of an A–A' cross-section of the semiconductor device in FIG. 27.

A substrate of the semiconductor device, as shown in FIG. 28, comprises the p type semiconductor substrate 6 containing boron of a concentration of the degree $1\times10^{19}$/cm$^3$, the p type impurity layer 2 containing boron of concentration on the order of $1\times10^{15}$/cm$^3$ and the retrograde p well 3 containing boron of concentration on the order of $1\times10^{18}$/cm$^3$.

The plurality of transistors or a single transistor is formed on the retrograde p well 3 (not shown). As in the first embodiment, in the retrograde p well 3, the channel implantation layer for punch-through prevention and threshold control is formed at the depth of 0~0.2 μm from the substrate as needed. In addition, the impurity layer of the channel cut implantation or the like for control of formation of the channel is formed under the field oxide film 24. This impurity layer may or may not be combined with the retrograde p well 3. The p type impurity layer 2 comes into contact with the bottom of the retrograde p well 3, but the p type impurity layer 2 may or not come into contact with the side of the retrograde p well 3.

When a memory element is formed on the substrate structure (not shown), as shown in FIG. 28, the semiconductor device which controls soft error based on electrons can be obtained, because a potential barrier of electrons, generated by α-rays or the like in the p type semiconductor substrate 6, with respect to the upper side of the retrograde p well 3, becomes large by the p type impurity layer 2. In addition, the lifetime of electrons in the p type semiconductor substrate 6 is shortened, and electron flow to the source/drain 25 on the retrograde p well 3 is interrupted.

Further, when a CMOS transistor as a control circuit is formed on the substrate structure, the semiconductor device can obtain a low substrate resistance based on the p type semiconductor substrate 6, and in addition can obtain an improvement of latch up resistance based on the retrograde p well 3.

Furthermore, the p type semiconductor substrate 6, the p type impurity layer 2 and the retrograde p well 3 are in electrical continuity, because the p type semiconductor substrate 6, the p type impurity layer 2 and the retrograde p well 3 are of the same type conductivity. Therefore, no setting of each potential independently is required. Accordingly, when the memory element or the CMOS transistor is formed, restriction of element layout under increasing number of terminals disappears, and it is also possible to manufacture a fine semiconductor device.

In addition, the semiconductor device can obtain the p type semiconductor substrate 6 having a high concentration and the retrograde p well 3 having the low impurity concentration surface for forming a transistor. Therefore, the p type semiconductor substrate 6 and the retrograde p well 3 are easy to make in electrical continuity, and degradation of transistor threshold voltage or the like is reduced.

Figure 29:
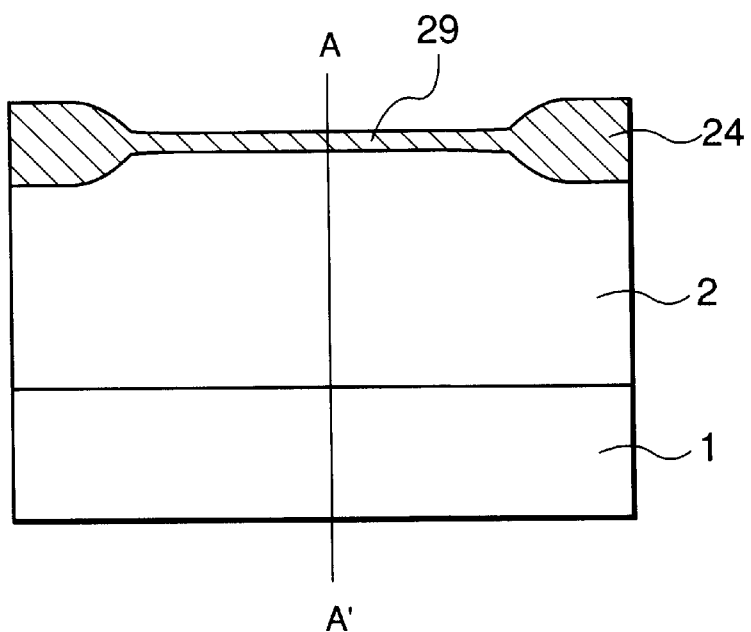
FIG. 29 is a sectional view of a first process step of manufacturing the substrate of the semiconductor device of the third embodiment.
Figure 30:
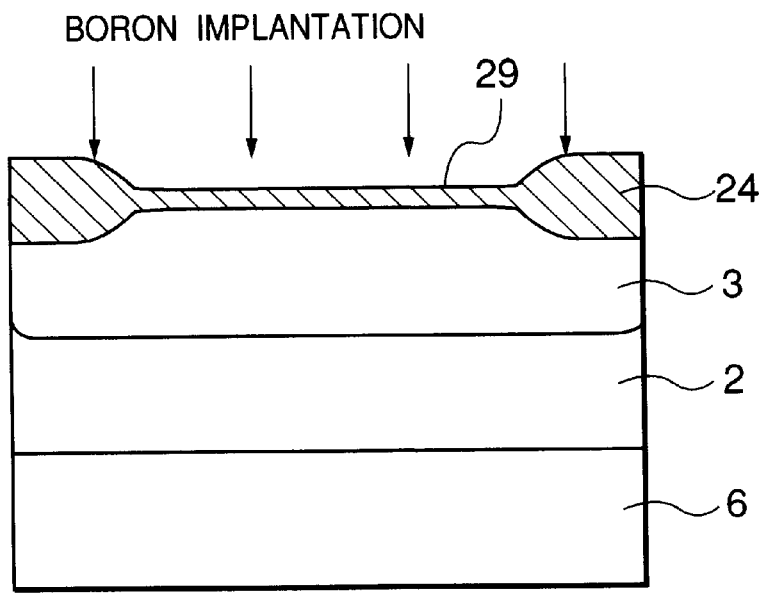
FIG. 30 is a sectional view of a second process step of manufacturing the substrate of the semiconductor device of the third embodiment.

FIGS. 29–30 show sectional views of process steps of manufacturing the substrate of the semiconductor device of the third embodiment.

Figure 31:
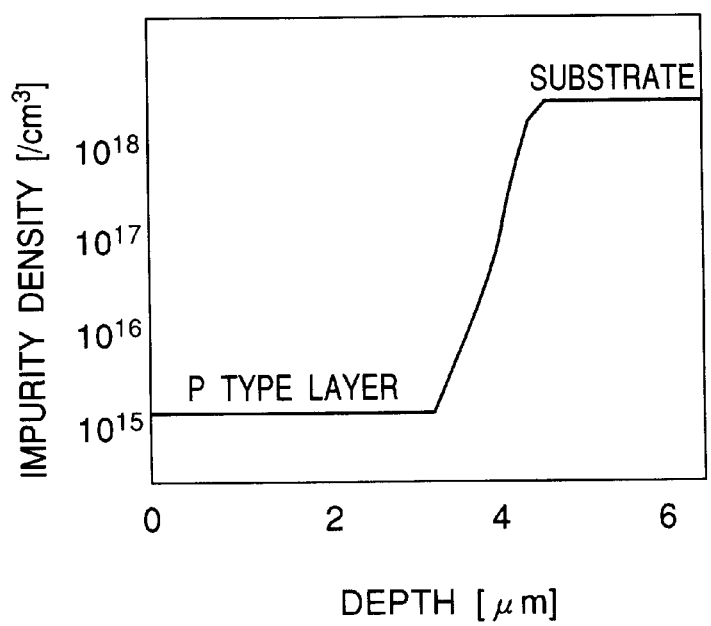
FIG. 31 is an impurity density distribution in an A–A' cross-section of the semiconductor substrate in FIG. 29.

FIG. 31 shows an impurity density distribution in an A–A' cross-section of the semiconductor substrate in FIG. 29.

As shown in FIG. 29, the p type impurity layer 2 containing boron of a concentration on the order of $1 \times 10^{15}/cm^3$ is formed on the high concentration p type semiconductor substrate 6 containing boron of a concentration on the order of $1 \times 10^{19}/cm^3$ by epitaxial growth. The thickness of the p type impurity layer 2 is 2~10 μm.

After that, as in the first embodiment, the field oxide film 24 is formed on the separation region of the surface of the p type impurity layer 2, and the oxide film 29 for the gate oxide film 26 is formed on the active region. The field oxide film 24 may be formed first; conversely, the oxide film 29 may be formed first.

As shown in FIG. 30, as in the first embodiment, the mask is formed by patterning of the resist. The mask has the opening portion on the upper side of the formation region of the retrograde p well 3. Boron, which is a source of p type impurity ions, is implanted with high energy through the opening portion in the formation region by conditions of 200 keV~1.5 MeV, $1 \times 10^{12}$~$1 \times 10^{14}/cm^2$, and the retrograde p well 3 containing boron of the concentration on the order of $1 \times 10^{18}/cm^3$ is formed. After that, a plurality of or single transistor, the interlayer dielectric film 30, the contact hole and the capacitor or the like are formed respectively, and the wiring is formed (not shown).

In the retrograde p well 3, as in the first embodiment, the channel implantation layer for punch-through prevention and threshold control is formed at a depth of 0~0.2 μm from the substrate as needed. In addition, the impurity layer of the channel cut implantation or the like for control of formation of the channel is formed under the field oxide film 24. This impurity layer may or may not be combined with the retrograde p well 3. The p type impurity layer 2 comes into contact with the bottom of the retrograde p well 3, but the p type impurity layer 2 may or may not come into contact with the side of the retrograde p well 3.

According to the method of manufacturing of the semiconductor device in the third embodiment, as mentioned above, the method of manufacturing of the semiconductor device which more greatly improves soft error resistance can be obtained, because the potential barrier of electrons, generated by α-rays or the like in the p type semiconductor substrate 6, with respect to the upper side of the retrograde p well 3 becomes large by the existence of the p type impurity layer 2. In addition, the lifetime of electrons in the p type semiconductor substrate 6 is shortened, and electron flow to the source/drain 25 on the retrograde p well 3 is interrupted.

Further, when a CMOS transistor is formed on the substrate structure, the semiconductor device can obtain low substrate resistance based on the high concentration p type semiconductor substrate 6 and greater improvement of latch up resistance based on the retrograde p well 3.

Furthermore, the p type semiconductor substrate 6, the p type impurity layer 2 and the retrograde p well 3 are in electrical continuity because the p type semiconductor substrate 6, the p type impurity layer 2 and the retrograde p well 3 are of the same type conductivity. Therefore, setting of potential independently is not required. Accordingly, when a memory element or CMOS transistor is formed, restriction of element layout under increasing number of terminals disappears, and it is also possible to manufacture a fine semiconductor device.

In addition, since the p type impurity layer 2 is formed by epitaxial growth, the semiconductor device can obtain the p type semiconductor substrate 6 having the high concentration and the retrograde p well 3 having the low impurity concentration surface for forming a transistor. Therefore, the p type semiconductor substrate 6 and the retrograde p well 3 are easy to make in electrical continuity, and degradation of the transistor threshold voltage or the like is protected.

Fourth embodiment

Figure 32:
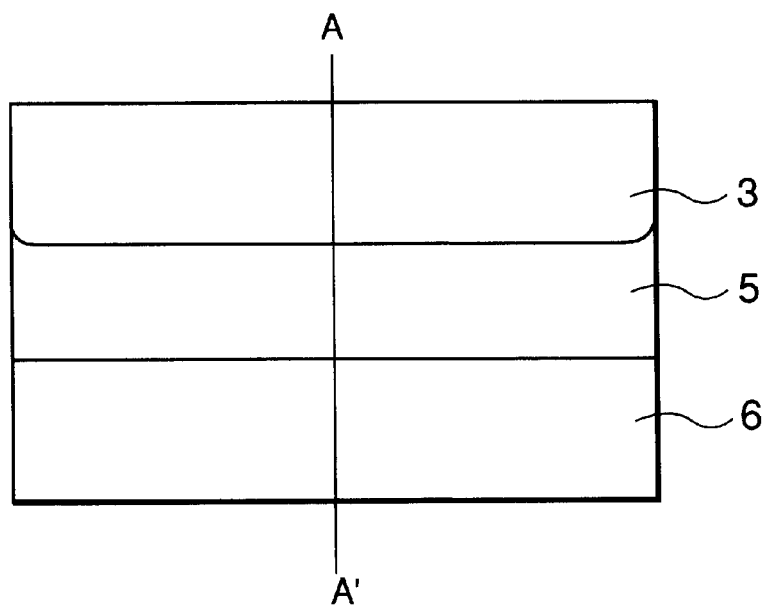
FIG. 32 is a sectional view of a substrate of a semiconductor device of a fourth embodiment of the present invention.
Figure 33:
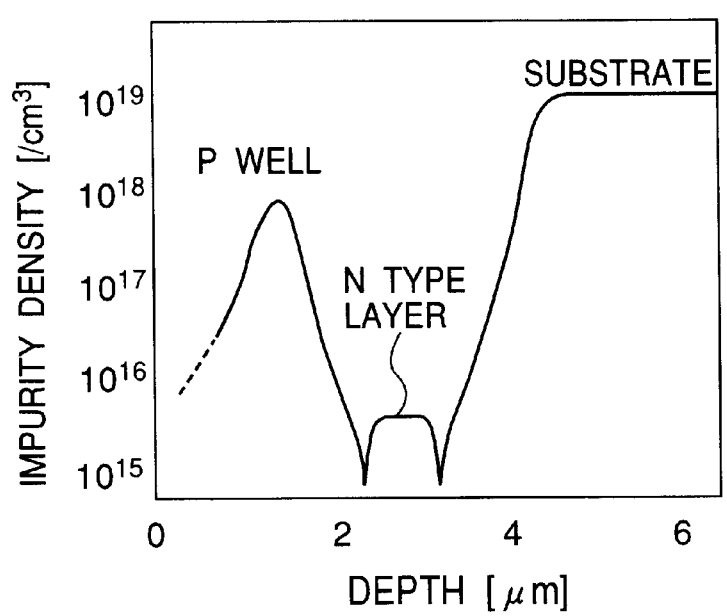
FIG. 33 is an impurity density distribution of an A–A' cross-section of the semiconductor device in FIG. 32.

FIG. 32 shows a sectional view of a substrate of a semiconductor device of the fourth embodiment of the present invention, including the p type semiconductor substrate 6; the n type impurity layer 5 which is formed in the p type semiconductor substrate 6; and the retrograde p well 3 which is formed in the p type semiconductor substrate 6. FIG. 33 shows an impurity density distribution of an A–A' cross-section of the semiconductor device in FIG. 32.

A substrate of the semiconductor device, as shown in FIG. 33, comprises the high concentration p type semiconductor substrate 6 containing boron of the concentration of the degree $1 \times 10^{19}/cm^3$, the n type impurity layer 5 containing phosphorus of a concentration on the order of $1 \times 10^{15}/cm^3$ and the retrograde p well 3 containing boron of concentration on the order of $1 \times 10^{18}/cm^3$.

The plurality of transistors or a single transistor is formed on the retrograde p well 3 (not shown). As in the first embodiment, in the retrograde p well 3, the channel implantation layer for punch-through prevention and threshold control is formed at the depth of 0~0.2 μm m from the substrate as needed. In addition, the impurity layer of the channel cut implantation or the like for control of formation of the channel is formed under the field oxide film 24. This impurity layer may or may not be combined with the retrograde p well 3.

The n type impurity layer 5 comes into contact with the bottom of the retrograde p well 3, but the n type impurity layer 5 may or not come into contact with the side of the retrograde p well 3.

When a memory element is formed on the substrate structure (not shown), as shown in FIG. 33, the semiconductor device which controls soft error based on electrons can be obtained, because a potential barrier of the electrons, generated by α-rays or the like in the p type semiconductor substrate 6, with respect to the upper side of the retrograde p well 3 becomes large by the existence of the n type impurity layer 5. In addition, a lifetime of electrons in the p type semiconductor substrate 6 is shortened, and electron flow to the source/drain 25 on the retrograde p well 3 is interrupted.

Further, when CMOS transistor as a control circuit is formed on the substrate structure, as in third embodiment, the semiconductor device can obtain low substrate resistance based on the p type semiconductor substrate 6, and in addition, improvement of latch up resistance based on the retrograde p well 3.

Furthermore, the n type impurity layer 5 is different from the semiconductor substrate 6 and the retrograde p well 3 in conductivity type. However, the concentration of the n type impurity layer 5 is low enough for electrical continuity with respect to the p type semiconductor substrate 6 and the retrograde p well 3. Therefore, setting of each potential independently is not required. Accordingly, restriction of element layout under increasing number of terminals disappears, and it is also possible to manufacture a fine semiconductor device.

In addition, the semiconductor device can obtain the p type semiconductor substrate 6 having the high concentration and the retrograde p well 3 having the low impurity concentration surface for forming a transistor. Therefore, the p type semiconductor substrate 6 and the retrograde p well 3 are easy to make in continuity, and degradation of transistor threshold voltage or the like is protected.

Figure 34:
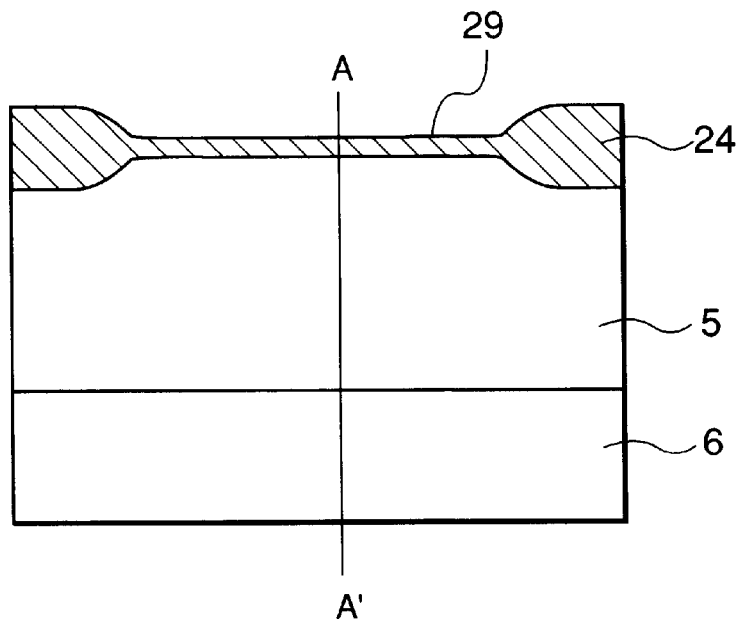
FIG. 34 is a sectional view of a first process step of manufacturing the substrate of the semiconductor device of the fourth embodiment.
Figure 35:
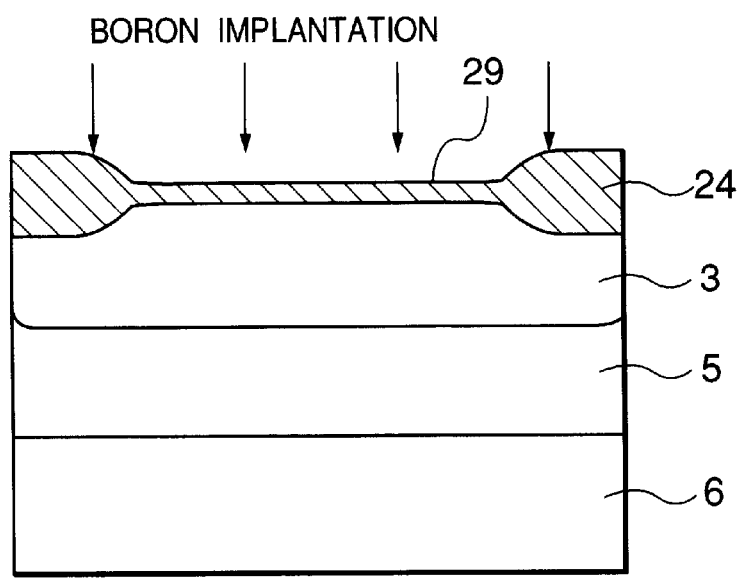
FIG. 35 is a sectional view of a second process step of manufacturing the substrate of the semiconductor device of the fourth embodiment.
Figure 36:
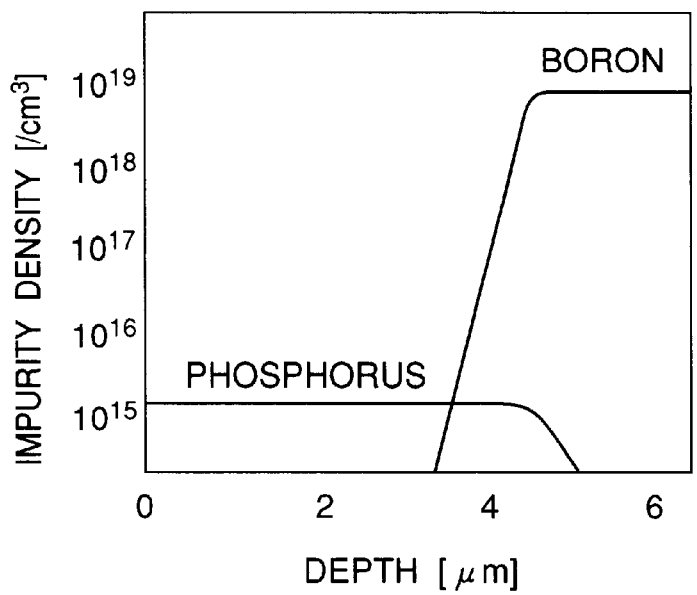
FIG. 36 is an impurity density distribution in an A–A' cross-section of the semiconductor substrate in FIG. 34.
Figure 37:
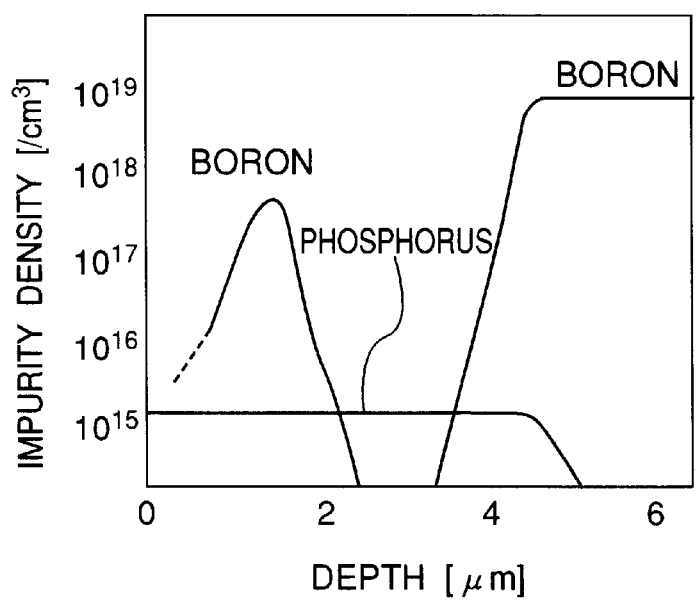
FIG. 37 is an impurity density distribution of boron and phosphorus with respect to the depth direction of the semiconductor substrate in FIG. 35.

FIGS. 34-35 show sectional views of process steps of manufacturing the substrate of the semiconductor device of the fourth embodiment. FIG. 36 shows an impurity density distribution in an A–A' cross-section of the semiconductor substrate in FIG. 34. FIG. 37 shows an impurity density distribution of boron and phosphorus with respect to the depth direction of the semiconductor substrate in FIG. 35.

As shown in FIG. 34, the n type impurity layer 5 containing phosphorus of a concentration on the order of $1 \times 10^{15}/cm^3$ is formed on the p type semiconductor substrate 6 containing boron of a concentration on the order of $1 \times 10^{19}/cm^3$ by epitaxial growth. The thickness of the n type impurity layer 5 is 2~10 μm.

After that, as in the second embodiment, the field oxide film 24 is formed on the separation region of the surface of the n type impurity layer 5, and the oxide film 29 for the gate oxide film 26 is formed on the active region. The field oxide film 24 may be formed first; conversely, the oxide film 29 may be formed first.

As shown in FIG. 35, as in the first embodiment, the mask is formed by patterning of the resist. The mask has an opening portion on the upper side of the formation region of the retrograde p well 3. Boron, which is a source of p type impurity ions, is implanted with high energy through the opening portion in the formation region by conditions of 200 keV~1.5 MeV, $1 \times 10^{12}$~$1 \times 10^{14}/cm^2$, and the retrograde p well 3 containing boron on the order of $1 \times 10^{18}/cm^3$ is formed. After that, a plurality of or single the transistor, the interlayer dielectric film 30, the contact hole and the capacitor or the like are formed respectively, and the wiring is formed (not shown).

In the retrograde p well 3, the channel implantation layer for punch-through prevention and threshold control is formed at a depth of 0~0.2 μm from the substrate as needed. In addition, the impurity layer of the channel cut implantation or the like for control of formation of the channel is formed under the field oxide film 24. This impurity layer may or may not be combined with the retrograde p well 3. The n type impurity layer 5 comes into contact with the bottom of the retrograde p well 3, but the n type impurity layer 5 may or not come into contact with the side of the retrograde p well 3.

According to the method of manufacturing of the semiconductor device in the fourth embodiment, the method of manufacturing the semiconductor device which further improves soft error resistance can be obtained, because the potential barrier of electrons, generated by α-rays or the like in the p type semiconductor substrate 6, with respect to the upper side of the retrograde p well 3 becomes large by the existence of the n type impurity layer 5. In addition, the lifetime of electrons in the p type semiconductor substrate 6 is shortened, and electron flow to the source/drain 25 on the retrograde p well 3 is interrupted.

When a CMOS transistor is formed on the substrate structure, the substrate resistance becomes low by the high concentration p type semiconductor substrate 6, and the p type semiconductor substrate 6 and the retrograde p well 3 are easy to make in continuity. Therefore, the method of manufacturing of the semiconductor device can obtain further improvement of latch up resistance.

Furthermore, the n type impurity layer 5 is different from the semiconductor substrate 6 and the retrograde p well 3 in conductivity type. However, the concentration of the n type impurity layer 5 is low enough for electrical continuity with respect to the p type semiconductor substrate 6 and the retrograde p well 3. Therefore, no setting of each potential independently is required. Accordingly, restriction of element layout under increasing number of terminals disappears, and it is also possible to manufacture fine semiconductor device.

In addition, since the n type impurity layer 5 is formed by epitaxial growth, the semiconductor device can obtain the p type semiconductor substrate 6 having high concentration and the retrograde p well 3 having low impurity concentration surface for forming transistor. Therefore, the p type semiconductor substrate 6 and the retrograde p well 3 are easy to make in electrical continuity, and degradation of transistor threshold voltage or the like is reduced.

Fifth Embodiment

Figure 38:
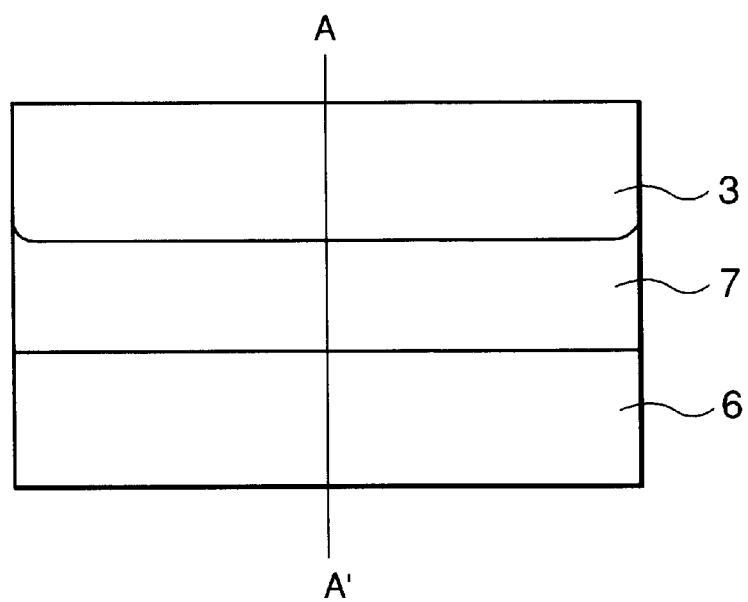
FIG. 38 is a sectional view of a substrate of a semiconductor device of a fifth embodiment of the present invention.

FIG. 38 shows a sectional view of a substrate of a semiconductor device of the fifth embodiment of the present invention, including the p type semiconductor substrate 6; an n type impurity layer 7 which is formed in the p type semiconductor substrate 6; and the retrograde p well 3 which is formed in the p type semiconductor substrate 6.

Figure 39:
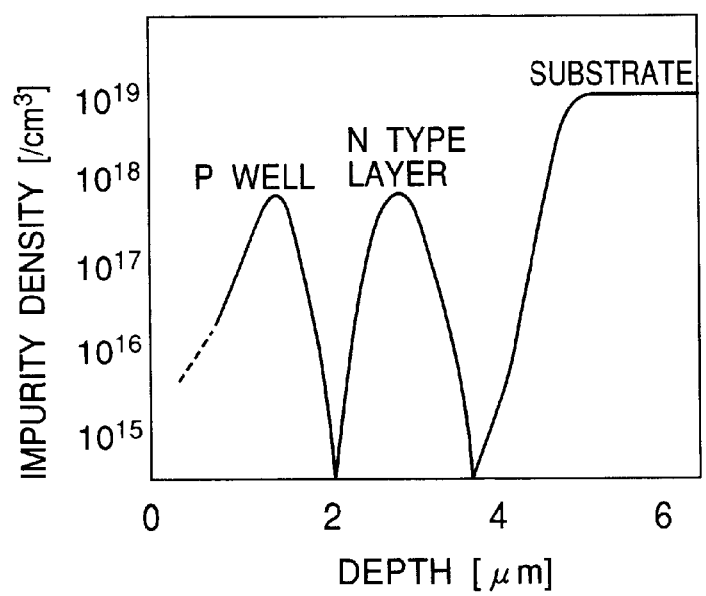
FIG. 39 is an impurity density distribution of an A–A' cross-section of the semiconductor device in FIG. 38.

FIG. 39 shows an impurity density distribution of an A–A' cross-section of the semiconductor device in FIG. 38.

A substrate of the semiconductor device, as shown in FIG. 39, comprises the high concentration p type semiconductor substrate 6 containing boron of a concentration on the order of $1\times10^{19}/cm^3$, the n type impurity layer 7 containing phosphorus of a concentration on the order of $1\times10^{18}/cm^3$ and the retrograde p well 3 containing boron of the concentration on the order of $1\times10^{18}/cm^3$.

The plurality of transistors or a single transistor is formed on the retrograde p well 3 (not shown). As in the first embodiment, in the retrograde p well 3, the channel implantation layer for punch-through prevention and threshold control is formed at the depth of 0~0.2 μm from the substrate as needed. In addition, the impurity layer of the channel cut implantation or the like for control of formation of the channel is formed under the field oxide film 24. This impurity layer may or may not be combined with the retrograde p well 3. The n type impurity layer 7 surrounds the periphery of the retrograde p well 3.

When a memory element is formed on the substrate structure (not shown), as shown in FIG. 39, the semiconductor device which controls soft error based on electrons can be obtained, because a potential barrier of the electrons, generated by α-rays or the like in the p type semiconductor substrate 6, with respect to the upper side of the retrograde p well 3 becomes large by the existence of the n type impurity layer 7. In addition, a lifetime of the electrons in the p type semiconductor substrate 6 is short, and electron flow to the source/drain 25 on the retrograde p well 3 is interrupted.

Further, when the CMOS transistor as a control circuit is formed on the substrate structure, the semiconductor device can obtain a low substrate resistance based on the p type semiconductor substrate 6. In addition, the semiconductor device can obtain an improvement in latch up resistance, because the p type semiconductor substrate 6 separates from the retrograde p well 3 by the n type impurity layer 7 which surrounds the periphery of the p type retrograde well 3.

Figure 40:
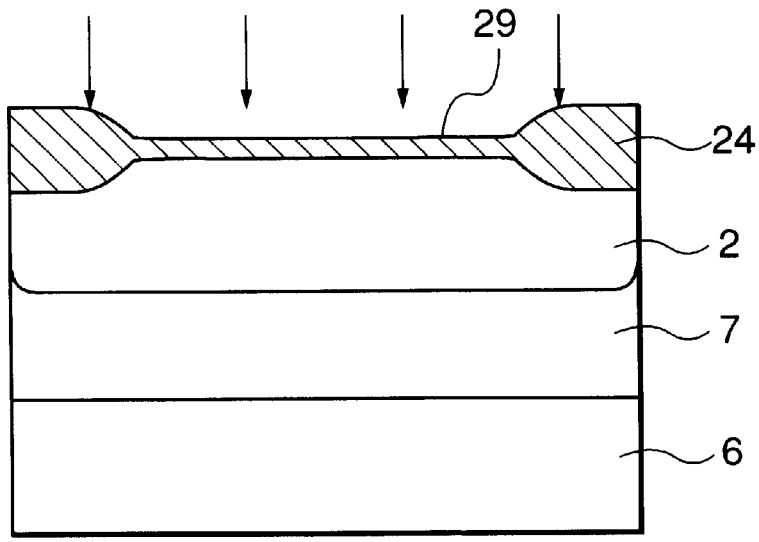
FIG. 40 is a sectional view of a first process step of manufacturing the substrate of the semiconductor device of the fifth embodiment.
Figure 41:
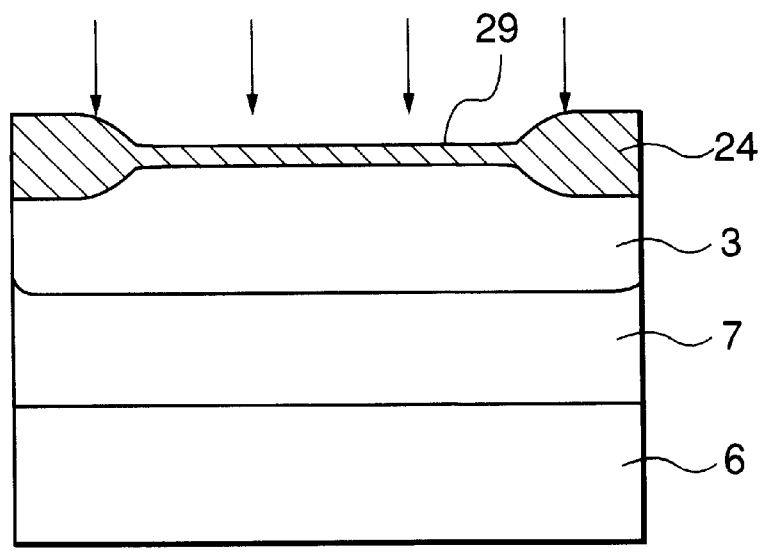
FIG. 41 is a sectional view of a second process step of manufacturing the substrate of the semiconductor device of the fifth embodiment.
Figure 42:
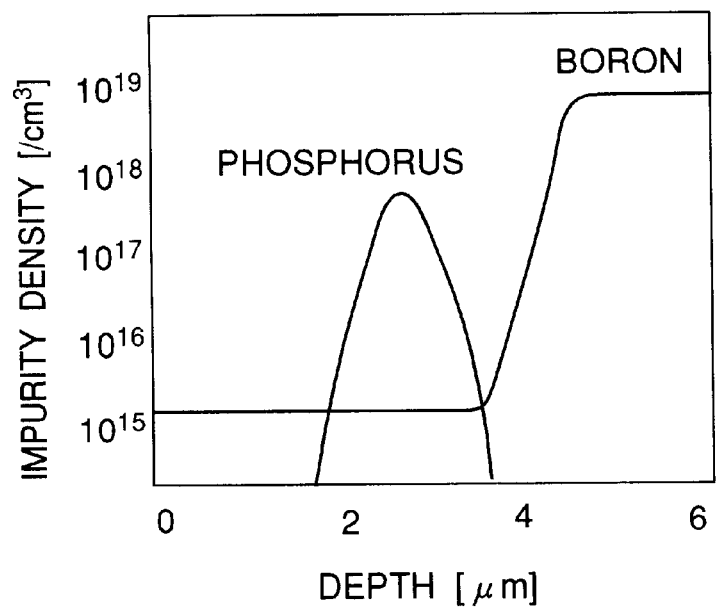
FIG. 42 is an impurity density distribution of boron and phosphorus of the depth direction of the semiconductor substrate in FIG. 40.
Figure 43:
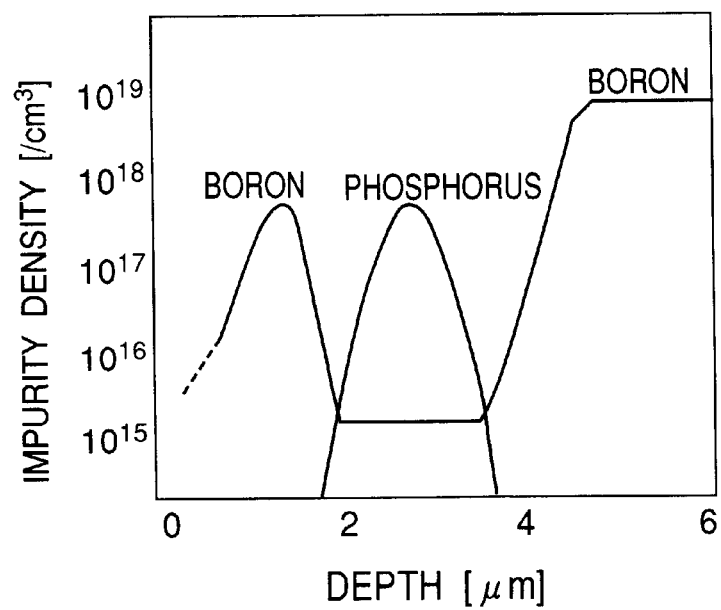
FIG. 43 is an impurity density distribution of boron and phosphorus of the depth direction of the semiconductor substrate in FIG. 41.

FIGS. 40–41 show sectional views of process steps of manufacturing the substrate of the semiconductor device of the fifth embodiment. FIG. 42 shows an impurity density distribution of boron and phosphorus in the depth direction of the semiconductor substrate in FIG. 40. FIG. 43 shows an impurity density distribution of boron and phosphorus in the depth direction of the semiconductor substrate in FIG. 41.

As in the third embodiment, the p type impurity layer 2 containing boron of concentration on the order of $1\times10^{15}/cm^3$ is formed on the high concentration p type semiconductor substrate 6 containing boron of concentration on the order of $1\times10^{18}/cm^3$ by epitaxial growth. The thickness of the p type impurity layer 2 is 2~10 μm.

After that, as in the first embodiment, the field oxide film 24 is formed on the separation region of the surface of the p type impurity layer 2, and the oxide film 29 for the gate oxide film 26 is formed on the active region. The field oxide film 24 may be formed first; conversely, the oxide film 29 may be formed first.

As shown in FIG. 40, a mask is formed by a patterning of the resist. The mask has an opening portion on the upper side of a formation region of the n type impurity layer 7. Phosphorus, which is a source of n type impurity ions, is implanted through the opening portion in the formation region by conditions of 500 keV~10 MeV, $1\times10^{12}$~$1\times10^{14}/cm^2$, and the n type impurity layer 7 is formed.

As shown in FIG. 41, as in the first embodiment, the mask is formed by patterning of the resist. The mask has an opening portion on the upper side of the formation region of the retrograde p well 3. Boron, which is of p type impurity ion, is implanted with high energy through the opening portion in the formation region by conditions of 200 keV~1.5 MeV, $1\times10^{12}$~$1\times10^{14}/cm^2$, and the retrograde p well 3 is formed.

After that, the plurality of or single transistor is formed, the interlayer dielectric film 30, the contact hole and the capacitor or the like are formed, and the wiring is formed (not shown).

The n type impurity layer 7 has to surround the retrograde p well 3. However, in relation to order of formation, the n type impurity region 7 may be formed first; conversely, the retrograde p well 3 may be formed first.

In the retrograde p well 3, as in the first embodiment, the channel implantation layer for punch-through prevention and threshold control is formed at the depth of 0~0.2 μm from the substrate as needed. In addition, the impurity layer of the channel cut implantation or the like for control of formation of the channel is formed under the field oxide film 24. This impurity layer may or may not be combined with the retrograde p well 3.

According to the method of manufacturing the semiconductor device in the fifth embodiment, the method of manufacturing of the semiconductor device which further improves soft error resistance can be obtained, because the potential barrier of electrons, generated by α-rays or the like in the p type semiconductor substrate 6, with respect to the upper side of the retrograde p well 3 becomes large by the existence of the n type impurity layer 7. In addition, the lifetime of electrons in the p type semiconductor substrate 6 is shortened, and electron flow to the source/drain 25 on the retrograde p well 3 is interrupted.

When a CMOS transistor is formed on the substrate structure, the semiconductor device can obtain the semiconductor substrate 6 having high concentration and the retrograde p well 3 having a low impurity concentration surface for forming the transistor, because the n type impurity layer 7 and the retrograde p well 3 are formed after forming the p type impurity layer 2 on the p type semiconductor substrate 6 by epitaxial growth. Therefore, in the method of manufacturing of the semiconductor device, degradation of transistor threshold voltage or the like is protected, and further, the low substrate resistance and retrograde p well 3 improve latch up resistance.

Sixth Embodiment

Figure 44:
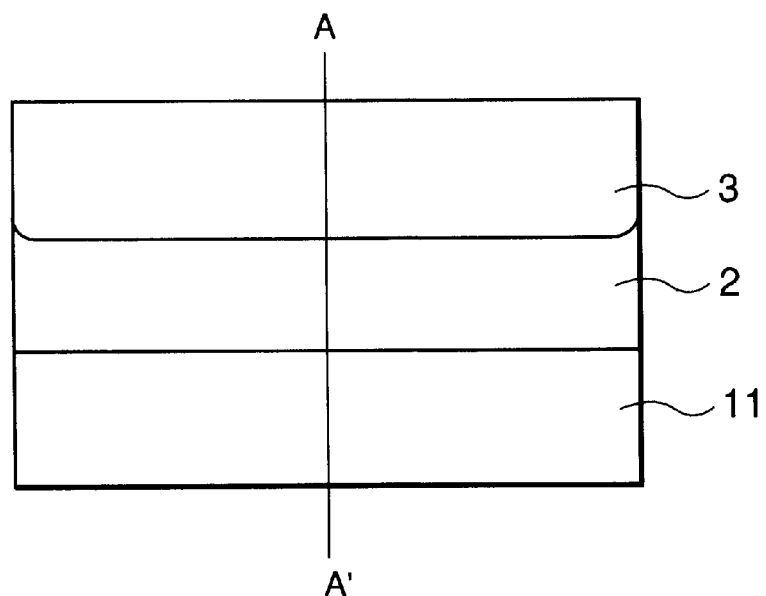
FIG. 44 is a sectional view of a substrate of a semiconductor device of a sixth embodiment of the present invention.

FIG. 44 shows a sectional view of a substrate of a semiconductor device of the sixth embodiment of the present invention, including an n type semiconductor substrate 11; the p type impurity layer 2 which is formed in the n type semiconductor substrate 11; and the retrograde p well 3 which is formed in the n type semiconductor substrate 11.

Figure 45:
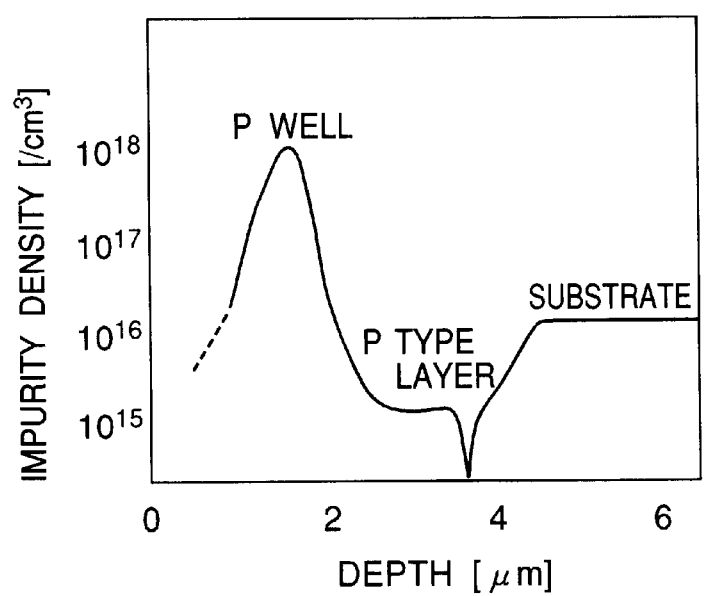
FIG. 45 is an impurity density distribution of an A–A' cross-section of the semiconductor substrate in FIG. 44.
Figure 46:
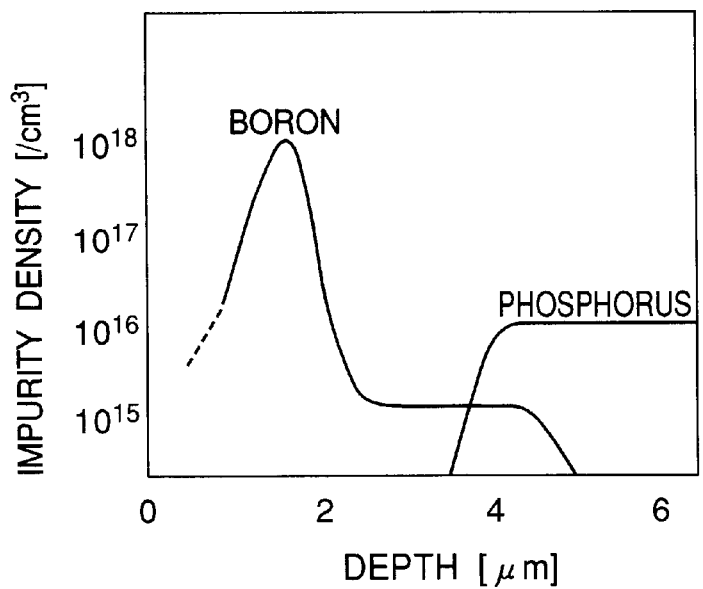
FIG. 46 is an impurity density distribution of boron and phosphorus of the A–A' cross-section of the semiconductor substrate in FIG. 44.

FIG. 45 shows an impurity density distribution of an A–A' cross-section of the semiconductor substrate in FIG. 44. FIG. 46 shows an impurity density distribution of boron and phosphorus of the A–A' cross-section of the semiconductor substrate in FIG. 44.

A substrate of the semiconductor device, as shown in FIG. 45, comprises the n type semiconductor substrate 11 containing phosphorus of concentration on the order of $1\times10^{16}/cm^3$, the p type impurity layer 2 containing boron of concentration on the order of $1\times10^{15}/cm^3$ and the retrograde p well 3 containing boron of concentration on the order of $1\times10^{18}/cm^3$.

The plurality of transistors or single transistor is formed on the retrograde p well 3 (not shown) . As in first embodiment, in the retrograde p well 3, the channel implantation layer for punch-through prevention and threshold control is formed at a depth of 0~0.2 μm from the substrate as needed. In addition, the impurity layer of the channel cut implantation or the like for control of formation of the channel is formed under the field oxide film 24. This impurity layer may or may not be combined with the retrograde p well 3. The p type impurity layer 2 comes into contact with the bottom of the retrograde p well 3, but the p type impurity layer 2 may or not come into contact with the side of the retrograde p well 3.

The semiconductor structure can improve pressure resistance, because a field between the retrograde p well 3 and the n type semiconductor substrate 11 is alleviated.

Further, since the n type semiconductor substrate 11 has a high concentration and the retrograde p well 3 has the low impurity concentration surface for forming the transistor, degradation of transistor threshold voltage or the like can be reduced.

A method of manufacturing the substrate of the semiconductor device of the sixth embodiment is as follow.

Figure 47:
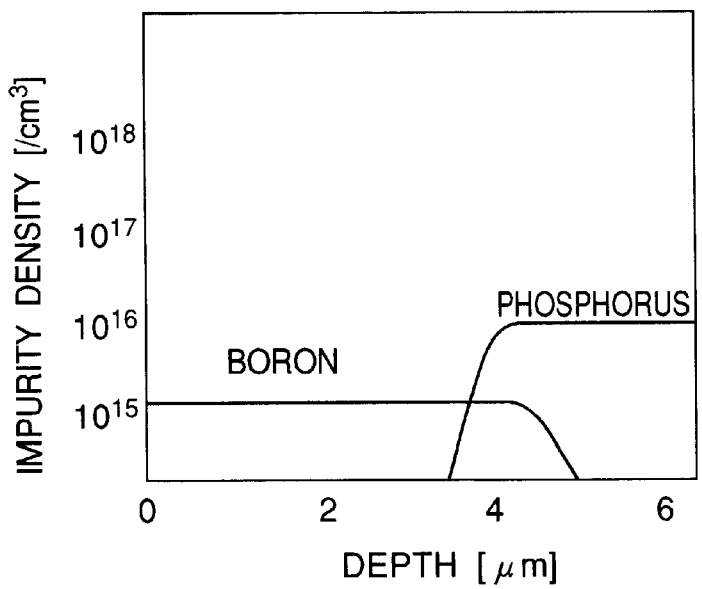
FIG. 47 is an impurity density distribution of boron and phosphorus with respect to the depth direction of the semiconductor substrate in a manufacture.

As in the first embodiment, the p type impurity layer 2 containing boron of a concentration on the order of $1\times10^{15}/cm^3$ is formed on the n type semiconductor substrate 11 containing phosphorus of concentration on the order $1\times10^{16}/cm^3$ by epitaxial growth. The thickness of the p type impurity layer 2 is 2~10 μm. The field oxide film 24 and the oxide film 29 are formed. FIG. 47 shows an impurity density distribution of boron and phosphorus with respect to the depth direction of the semiconductor substrate at this time.

After that, as in first embodiment, the retrograde p well 3 is formed. The plurality of or single transistor is formed, as needed, the interlayer dielectric film 30, the contact hole and the capacitor or the like are formed respectively, and the wiring is formed (not shown).

In the retrograde p well 3, the channel implantation layer for punch-through prevention and the threshold control is formed at a depth of 0~0.2 μm from the substrate as needed. In addition, the impurity layer of the channel cut implantation or the like for control of formation of the channel is formed under the field oxide film 24. This impurity layer may or may not be combined with the retrograde p well 3.

According to the method of manufacturing, as mentioned above, pressure resistance can be improved, because the field between the retrograde p well 3 and the n type semiconductor substrate 11 is alleviated.

Further, since the n type semiconductor substrate 11 has a high concentration and the retrograde p well 3 has a low impurity concentration surface for forming the transistor, degradation of transistor threshold voltage or the like can be reduced, and range of process conditions, for example control of impurity concentration, can be set broadly in the manufacturing process.

Seventh embodiment

Figure 48:
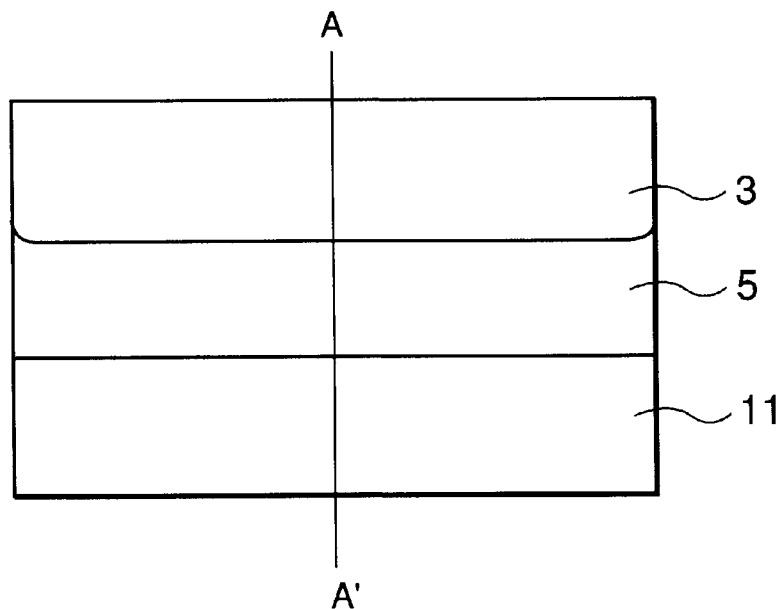
FIG. 48 is a sectional view of a substrate of a semiconductor device of a seventh embodiment of the present invention.
Figure 49:
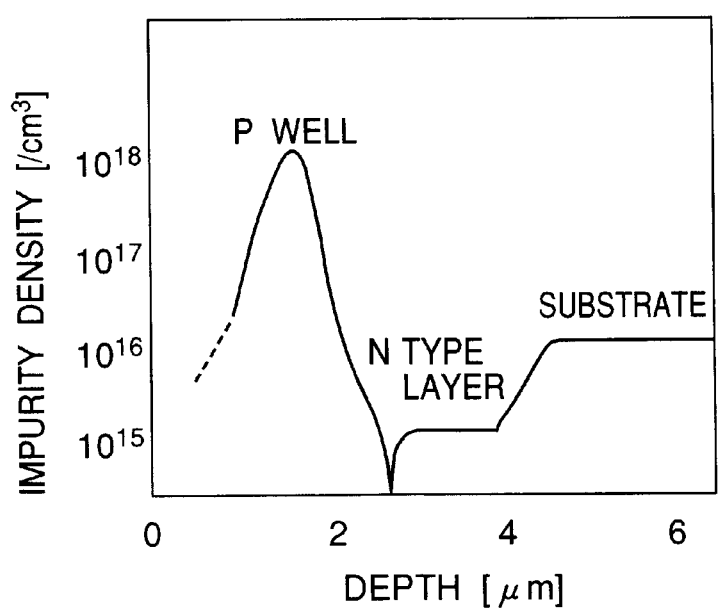
FIG. 49 is an impurity density distribution of an A–A' cross-section of the semiconductor substrate in FIG. 48.
Figure 50:
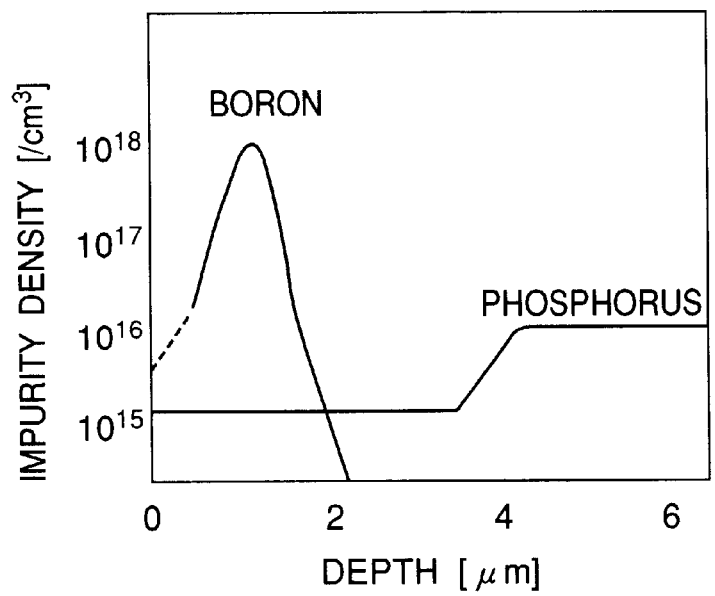
FIG. 50 is an impurity density distribution of boron and phosphorus with respect to the depth direction of the A–A' cross-section of the semiconductor substrate in FIG. 48.

FIG. 48 shows a sectional view of a substrate of a semiconductor device of the seventh embodiment of the present invention, including the n type semiconductor substrate 11; the n type impurity layer 5 which is formed in the n type semiconductor substrate 11; and the retrograde p well 3 which is formed in the n type semiconductor substrate 11. FIG. 49 shows an impurity density distribution of an A–A' cross-section of the semiconductor substrate in FIG. 48. FIG. 50 shows an impurity density distribution of boron and phosphorus with respect to the depth direction of the A–A' cross-section of the semiconductor substrate in FIG. 48.

A substrate of the semiconductor device, as shown in FIG. 48, comprises the n type semiconductor substrate 11 containing phosphorus of concentration on the order of $1\times10^{16}/cm^3$, the n type impurity layer 5 containing phosphorus of concentration on the order of $1\times10^{15}/cm^3$ and the retrograde p well 3 containing boron of concentration on the order of $1\times10^{18}/cm^3$.

Figure 51:
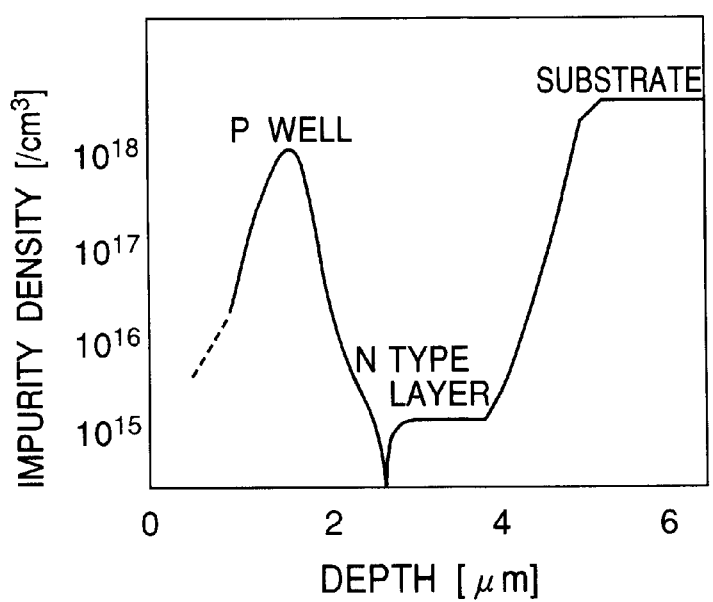
FIG. 51 is an impurity density distribution of the A–A' cross-section of the semiconductor substrate in FIG. 48.
Figure 52:
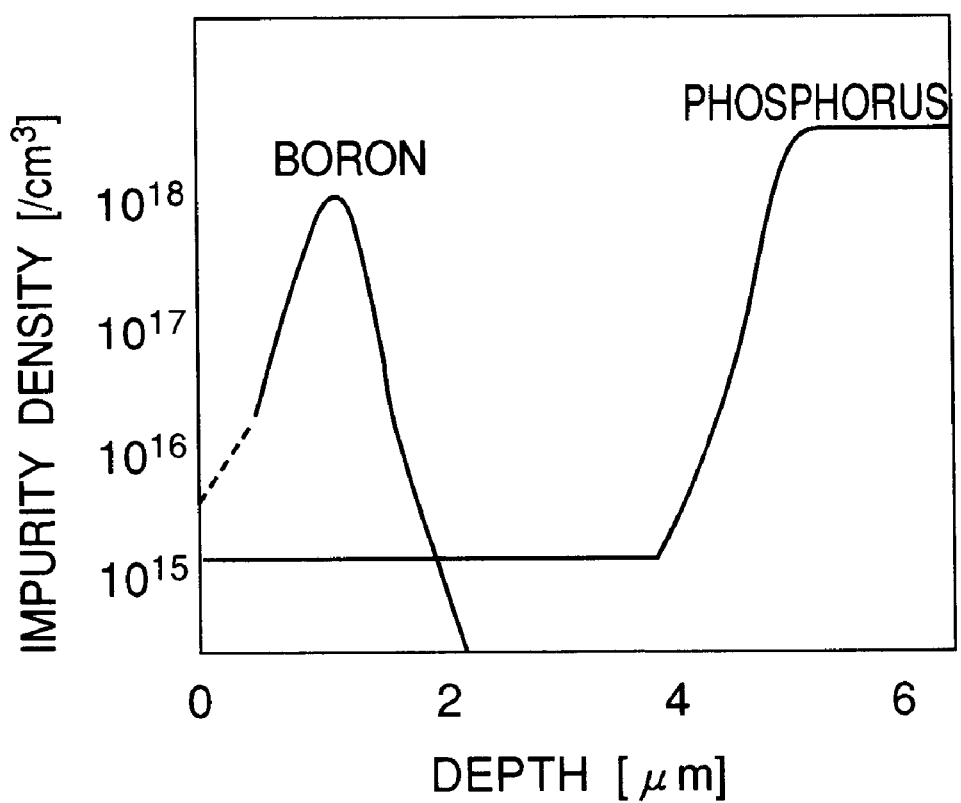
FIG. 52 is an impurity density distribution of boron and phosphorus with respect to the depth direction of the A–A' cross-section of the semiconductor substrate in FIG. 48.

The n type semiconductor substrate 11 also may contain phosphorus of a concentration of a degree $1\times10^{18}/cm^3$. In this case, FIG. 51 shows an impurity density distribution of the A–A' cross-section of the semiconductor substrate in FIG. 48. FIG. 52 shows an impurity density distribution of boron and phosphorus with respect to the depth direction of the A–A' cross-section of the semiconductor substrate in FIG. 48.

Further, the plurality of transistors or single transistor is formed on the retrograde p well 3 (not shown). As in the first embodiment, in the retrograde p well 3, the channel implantation layer for punch-through prevention and threshold control is formed at the depth of 0~0.2 μm from the substrate as needed. In addition, the impurity layer of the channel cut implantation or the like for control of formation of the channel is formed under the field oxide film 24. This impurity layer may or may not be combined with the retrograde p well 3.

The n type impurity layer 5 comes into contact with the bottom of the retrograde p well 3, but the n type impurity layer 5 may or not come into contact with the side of the retrograde p well 3.

As in the sixth embodiment, the semiconductor structure can improve pressure resistance, because the field between the retrograde p well 3 and the n type semiconductor substrate 11 is alleviated.

Further, since the n type semiconductor substrate 11 has a high concentration and the retrograde p well 3 has a low impurity concentration surface for forming the transistor, degradation of transistor threshold voltage or the like can be reduced.

In case of the n type semiconductor substrate 11 containing phosphorus of concentration of on the order of $1\times10^{18}/cm^3$, the semiconductor device can obtain a low substrate resistance, and in addition, improvement in latch up resistance based on the retrograde p well 3 when CMOS transistor is formed on the substrate structure is realized.

A method of manufacturing the substrate of the semiconductor device of the seventh embodiment is as follow.

Like the second embodiment, the n type impurity layer 5 containing phosphorus of concentration on the order of $1\times10^{15}/cm^3$ is formed on the n type semiconductor substrate 11 containing phosphorus of concentration on the order $1\times10^{16}/cm^3$ by the epitaxial growth. The thickness of the n type impurity layer 5 is 2~10 μm. After that, the field oxide film 24 and the oxide film 29 are formed.

After that, as in the second embodiment, the retrograde p well 3 and the transistor are formed, as needed, interlayer dielectric film 30, the contact hole and the capacitor or the like are formed, and the wiring is formed (not shown).

As in the first embodiment, in the retrograde p well 3, the channel implantation layer for punch-through prevention and threshold control is formed at the depth of 0~0.2 μm from the substrate as needed. In addition, the impurity layer of the channel cut implantation or the like for control of formation of the channel is formed under the field oxide film 24. This impurity layer may or may not be combined with the retrograde p well 3.

According to the method of manufacturing, as mentioned above, pressure resistance can be improved, because the field between the retrograde p well 3 and the n type semiconductor substrate 11 is alleviated.

Further, since the n type semiconductor substrate 11 has a high concentration and the retrograde p well 3 has a low impurity concentration surface for forming the transistor, degradation of transistor threshold voltage or the like can be reduced, and range of process conditions, for example control of impurity concentration, can be set broadly in the manufacturing process.

In case of the n type semiconductor substrate 11 containing phosphorus of the concentration on the order $1\times10^{18}/\text{cm}^3$, according to the method of manufacturing, low substrate resistance and improvement of latch up resistance based on the retrograde p well 3 can be obtained when CMOS transistor is formed on the substrate structure.

Eighth embodiment

Figure 53:
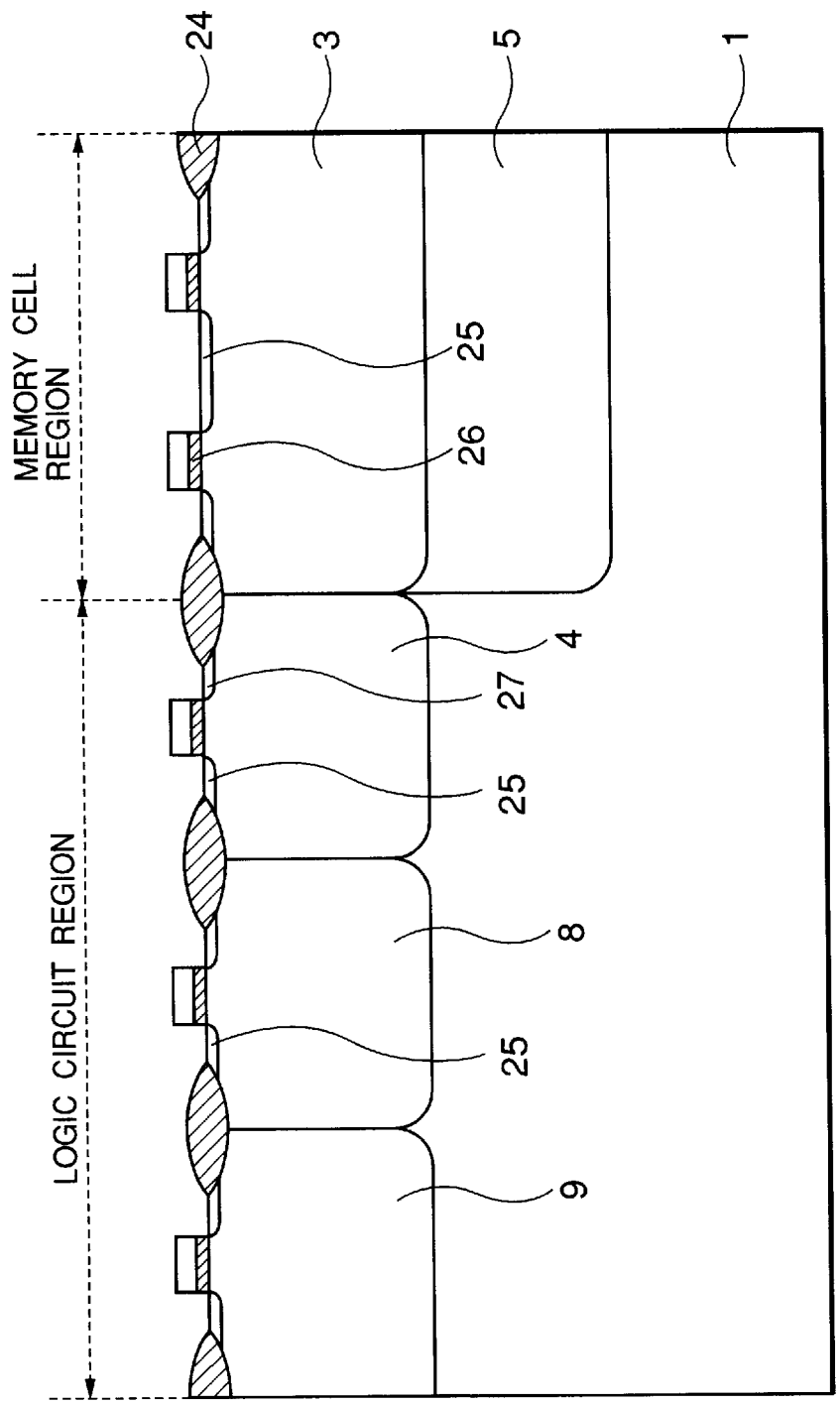
FIG. 53 is a sectional view of a semiconductor device of a eighth embodiment of the present invention.

FIG. 53 shows a sectional view of a semiconductor device of the eighth embodiment of the present invention, including retrograde n wells 4, 9; and a retrograde p well 3, 8. The remaining structures are the same structures as shown from the first to seventh embodiments.

Figure 54:
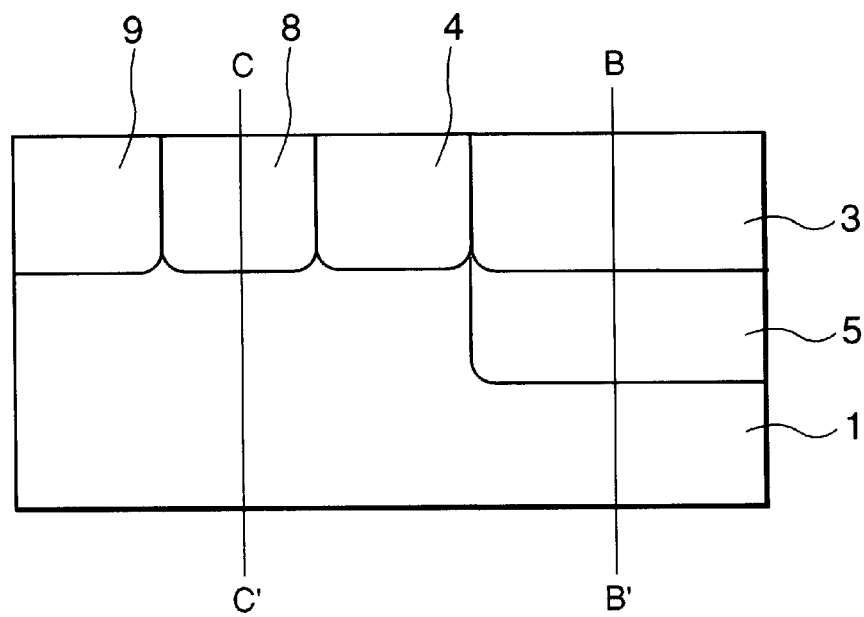
FIG. 54 is a sectional view of a substrate of the semiconductor device in FIG. 53.

FIG. 54 shows a sectional view of a substrate of the semiconductor device in FIG. 53.

The semiconductor device is divided roughly into an element region (a memory cell region) for storing information of large-capacity mainly and an element region (a logic circuit region) for executing logical calculations while exchanging information of large-capacity with the memory cell region.

The memory cell region comprises an NMOSFET mainly. The logic circuit region comprises a CMOSFET mainly.

Figure 55:
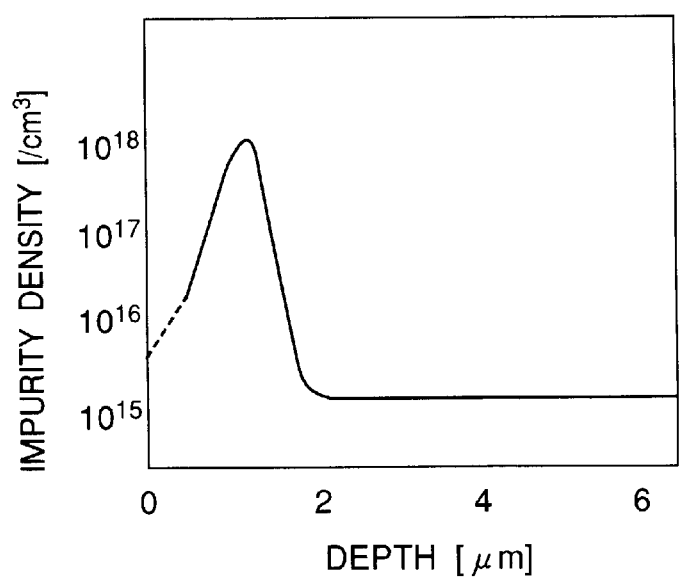
FIG. 55 is an impurity density distribution of a C–C' cross-section of the semiconductor substrate in FIG. 54.

FIG. 55 shows an impurity density distribution of a C–C', cross-section of the semiconductor substrate in FIG. 54. An impurity density distribution of a B–B' cross-section in FIG. 54 is shown in FIG. 10. As shown in FIG. 54, the memory cell region has the same substrate structure as shown in the second embodiment.

The plurality of or single transistor is formed on the retrograde p well 3 (not shown). As in the second embodiment, in the retrograde p well 3, the channel implantation layer for punch-through prevention and threshold control is formed at the depth of 0~0.2 m from the substrate as needed. In addition, the impurity layer of the channel cut implantation or the like for control of formation of the channel is formed under the field oxide film 24. This impurity layer may or may not be combined with the retrograde p well 3. The n type impurity layer 5 comes into contact with the bottom of the retrograde p well 3, but the n type impurity layer 5 may or not come into contact with the side of the retrograde p well 3.

A plurality of transistors or a single transistor is formed on the retrograde p well 8, the retrograde n well 4 and the retrograde n well 9 (not shown), and a CMOS is formed on the logic circuit region. In this case, in the retrograde wells, the channel implantation layer for punch-through prevention and threshold control is formed at the depth of 0~0.2 µm from the substrate as needed. In addition, the impurity layer of the channel cut implantation or the like for control of formation of the channel is formed under the field oxide film 24 as needed. This impurity layer may or may not be combined with the retrograde p well 3.

Figure 56:
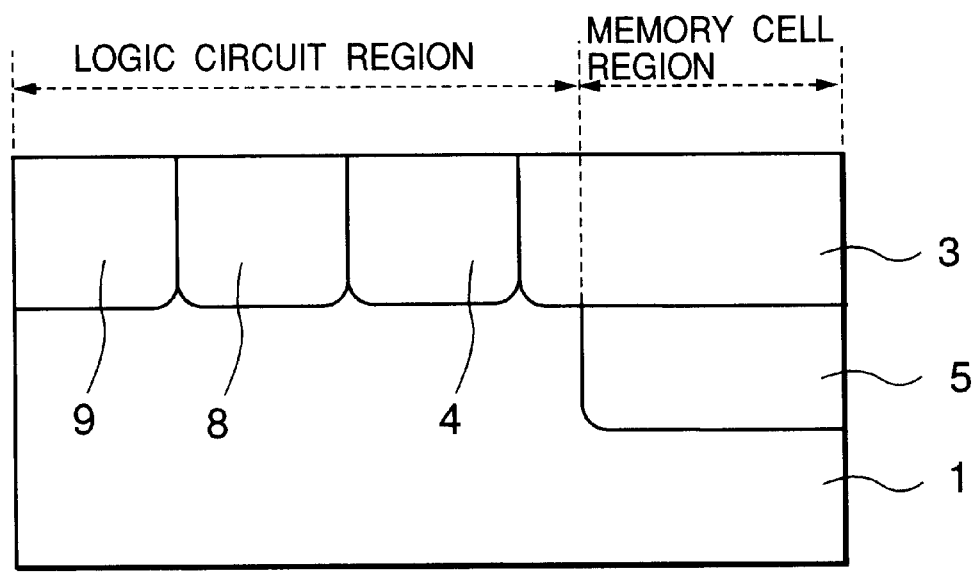
FIG. 56 is another sectional view of the semiconductor device of the eighth embodiment of the present invention.

Further, the CMOS as the logic circuit may be formed by transistors formed on the retrograde n well 4 and the retrograde p well 3. A transistor as the memory cell also may be formed on the retrograde p well 3. At this time, as shown in FIG. 56, the retrograde p well 3 may be formed widely on a region other than the n type impurity layer 5. Therefore, latch up resistance of the logic circuit region can be maintained.

A well for the CMOS of the logic circuit region may comprise a part of the retrograde p well 3 and the retrograde n well 4. In addition, the well may contain another region.

According to the substrate structure of the memory cell region, as shown in FIG. 10, as in the second embodiment, soft error based on the electron can be controlled, because the potential barrier of electrons, generated by α-rays or the like in the p type semiconductor substrate 1, with respect to the upper side of the retrograde p well 3, becomes larger by the existence of the n type impurity layer 5, and electron flow to the source/drain 25 on the retrograde p well 3 is interrupted.

Further, as in the second embodiment, the n type impurity layer 5 is different from the semiconductor substrate 1 and the retrograde p well 3 in the conductivity type. However, the concentration of the n type impurity layer 5 is low enough for electrical continuity with respect to the semiconductor substrate 1 and the retrograde p well 3. Therefore, no setting of each potential independently is required. Accordingly, restriction of element layout under increasing number of terminals disappears, and it is also possible to manufacture a fine semiconductor device.

FIGS. 57–63 show sectional views of process steps of manufacturing the substrate of the semiconductor device of the eighth embodiment.

Figure 57:
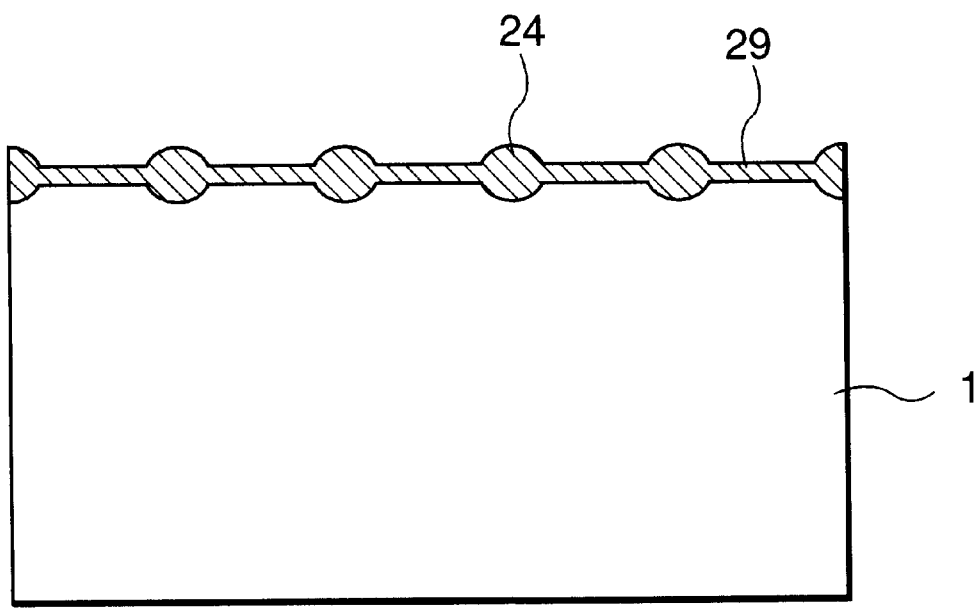
FIG. 57 is a sectional view of a first process step of manufacturing the substrate of the semiconductor device of the eighth embodiment.

As shown in FIG. 57, the field oxide film 24 is formed on the separation region on the main surface of the p type semiconductor substrate 1 containing boron of concentration on the order of $1\times10^{16}/\text{cm}^3$, and the oxide film 29 for the gate oxide film 26 is formed on the active region. The field oxide film 24 may be formed first; conversely, the oxide film 29 may be formed first.

Figure 58:
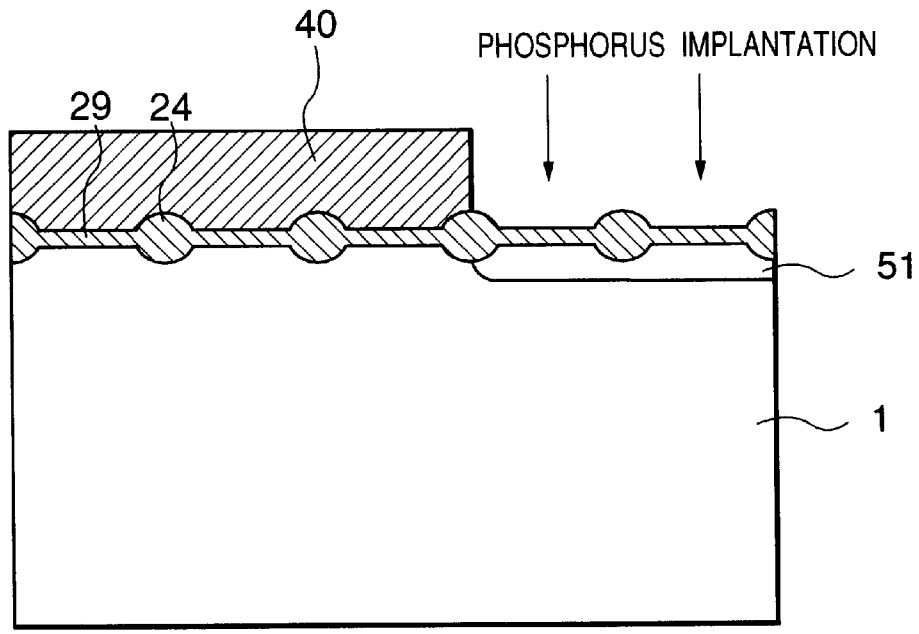
FIG. 58 is a sectional view of a second process step of manufacturing the substrate of the semiconductor device of the eighth embodiment.
Figure 59:
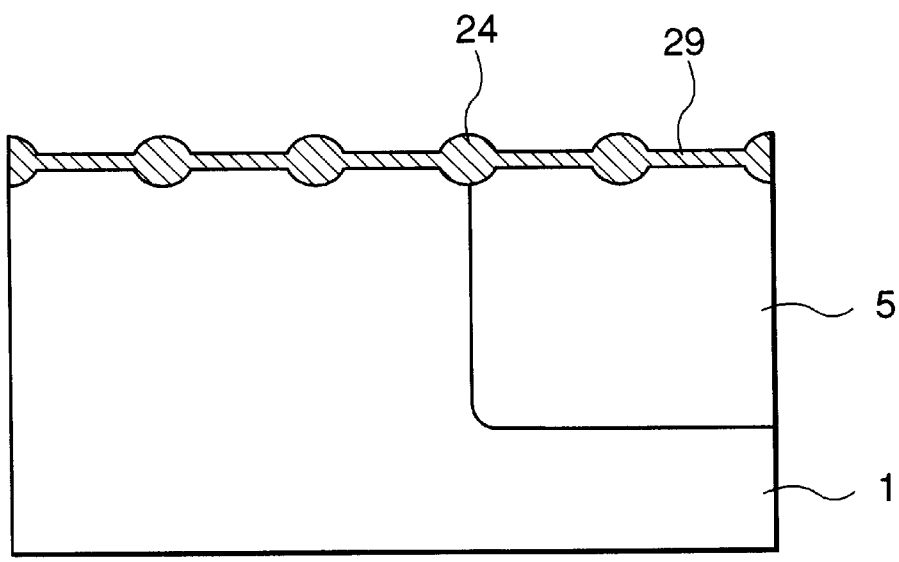
FIG. 59 is a sectional view of a third process step of manufacturing the substrate of the semiconductor device of the eighth embodiment.

As shown in FIG. 58, a resist 40 is formed. The resist 40 has an opening portion on the memory cell region. Phosphorus, which is a source of n type impurity ions, is implanted through the opening portion in the formation region by conditions of 50 keV~200 keV, $1\times10^{11}\sim1\times10^{12}/\text{cm}^2$, and the n type impurity layer 51 is formed. After removing the resist 40, as shown in FIG. 59, phosphorus is diffused by thermal annealing of the order of 1100~1200 and 0.5~3 hours, and the low concentration n type impurity layer 5 is formed.

Figure 60:
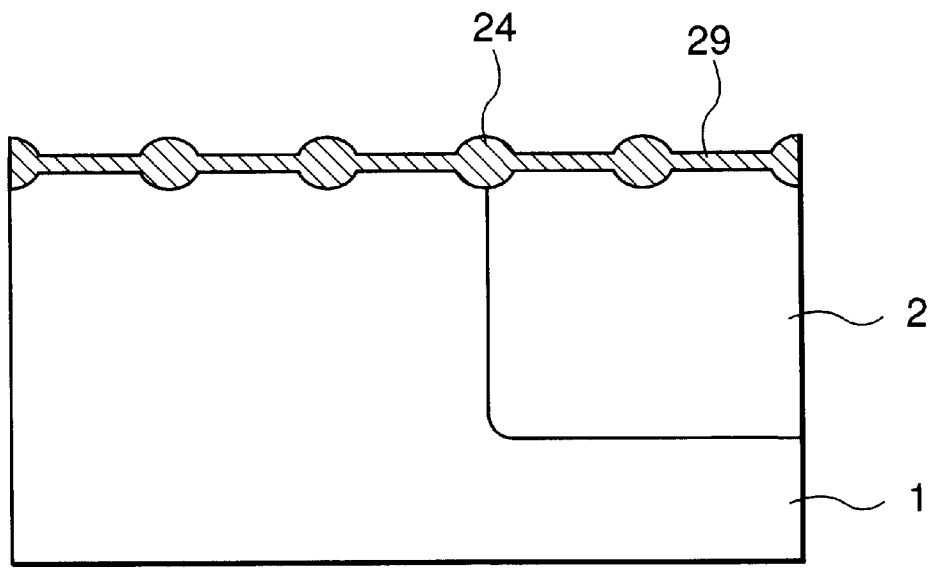
FIG. 60 is a sectional view of a fourth process step of manufacturing the substrate of the semiconductor device of the eighth embodiment.

When the impurity concentration of implanted phosphorus is low and the thermal annealing temperature is high or the thermal annealing time is long, as shown in FIG. 60, as in the first embodiment, there is the case that the p type impurity layer 2 is formed in the formation region for the n type impurity layer 5. However, there is no problem about the formed p type impurity layer 2.

Figure 61:
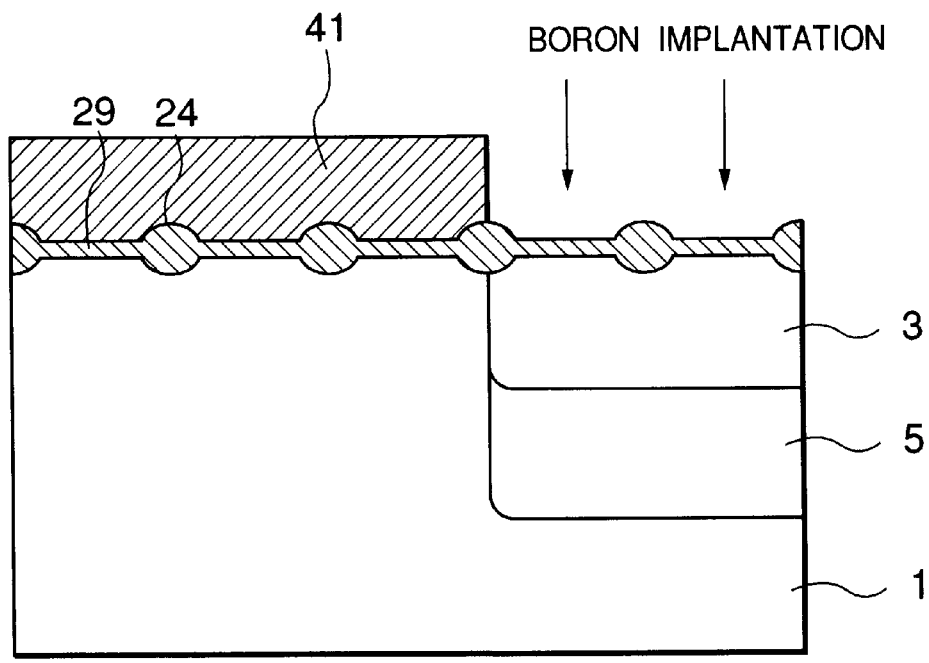
FIG. 61 is a sectional view of a fifth process step of manufacturing the substrate of the semiconductor device of the eighth embodiment.

As shown in FIG. 61, a resist 41 is formed. The resist 41 has an opening portion on the formation region for the retrograde p well 3 in the memory cell region. Boron, which is a source of p type impurity ions, is implanted with high energy through the opening portion in the formation region by conditions of 200 keV~1.5 MeV, $1\times10^{12}\sim1\times10^{14}/\text{cm}^2$, and the retrograde p well 3 is formed.

Figure 62:
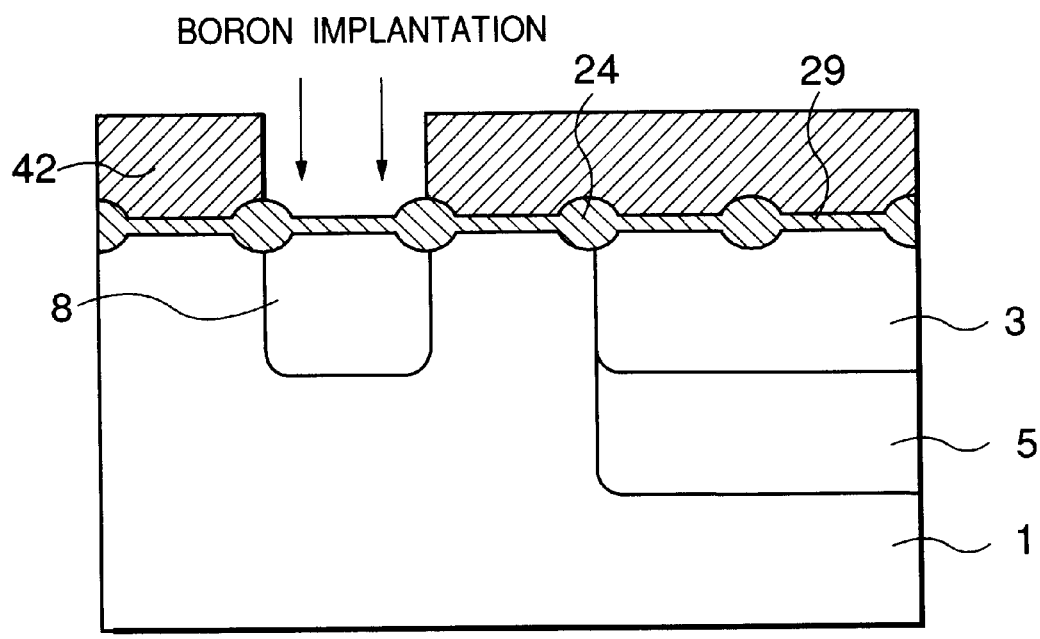
FIG. 62 is a sectional view of a sixth process step of manufacturing the substrate of the semiconductor device of the eighth embodiment.

As shown in FIG. 62, a resist 42 is formed. The resist 42 has an opening portion on a formation region for the NMOSFET in the logic circuit region. Boron, which is a source of p type impurity ions, is implanted with high energy through the opening portion in the formation region by conditions of 200 keV~1.5 MeV, $1\times10^{12}$~$1\times10^{14}/^2$, and the retrograde p well 8 is formed.

Figure 63:
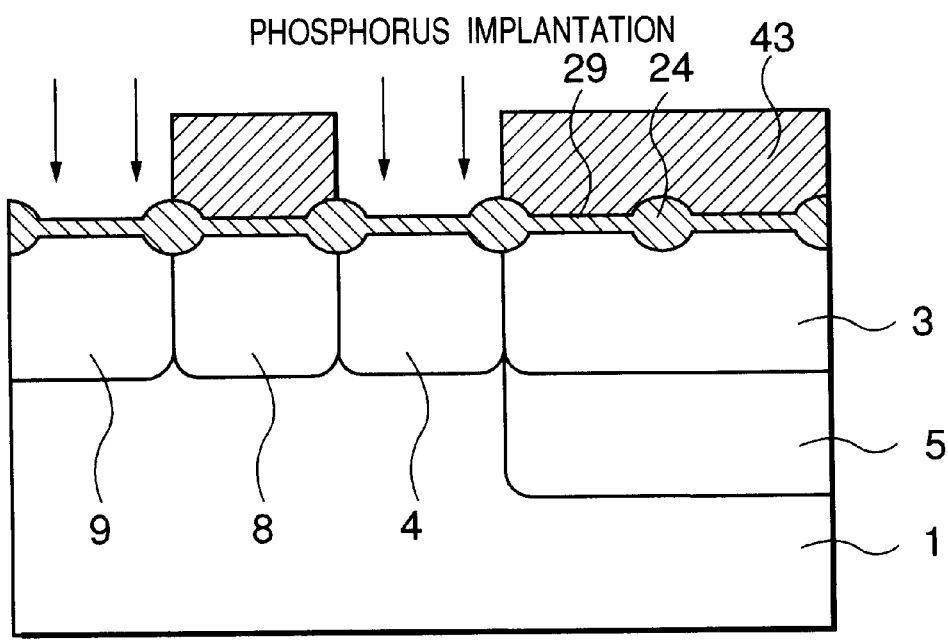
FIG. 63 is a sectional view of a seventh process step of manufacturing the substrate of the semiconductor device of the eighth embodiment.

As shown in FIG. 63, a resist 43 is formed. The resist 43 has an opening portion on a formation region for the PMOSFET in the logic circuit region. Phosphorus, which is a source of n type impurity ions, is implanted through the opening portion in the formation region by conditions of 300 keV~2.5 MeV, $1\times10^{12}$~$1\times10^{14}/cm^2$, and the retrograde n wells 4, 9 are formed. After that, the transistor, the interlayer dielectric film 30, the contact hole and the capacitor or the like are formed, and the wiring is formed (not shown).

The retrograde p wells 3, 8 may be formed at the same time. In addition, the retrograde n wells 4, 9 may be formed at the same time. It is also possible to change the order of formation on each retrograde well.

According to the method of manufacturing of the semiconductor device in the eighth embodiment, as mentioned above, soft error based on electrons can be controlled, because the potential barrier of electrons, generated by α-rays or the like in the p type semiconductor substrate 1, with respect to the upper side of the retrograde p well 3, becomes large by the existence of the n type impurity layer 5, and electron flow to the source/drain 25 on the retrograde p well 3 is interrupted.

Further, the n type impurity layer 5 is different from the semiconductor substrate 1, the retrograde p well 3 and the p type impurity layer 2 in conductivity type. However, the concentration of the n type impurity layer 5 is low enough for electrical continuity with respect to the semiconductor substrate 1, the retrograde p well 3 and the p type impurity layer 2. Therefore, no setting of each potential independently is required. Accordingly, restriction of element layout under increasing number of terminals disappears, and it is also possible to manufacture a fine semiconductor device.

Ninth embodiment

Figure 64:
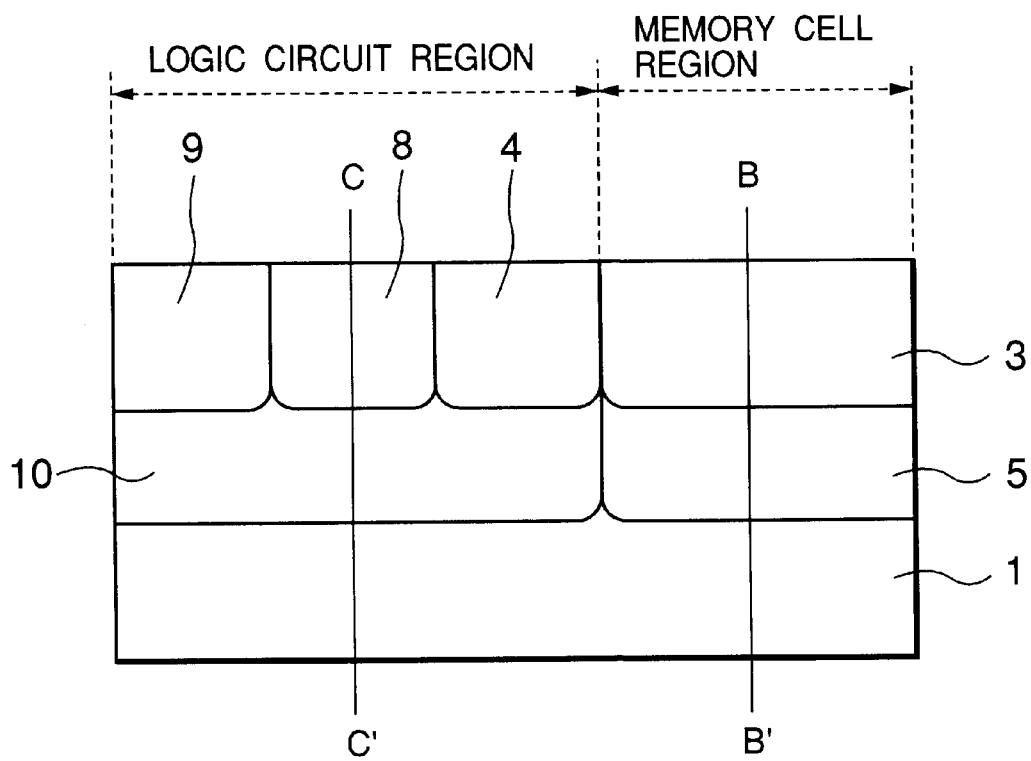
FIG. 64 is a sectional view of a semiconductor device of a ninth embodiment of the present invention.
Figure 65:
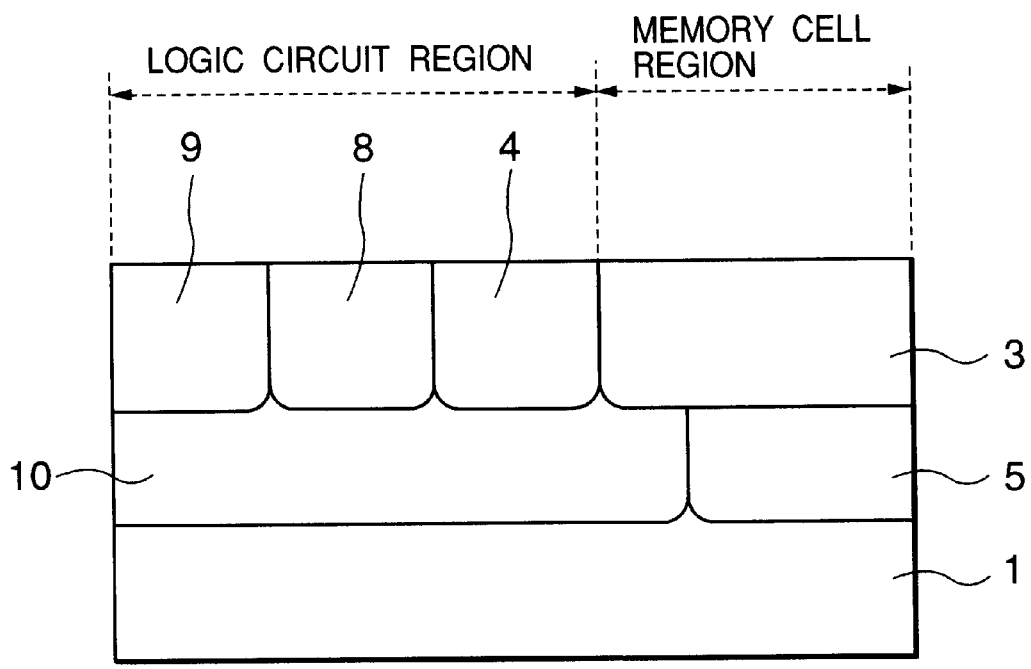
FIG. 65 is a sectional view of another semiconductor device of the ninth embodiment of the present invention.

FIG. 64 shows a sectional view of a semiconductor device of the ninth embodiment of the present invention, including a p type impurity layer 10. The remaining structures are the same structures as shown from the first to eighth embodiments. FIG. 65 shows a sectional view of another semiconductor device of the ninth embodiment of the present invention.

Figure 66:
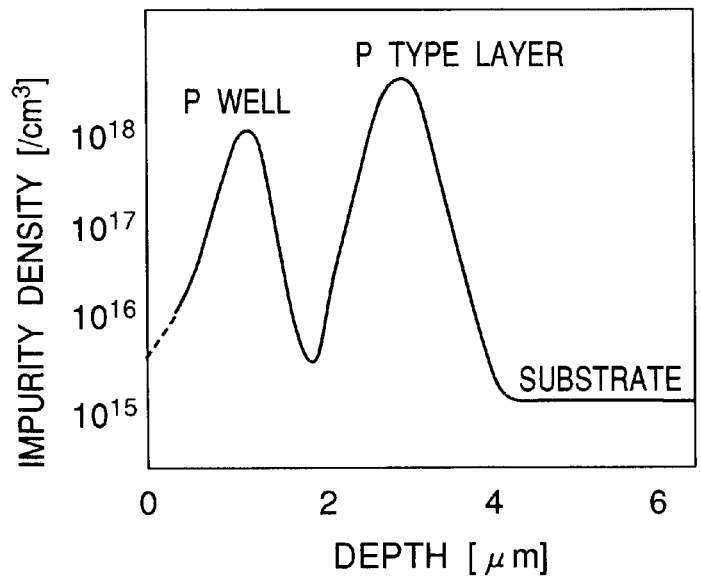
FIG. 66 is an impurity density distribution of a C–C' cross-section of the semiconductor substrate in FIG. 64.

FIG. 66 shows an impurity density distribution of a C–C' cross-section of the semiconductor substrate in FIG. 64. An impurity density distribution of a B–B' cross-section in FIG. 64 is shown in FIG. 10.

As in the eighth embodiment, the semiconductor device is divided roughly into an element region (the memory cell region) for storing information of large-capacity mainly, and an element region (the logic circuit region) for executing logical calculations while exchanging information of large-capacity with the memory cell region.

Further, as in the eighth embodiment, the memory cell region comprises mainly NMOSFET. The logic circuit region comprises mainly CMOSFET.

As in the eighth embodiment, the plurality of transistors or single transistor is formed on the retrograde p well 8, the retrograde n well 4 and the retrograde n well 9 (not shown), and the CMOS is formed on the logic circuit region. In this case, in the retrograde wells, the channel implantation layer for punch-through prevention and threshold control is formed at the depth of 0~0.2 μm from the substrate as needed. In addition, the impurity layer of the channel cut implantation or the like for control of formation of the channel is formed under the field oxide film 24 as needed. This impurity layer may or may not be combined with the retrograde p well 3.

Further, the CMOS as the logic circuit may be formed by transistors formed on the retrograde n well 4 and the retrograde p well 3. A transistor as the memory cell also may be formed on the retrograde p well 3. At this time, as shown in FIG. 65, the retrograde p well 3 may be formed on the p type impurity layer 10. Therefore, latch-up resistance of the CMOSFETs of the logic circuit region can be maintained.

According to the substrate structure of the memory cell region, as with the second embodiment, soft error based on electrons can be controlled, because the potential barrier of electrons, generated by α-rays or the like in the p type semiconductor substrate 1, with respect to the upper side of the retrograde p well 3, becomes large, by the existence of the n type impurity layer 5, and electron flow to the source/drain 25 on the retrograde p well 3 is interrupted.

Further, the semiconductor substrate 1, the retrograde p wells 3,8, the p type impurity layer 10, the n type impurity layer 5 and the p type impurity layer 2 are in electrical continuity. Therefore, no setting of each potential independently is required. Accordingly, restriction of element layout under increasing number of terminals disappears, and it is also possible to manufacture a fine semiconductor device.

Furthermore, substrate resistance is decreased by the existence of the p type impurity layer 10 in the logic circuit region. Latch up resistance can be improved effectively in the logic circuit region which needs particularly high latch up resistance. For improvement of the latch up resistance, it is preferred that the peak concentration of a p type impurity layer 10 is higher than that of the p well.

Figure 67:
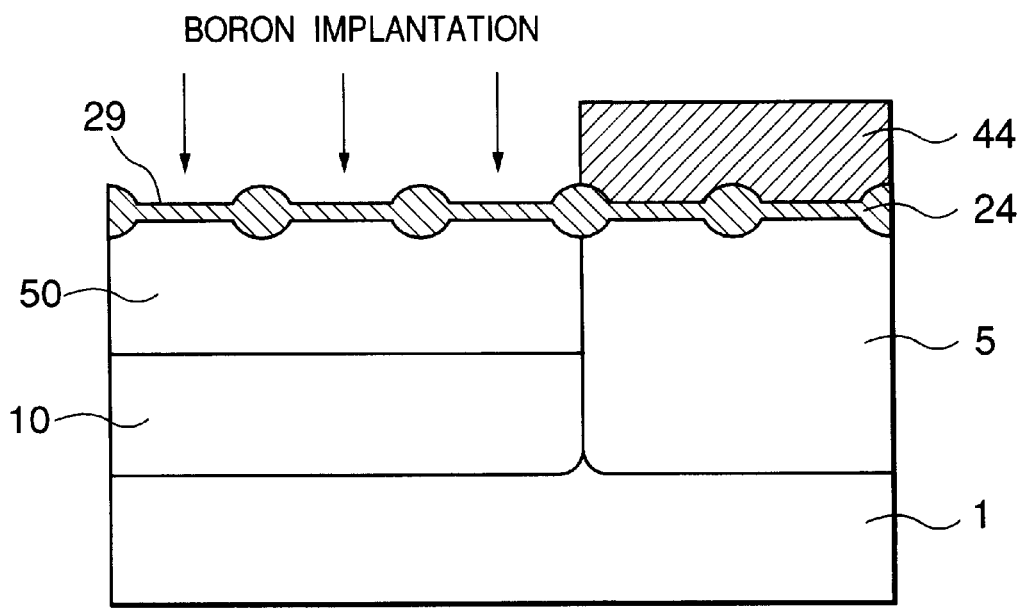
FIG. 67 is a sectional view of a process step of manufacturing the substrate of the semiconductor device of the ninth embodiment.

FIG. 67 shows a sectional view of a process step of manufacturing the substrate of the semiconductor device of the ninth embodiment. As in the eighth embodiment, the field oxide film 24 is formed on the separation region on the main surface of the p type semiconductor substrate 1, and the low concentration n type impurity layer 5 is formed in the memory cell region after forming the oxide film 29 on the active region.

When the impurity concentration of implanted phosphorus is low and the thermal annealing temperature is high or the thermal annealing time is long, as shown in FIG. 60, as in the first embodiment, there is the case that the p type impurity layer is formed in the formation region for the n type impurity layer 5. However, there is no problem about the formed p type impurity layer.

As shown in FIG. 67, a resist 44 is formed. The resist 44 has an opening portion on the logic circuit region. Boron, which is of p type impurity ions, is implanted with the high energy through the opening portion in the formation region by conditions of 500 keV~10 MeV, $5\times10^{12}$~$1\times10^{16}/cm^2$, and the p type impurity layer 10 is formed. A p type impurity layer 50 is also formed by boron implantation.

After that, as in the eighth embodiment, the retrograde p wells 3, 8 and the retrograde n wells 4, 9 are formed.

Conversely, the retrograde wells 3, 4, 8 and 9 are formed before the p type impurity layer 10.

The transistor, the interlayer dielectric film 30, the contact hole and the capacitor or the like are formed, and the wiring is formed (not shown).

According to the method of manufacturing of the semiconductor device in the ninth embodiment, as mentioned above, soft error based on electrons can be controlled, because the potential barrier of electrons, generated by α-rays or the like in the p type semiconductor substrate 1, with respect to the upper side of the retrograde p well 3, becomes larger by the existence of the n type impurity layer 5, and electron flow to the source/drain 25 on the retrograde p well 3 is interrupted.

Further, the semiconductor substrate 1, the retrograde p well 3, 8, the p type impurity layer 10, the n type impurity layer 5 and the p type impurity layer 2 are in electrical continuity. Therefore, no setting of each potential independently is required. Accordingly, as in the eighth embodiment, restriction of element layout under increasing number of terminals disappears, and it is also possible to manufacture a fine semiconductor device.

Furthermore, substrate resistance is decreased by the existence of the p type impurity layer 10 in the logic circuit region. The latch up resistance can be improved effectively in the logic circuit region which needs particularly high latch up resistance. For improvement of latch up resistance, it is preferred that the peak concentration of the p type impurity layer is higher than that of the p well.

Tenth Embodiment

Figure 68:
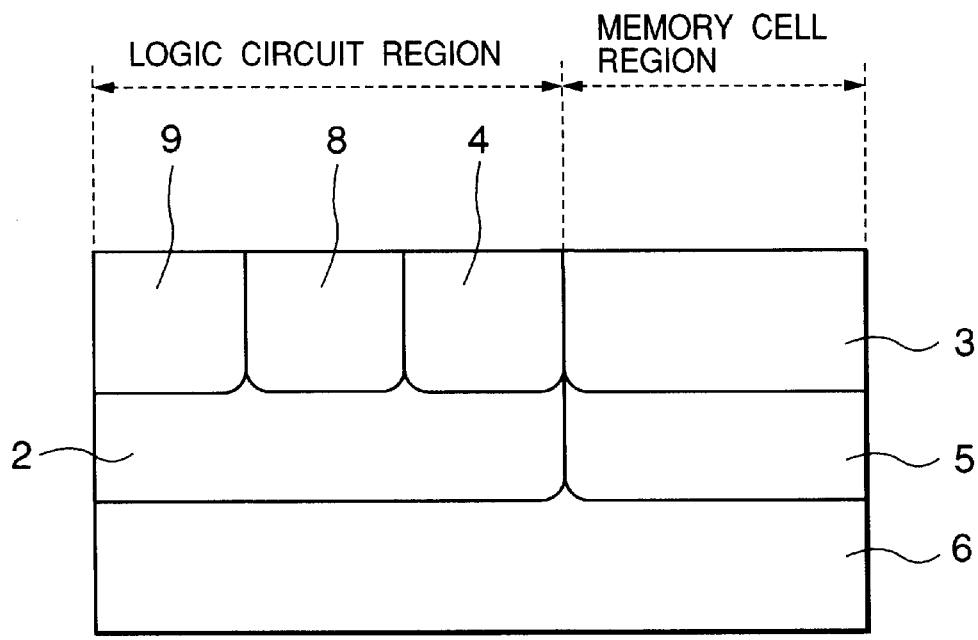
FIG. 68 is a sectional view of a semiconductor device of a tenth embodiment of the present invention.

FIG. 68 shows a sectional view of the semiconductor device of the tenth embodiment of the present invention, including the p type semiconductor substrate 6; the n type impurity layer 5 in the p type semiconductor substrate 6; the p type impurity layer 2 in the p type semiconductor substrate 6; the retrograde p wells 3, 8 in the p type semiconductor substrate 6; and the retrograde n wells 4, 9.

As in the eighth embodiment, the semiconductor device is divided roughly into the element region (the memory cell region) for storing information of large-capacity and the element region (the logic circuit region) for executing logical calculations while exchanging information of large-capacity with the memory cell region. The memory cell region comprises mainly NMOSFETs. The logic circuit region comprises mainly CMOSFETs.

Further, in the impurity structure of the semiconductor substrate, the structure of the memory cell region is the same structure as in the fourth embodiment, the structure of the logic circuit region is the same structure as in the third embodiment.

The plurality of or single transistor is formed on the retrograde p well 3 (not shown). As in the second embodiment, in the retrograde p well 3, the channel implantation layer for punch-through prevention and threshold control is formed at the depth of 0~0.2 m from the substrate as needed. In addition, the impurity layer of the channel cut implantation or the like for control of formation of the channel is formed under the field oxide film 24. This impurity layer may or may not be combined with the retrograde p well 3. The n type impurity layer 5 comes into contact with the bottom of the retrograde p well 3, but the n type impurity layer 5 may or not come into contact with the side of the retrograde p well 3.

As in the eighth embodiment, the plurality of transistors or the single transistor is formed on the retrograde p well 8, the retrograde n well 4 and the retrograde n well 9 (not shown), and the CMOS is formed on the logic circuit region. In this case, in the retrograde wells, the channel implantation layer for punch-through prevention and threshold control is formed at the depth of 0~0.2 μm from the substrate as needed. In addition, the impurity layer of the channel cut implantation or the like for control of formation of the channel is formed under the field oxide film 24 as needed. This impurity layer may or may not be combined with the retrograde p well 3.

Further, as in the eighth embodiment, the CMOS as the logic circuit may be formed by transistors on the retrograde n well 4 and the retrograde p well 3. The transistor as the memory cell also may be formed on the retrograde p well 3. At this time, as shown in the ninth embodiment, the retrograde p well 3 may be also widely formed on the formation region of the p type impurity layer 2. Therefore, the latch-up resistance of the CMOSFET of the logic circuit region can be maintained.

According to the substrate structure of the memory cell region, soft error based on electrons can be controlled, because the potential barrier of electrons, generated by α-rays or the like in the p type semiconductor substrate 6, with respect to the upper side of the retrograde p well 3, becomes larger by the existence of the n type impurity layer 5. In addition, the lifetime of the electrons becomes short in the p type semiconductor substrate 6, and electron flow to the source/drain 25 on the retrograde p well 3 is interrupted.

Further, the semiconductor substrate 6, the p type impurity layer 2, the n type impurity layer 5 and the retrograde p wells 3,8 are in electrical continuity. Therefore, no setting of each potential independently is required. Accordingly, restriction of element layout under increasing number of terminals disappears, and it is also possible to manufacture a fine semiconductor device.

Furthermore, substrate resistance is decreased by the high concentration p type semiconductor substrate 6. Latch up resistance can be improved effectively in the logic circuit region.

In addition, as in the fourth embodiment, since the n type impurity layer 5 is formed by epitaxial growth, the semiconductor device can obtain the p type semiconductor substrate 6 having high concentration and the retrograde p well 3 having low impurity concentration surface for forming a transistor. Therefore, the p type semiconductor substrate 6 and the retrograde p well 3 are easy to make in continuity, degradation of transistor threshold voltage or the like is reduced.

Figure 69:
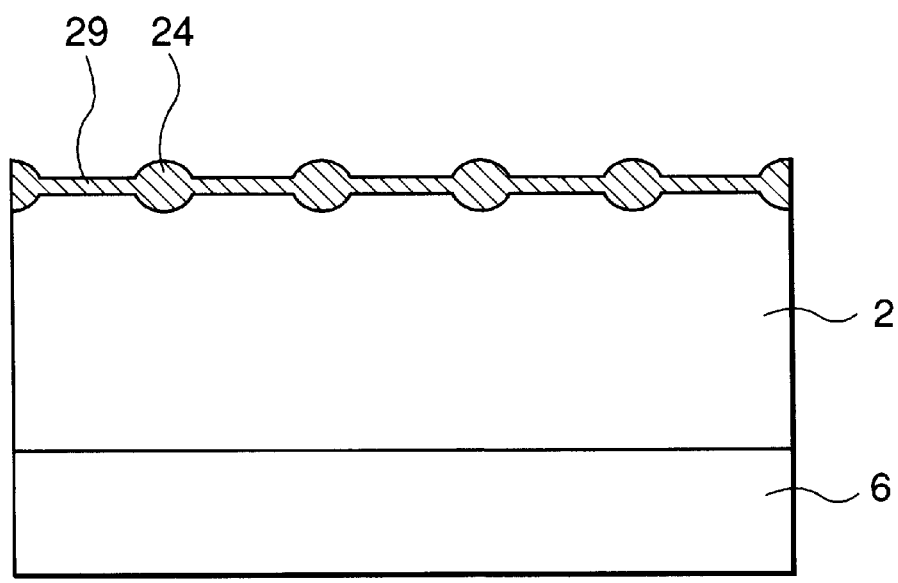
FIG. 69 is a sectional view of a process step of manufacturing the substrate of the semiconductor device of the tenth embodiment.

As shown in FIG. 69, the p type impurity layer 2 containing boron of a concentration on the order of $1 \times 10^{15}/cm^3$ is formed on the p type semiconductor substrate 6 containing boron of a concentration on the order of $1 \times 10^{19}/cm^3$ by epitaxial growth. The thickness of the p type impurity layer 2 is 2~10 μm.

The field oxide film 24 is formed on the separation region on the main surface of the p type impurity layer 2, and the oxide film 29 for the gate oxide film 26 is formed on the active region. The field oxide film 24 may be formed first; conversely, the oxide film 29 may be formed first.

After that, as in the eighth embodiment, the n type impurity layer 5, the retrograde p wells 3, 8, the retrograde n wells 4, 9 and the transistor are formed.

According to the method of manufacturing of the semiconductor device in the tenth embodiment, as mentioned above, soft error based on electrons can be controlled, because the potential barrier of electrons, generated by α-rays or the like in the p type semiconductor substrate 6, with respect to the upper side of the retrograde p well 3, becomes larger by the existence of the n type impurity layer 5. In addition, the lifetime of the electrons becomes short in the p type semiconductor substrate 6, and the electron flow to the source/drain 25 on the retrograde p well 3 is interrupted.

Further, the semiconductor substrate 6, the p type impurity layer 2, the n type impurity layer 5 and the retrograde p wells 3,8 are in electrical continuity. Therefore, no setting of each potential independently is required. Accordingly, restriction of element layout under increasing number of terminals disappears, and it is also possible to manufacture a fine semiconductor device.

Furthermore, substrate resistance is decreased by the high concentration p type semiconductor substrate 6. The latch up resistance can be improved effectively in the logic circuit region.

In addition, since the n type impurity layer 5 is formed by epitaxial growth, the semiconductor device can obtain the p type semiconductor substrate 6 having high concentration and the retrograde p well 3 having the low impurity concentration surface for forming a transistor. Therefore, the p type semiconductor substrate 6 and the retrograde p well 3 are easy to make in continuity, degradation of transistor threshold voltage or the like is reduced, and range of process conditions, for example control of impurity concentration, can be set broadly in the manufacturing process.

Eleventh Embodiment

Figure 70:
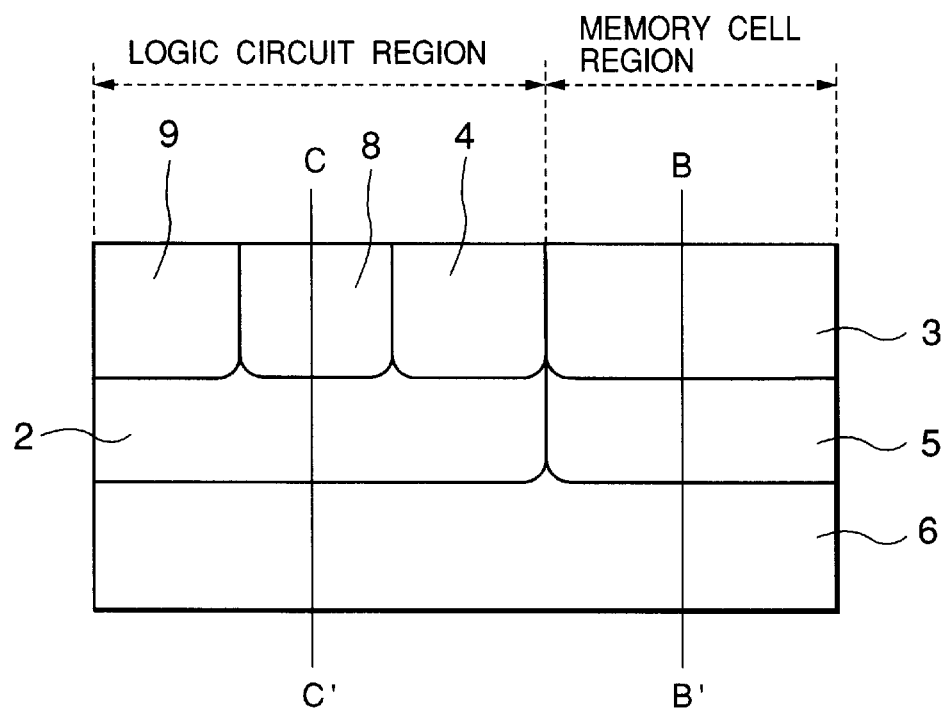
FIG. 70 is a sectional view of a semiconductor device of an eleventh embodiment of the present invention.

FIG. 70 shows a sectional view of the semiconductor device of the eleventh embodiment of the present invention, including the p type semiconductor substrate 6; the n type impurity layer 5 in the p type semiconductor substrate 6; the p type impurity layer 10 in the p type semiconductor substrate 6; the retrograde p wells 3, 8 in the p type semiconductor substrate 6; and the retrograde n wells 4, 9.

As in the eighth embodiment, the semiconductor device is divided roughly into the element region (the memory cell region) for storing information of large-capacity and the element region (the logic circuit region) for executing the logical calculation while exchanging information of large-capacity with the memory cell region. The memory cell region comprises mainly NMOSFETs. The logic circuit region comprises mainly CMOSFETs.

Figure 71:
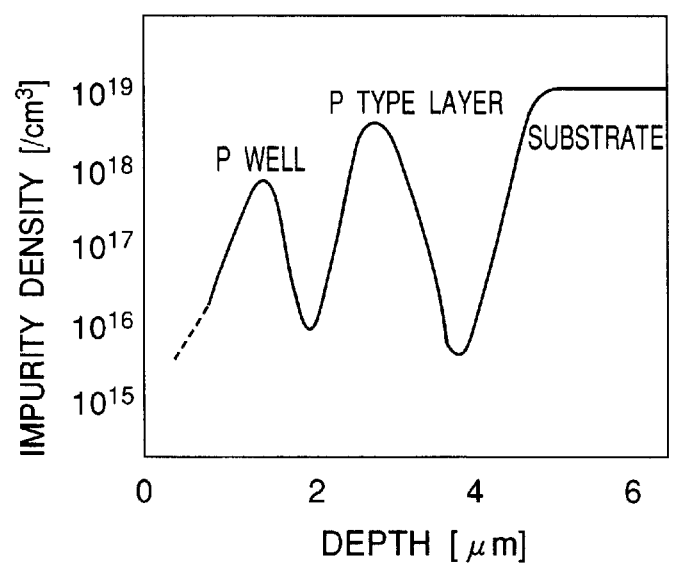
FIG. 71 is an impurity density distribution of a C–C' cross-section of the semiconductor substrate in FIG. 70.

FIG. 71 shows an impurity density distribution of a C–C' cross-section of the semiconductor substrate in FIG. 70. An impurity density distribution of a B–B' cross-section in FIG. 70 is shown in FIG. 33 in the fourth embodiment.

The plurality of or single transistor is formed on the retrograde p well 3 (not shown). As in the second embodiment, in the retrograde p well 3, the channel implantation layer for punch-through prevention and threshold control is formed at the depth of 0~0.2 μm from the substrate as needed. In addition, the impurity layer of the channel cut implantation or the like for control of formation of the channel is formed under the field oxide film 24. This impurity layer may or may not be combined with the retrograde p well 3. The n type impurity layer 5 comes into contact with the bottom of the retrograde p well 3, but the n type impurity layer 5 may or not come into contact with the side of the retrograde p well 3.

As in the eighth embodiment, the plurality of transistors or single transistor is formed on the retrograde p well 8, the retrograde, n well 4 and the retrograde n well 9 (not shown), and the CMOS is formed on the logic circuit region. In this case, in the retrograde wells, the channel implantation layer for punch-through prevention and threshold control is formed at the depth of 0~0.2 μm from the substrate as needed. In addition, the impurity layer of the channel cut implantation or the like for control of formation of the channel is formed under the field oxide film 24 as needed. This impurity layer may or may not be combined with the retrograde p well 3.

Further, as in the eighth embodiment, the CMOS as the logic circuit may be formed by transistors on the retrograde n well 4 and the retrograde p well 3. The transistor as the memory cell also may be formed on the retrograde p well 3. At this time, the retrograde p well 3 may be also widely formed on the formation region of the p type impurity layer 10. Therefore, the latch-up resistance of the CMOSFET of the logic circuit region can be maintained.

According to the substrate structure of the memory cell region, as in the fourth embodiment, soft error based on electrons can be controlled, because the potential barrier of the electrons, generated by α-rays or the like in the p type semiconductor substrate 6, with respect to the upper side of the retrograde p well 3, becomes larger by the existence of the n type impurity layer 5, and electron flow to the source/drain 25 on the retrograde p well 3 is interrupted.

Further, the semiconductor substrate 6, the p type impurity layer 10, the n type impurity layer 5, the retrograde p wells 3,8 and the p type impurity layer 2 are in a electrical continuity. Therefore, no setting of each potential independently is required. Accordingly, restriction of element layout under increasing number of terminals disappears, and it is also possible to manufacture a fine semiconductor device.

Furthermore, substrate resistance is decreased by the existence of the p type impurity layer 10 in the logic circuit region and the high concentration p type semiconductor substrate 6. Latch up resistance can be improved effectively in the logic circuit region which needs particularly high latch up resistance. For improvement of the latch up resistance, it is preferred that the peak concentration of p type impurity layer 10 is higher than that of the retrograde p well 3.

Figure 72:
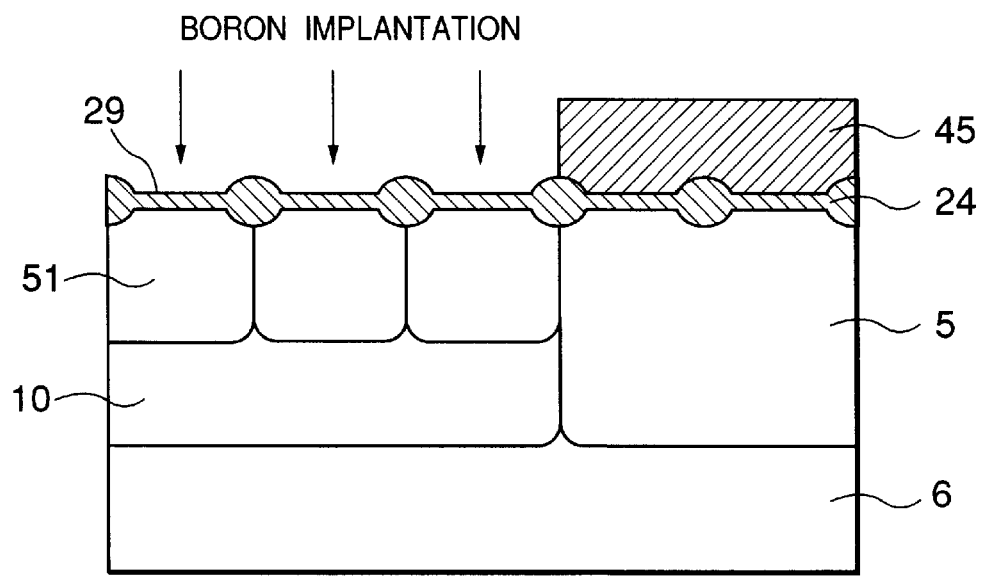
FIG. 72 is a sectional view of a process step of manufacturing the substrate of the semiconductor device of the eleventh embodiment.

FIG. 72 shows a sectional view of a process step of manufacturing the substrate of the semiconductor device of the eleventh embodiment. As in the tenth embodiment, the field oxide film 24 is formed on the separation region on the main surface of the p type semiconductor substrate 6 containing boron of concentration on the order of $1 \times 10^{19}/cm^3$. The oxide film 29 is formed on the active region of the p type semiconductor substrate 6. After that, the low concentration n type impurity layer 5 is formed on the memory cell region.

When the impurity concentration of implanted phosphorus is low and the thermal annealing temperature is high or the thermal annealing time is long, as in the first embodiment, there is the case that the p type impurity layer is formed in the formation region for the n type impurity layer 5. However, there is no problem about the formed p type impurity layer.

A resist 45 is formed. The resist 45 has an opening portion on the logic circuit region. Boron, which is of p type impurity ion, is implanted with the high energy through the opening portion in the formation region by conditions of 500 keV~10 MeV, $5 \times 10^{16}$~$1 \times 10^{16}/cm^2$, and the p type impurity layer 10 is formed. A p type impurity layer 51 is also formed by boron implantation.

After that, as in the eighth embodiment, the retrograde p wells 3, 8 and the retrograde n wells 4, 9 are formed.

Conversely, the retrograde wells 3, 4, 8 and 9 are formed before the p type impurity layer 10.

The transistor, the interlayer dielectric film 30, the contact hole and the capacitor or the like are formed, and the wiring is formed (not shown).

According to the method of manufacturing of the semiconductor device in the eleventh embodiment, as mentioned above, soft error based on electrons can be controlled, because the potential barrier of electrons, generated by α-rays or the like in the p type semiconductor substrate 6, with respect to the upper side of the retrograde p well 3, becomes greater by the existence of the n type impurity layer 5, and electron flow to the source/drain 25 on the retrograde p well 3 is interrupted.

Further, the semiconductor substrate 6, the p type impurity layer 10, the n type impurity layer 5, the retrograde p wells 3,8 and the p type impurity layer 2 are in electrical continuity. Therefore, no setting of each potential independently is required. Accordingly, restriction of element layout under increasing number of terminals disappears, and it is also possible to manufacture a fine semiconductor device.

Furthermore, substrate resistance is decreased by the existence the p type impurity layer 10 in the logic circuit region and the high concentration p type semiconductor substrate 6. Latch up resistance can be improved effectively in the logic circuit region which needs particularly high latch up resistance. For improvement of latch up resistance, it is preferred that the peak concentration of the p type impurity layer is higher than that of the retrograde p well 3.

Twelfth Embodiment

Figure 73:
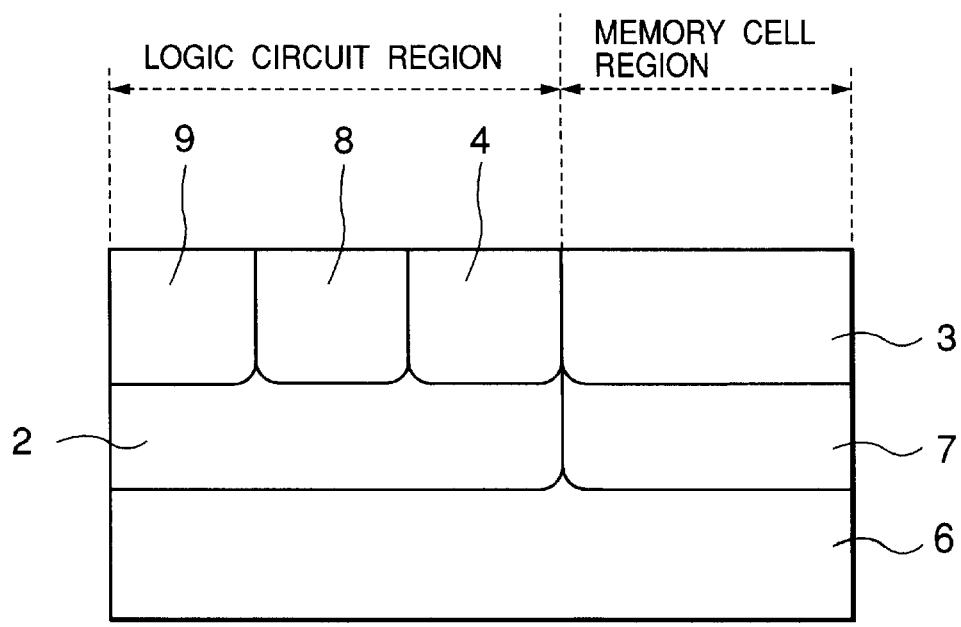
FIG. 73 is a sectional view of a semiconductor device of a twelfth embodiment of the present invention.

FIG. 73 shows a sectional view of the semiconductor device of the twelfth embodiment of the present invention, including the p type semiconductor substrate 6; the n type impurity layer 7 in the p type semiconductor substrate 6; the p type impurity layer 2 in the p type semiconductor substrate 6; the retrograde p wells 3, 8 in the p type semiconductor substrate 6; and the retrograde n wells 4, 9.

As in the eighth embodiment, the semiconductor device is divided roughly into the element region (the memory cell region) for storing information of large-capacity and the element region (the logic circuit region) for executing the logical calculation while exchanging information of large-capacity with the memory cell region. The memory cell region comprises mainly NMOSFETs. The logic circuit region comprises mainly CMOSFETs.

Further, in the impurity structure of the semiconductor substrate, the structure of the memory cell region is the same structure as in the fifth embodiment, the structure of the logic circuit region is the same structure as in the third embodiment.

As in the first embodiment, the plurality of or single transistor is formed on the retrograde p well 3 (not shown). In the retrograde p well 3, the channel implantation layer for punch-through prevention and threshold control is formed at the depth of 0~0.2 μm from the substrate as needed. In addition, the impurity layer of the channel cut implantation or the like for control of formation of the channel is formed under the field oxide film 24 as needed. This impurity layer may or may not be combined with the retrograde p well 3.

The n type impurity layer 7 comes into contact with the bottom of the retrograde p well 3, but the n type impurity layer 7 may or may not come into contact with the side of the retrograde p well 3. The retrograde p well 3 is separated from the p type impurity layer 2 by the n type impurity layer 7 and the retrograde n well 4.

The plurality of transistors or single transistor is formed on the retrograde p well 8, the retrograde n well 4 and the retrograde n well 9 (not shown), and the CMOS is formed on the logic circuit region. In this case, in the retrograde wells, the channel implantation layer for punch-through prevention and threshold control is formed at the depth of 0~0.2 μm from the substrate as needed. In addition, the impurity layer of the channel cut implantation or the like for control of formation of the channel is formed under the field oxide film 24 as needed. This impurity layer may or may not be combined with the retrograde p well 3.

According to the substrate structure of the semiconductor device, the lifetime of electrons in the p type semiconductor substrate 6 of the memory cell region becomes shortened by the high concentration p type semiconductor substrate 6. In addition, flow of electrons generated by α-rays or the like in the p type semiconductor substrate 6 to the source/drain 25 on the retrograde p well 3 is interrupted, because the retrograde p well 3 is separated electrically by the retrograde n well 4 and the n type impurity region layer 7. Therefore, soft errors can be more controlled.

Further, the retrograde p well 3 in the memory cell region and the retrograde p well 8 in the logic circuit region can be set in a opposing electrical potential respectively, because the retrograde p well 3 is separated from the retrograde p well 8 by the retrograde n wells 4,9. Therefore, the semiconductor device can be operated with a different substrate bias.

Furthermore, the semiconductor substrate 6, the p type impurity layer 2, and the retrograde p well 8 are in electrical continuity. Therefore, no setting of each potential independently is required. Accordingly, restriction of element layout under increasing number of terminals disappears, and it is also possible to manufacture a fine semiconductor device.

As in the tenth embodiment, the substrate resistance is decreased by the high concentration p type semiconductor substrate 6. Latch up resistance can be improved effectively in the logic circuit region.

Figure 74:
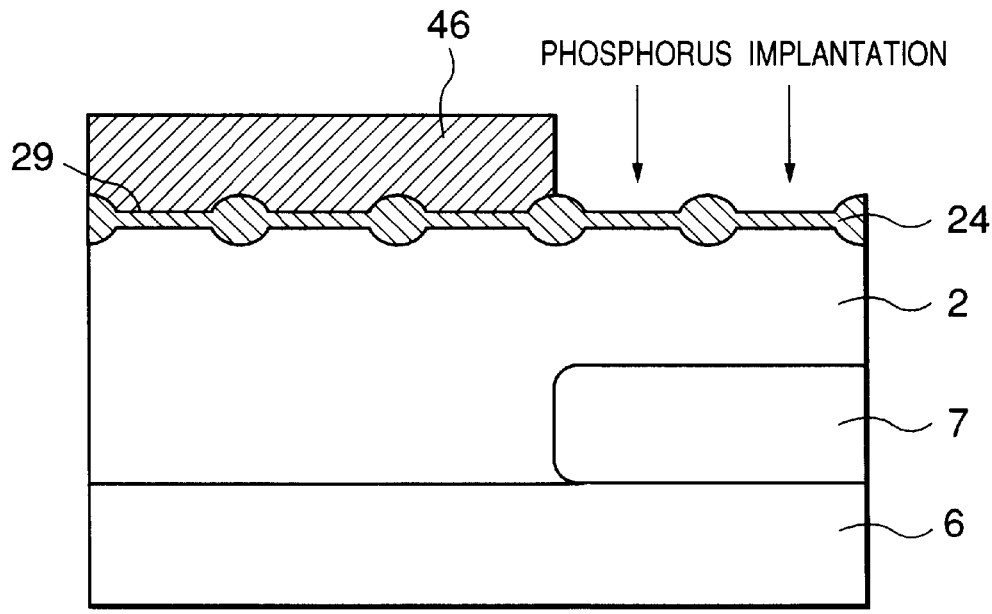
FIG. 74 is a sectional view of a process step of manufacturing the substrate of the semiconductor device of the twelfth embodiment.

FIG. 74 shows a sectional view of a process step of manufacturing the substrate of the semiconductor device of the twelfth embodiment.

As in the tenth embodiment, the p type impurity layer 2 is formed on the main surface of the p type semiconductor substrate 6 containing boron of concentration or the order of $1 \times 10^{19}/cm^3$. After that, the field oxide film 24 is formed on the separation region of the p type impurity layer 2. The oxide film 29 is formed on the active region of the p type impurity layer 2.

Next, as shown in FIG. 74, a resist 46 is formed. The resist 46 has an opening portion on the memory cell region. Phosphorus, which is a source of n type impurity ions, is implanted with high energy through the opening portion in the formation region by conditions of 500 keV~10 MeV, $1 \times 10^{12} \sim 1 \times 10^{14}/cm^2$, and the n type impurity region 7 is formed.

After that, as in the eighth embodiment, the retrograde p wells 3, 8 and the retrograde n wells 4, 9 are formed.

Conversely, the retrograde wells 3, 4, 8 and 9 are formed preceding the n type impurity layer 7.

The transistor, the interlayer dielectric film 30, the contact hole and the capacitor or the like are formed, and the wiring is formed (not shown).

According to the method of manufacturing of the semiconductor device in the twelfth embodiment, as mentioned above, the retrograde p well 3 in the memory cell region and the retrograde p well 8 in the logic circuit region can be set in opposing electrical potentials respectively, because the retrograde p well 3 is separated from the retrograde p well 8 by the retrograde n wells 4,9. Therefore, the semiconductor device can be operated with the different substrate bias.

Further, the lifetime of the electrons in the p type semiconductor substrate 6 of the memory cell region becomes shortened by the high concentration p type semiconductor substrate 6. In addition, the flow of electrons generated by α-rays or the like in the p type semiconductor substrate 6 to the source/drain 25 on the retrograde p well 3 is interrupted, because the retrograde p well 3 is separated electrically by the retrograde n well 4 and the n type impurity region layer 7.

Furthermore, according to the method of manufacturing of the semiconductor device in the twelfth embodiment, as mentioned above, the substrate resistance is decreased by the high concentration p type semiconductor substrate 6. The latch up resistance can be improved effectively in the logic circuit region.

Since the p type impurity layer 2 is formed by epitaxial growth, in the logic circuit region, the semiconductor device can obtain the p type semiconductor substrate 6 having high concentration and the retrograde well having a low impurity concentration surface for forming a transistor. Therefore, the p type semiconductor substrate 6, the p type impurity layer 2 and the retrograde p well 8 are easy to make in continuity, degradation of transistor threshold voltage or the like is reduced, and range of process conditions, for example control of impurity concentration, can be set broadly in the manufacturing process.

In the logic circuit region, no setting of each potential independently is required. Accordingly, as mentioned above, restriction of element layout under increasing number of terminals disappears, and it is also possible to manufacture a fine semiconductor device.

Thirteenth Embodiment

Figure 75:
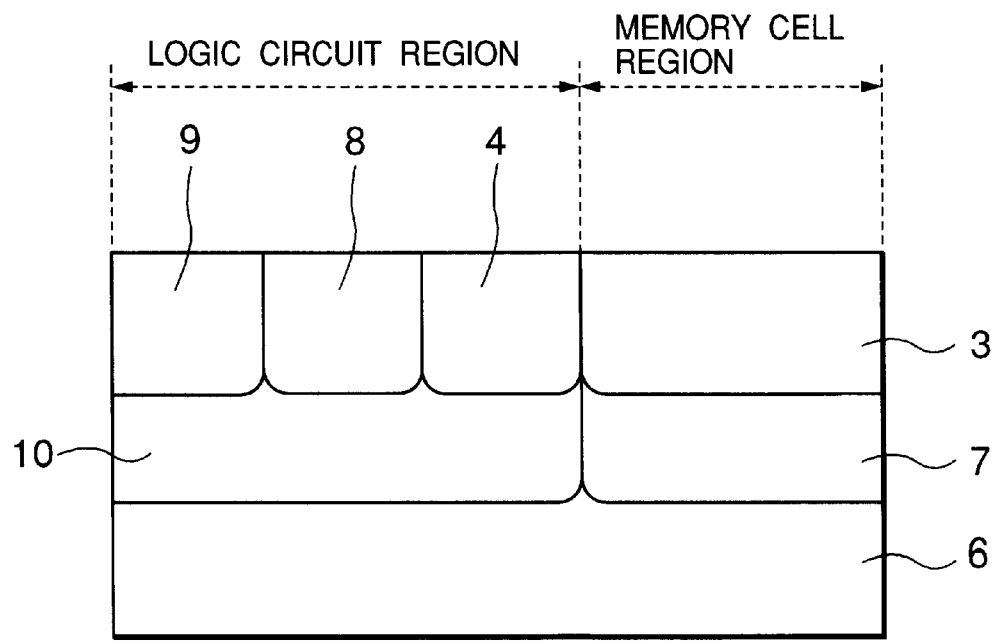
FIG. 75 is a sectional view of a semiconductor device of a thirteenth embodiment of the present invention.

FIG. 75 shows a sectional view of the semiconductor device of the thirteenth embodiment of the present invention, including the p type semiconductor substrate 6; the n type impurity layer 7 in the p type semiconductor substrate 6; the p type impurity layer 10 in the p type semiconductor substrate 6; the retrograde p wells 3, 8 in the p type semiconductor substrate 6; and the retrograde n wells 4, 9.

As in the eighth embodiment, the semiconductor device is divided roughly into an element region (the memory cell region) for storing information of large-capacity and an element region (the logic circuit region) for executing the logical calculations while exchanging information of large-capacity with the memory cell region. The memory cell region comprises mainly NMOSFETs. The logic circuit region comprises mainly CMOSFETs.

Further, in the impurity structure of the semiconductor substrate, the structure of the memory cell region is the same structure as in the fifth embodiment, the structure of the logic circuit region is the same structure as in the eleventh embodiment.

As in the first embodiment, the plurality of or single transistor is formed on the retrograde p well 3 (not shown). In the retrograde p well 3, the channel implantation layer for punch-through prevention and threshold control is formed at the depth of 0~0.2 μm from the substrate as needed. In addition, the impurity layer of the channel cut implantation or the like for control of formation of the channel is formed under the field oxide film 24 as needed. This impurity layer may or may not be combined with the retrograde p well 3.

The n type impurity layer 7 comes into contact with the bottom of the retrograde p well 3, but the n type impurity layer 7 may or may not come into contact with the side of the retrograde p well 3. The retrograde p well 3 is separated from the p type impurity layer 2 by the n type impurity layer 7 and the retrograde n well 4.

The plurality of transistors or single transistor is formed on the retrograde p well 8, the retrograde n well 4 and the retrograde n well 9 (not shown), and the CMOS is formed on the logic circuit region. In this case, in the retrograde wells, the channel implantation layer for punch-through prevention and threshold control is formed at a depth of 0~0.2 μm from the substrate as needed. In addition, the impurity layer of the channel cut implantation or the like for control of formation of the channel is formed under the field oxide film 24 as needed. This impurity layer may or may not be combined with the retrograde p well 3.

According to the substrate structure of the semiconductor device, the lifetime of electrons in the p type semiconductor substrate 6 of the memory cell region becomes shortened by the high concentration p type semiconductor substrate 6. In addition, flow of electrons generated by α-rays or the like in the p type semiconductor substrate 6 to the source/drain 25 on the retrograde p well 3 is interrupted, because the retrograde p well 3 is separated electrically by the retrograde n well 4 and the n type impurity region layer 7. Therefore, soft error can be more effectively controlled.

Further, the retrograde p well 3 in the memory cell region and the retrograde p well 8 in the logic circuit region can be set as opposing electrical potentials respectively, because the retrograde p well 3 is separated from the retrograde p well 8 by the retrograde n wells 4, 9. Therefore, the semiconductor device can be operated with substrate bias.

Furthermore, the semiconductor substrate 6, the p type impurity layer 10, and the retrograde p well 8 are in electrical. Therefore, no setting of each potential independently is required. Accordingly, restriction of element layout under increasing number of terminals disappears, and it is also possible to manufacture a fine semiconductor device.

As in the eleventh embodiment, substrate resistance is decreased by the existence the high p type impurity layer 10 in the logic circuit region and the high concentration p type semiconductor substrate 6. The latch up resistance can be improved effectively in the logic circuit region which needs particularly the high latch up resistance.

Figure 76:
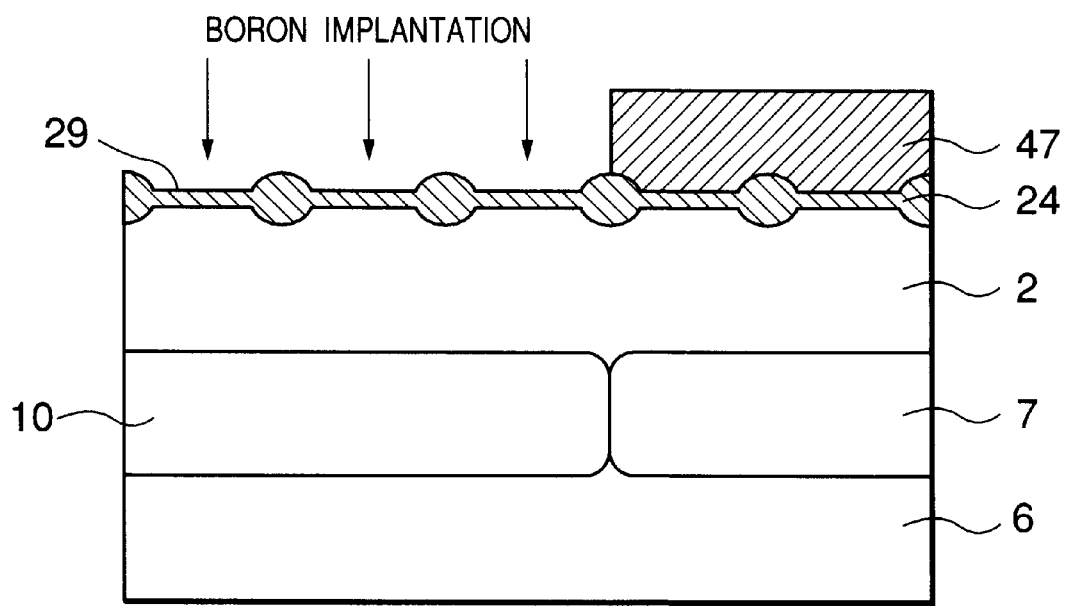
FIG. 76 is a sectional view of a process step of manufacturing the substrate of the semiconductor device of the thirteenth embodiment.
Figure 77:
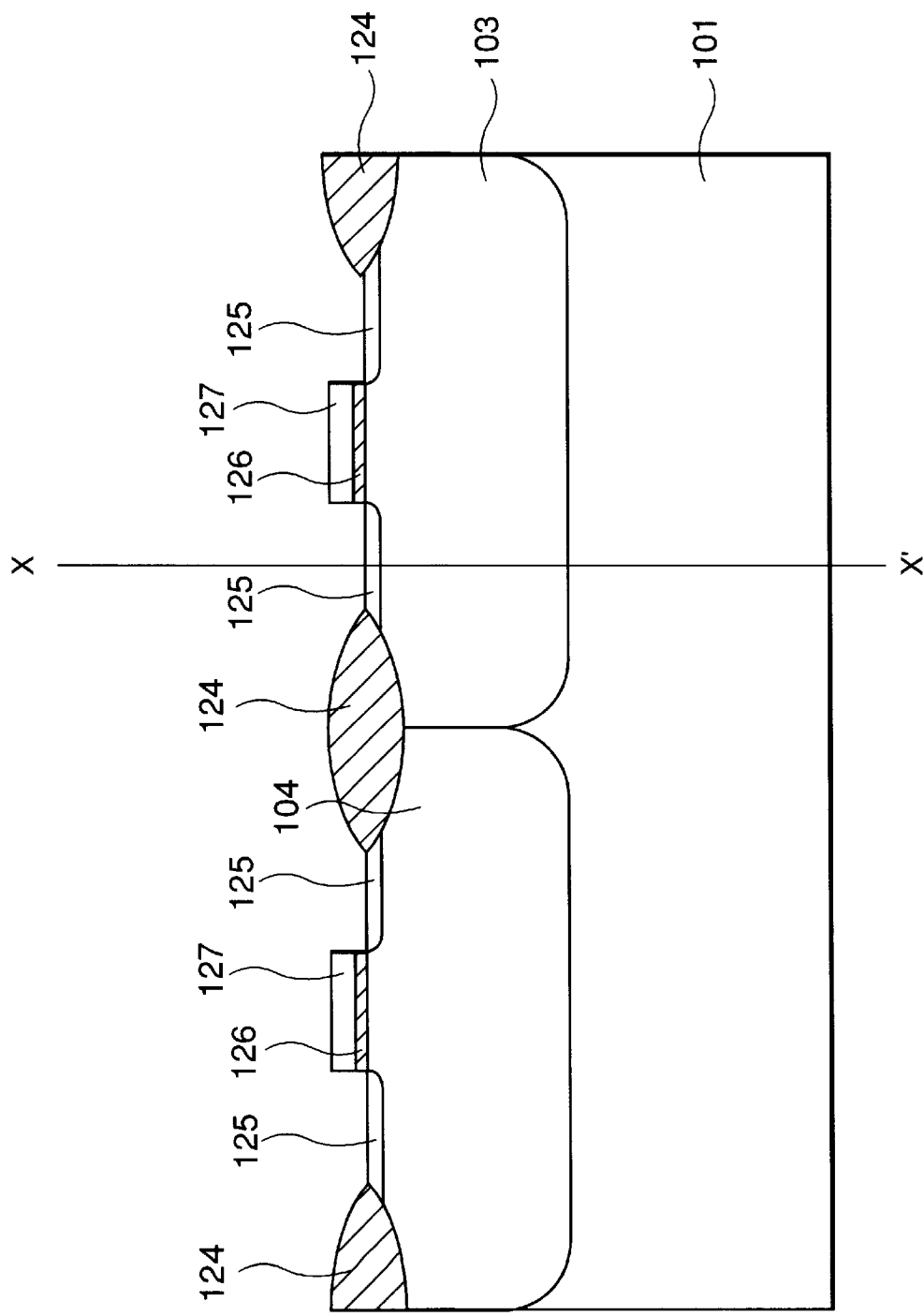
FIG. 77 is a sectional view of a conventional semiconductor device.
Figure 78:
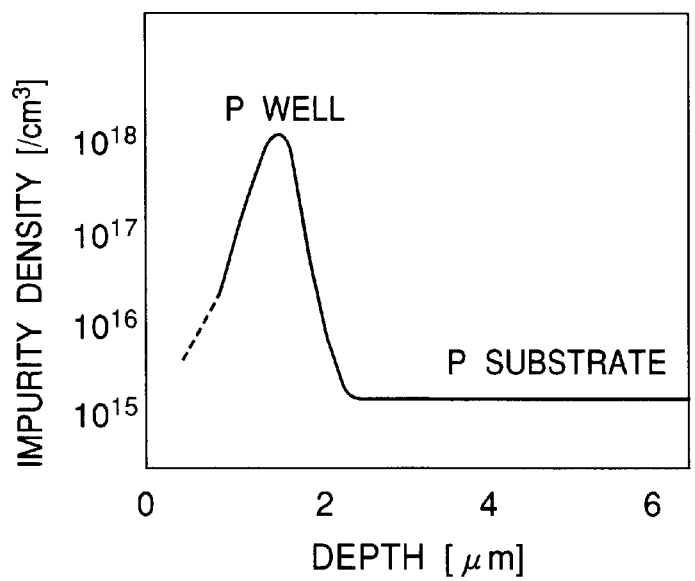
FIG. 78 is an impurity density distribution of the depth direction in a substrate section of a X–X' cross-section of the semiconductor device in FIG. 77.
Figure 79:
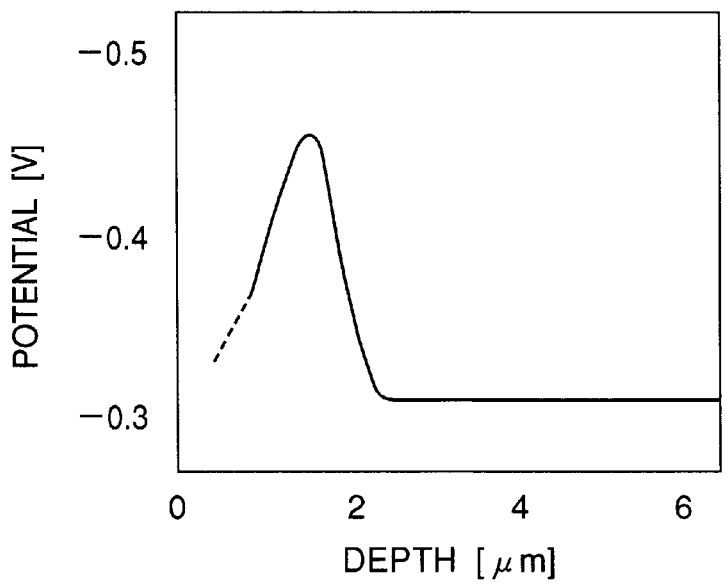
FIG. 79 is an internal potential in the X–X' cross-section.
Figure 80:
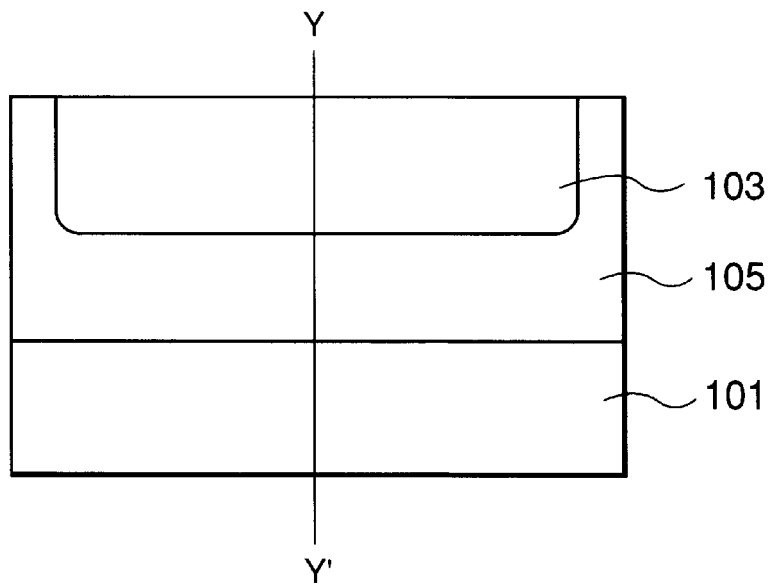
FIG. 80 is a sectional view of a part of a substrate of a conventional semiconductor device.
Figure 81:
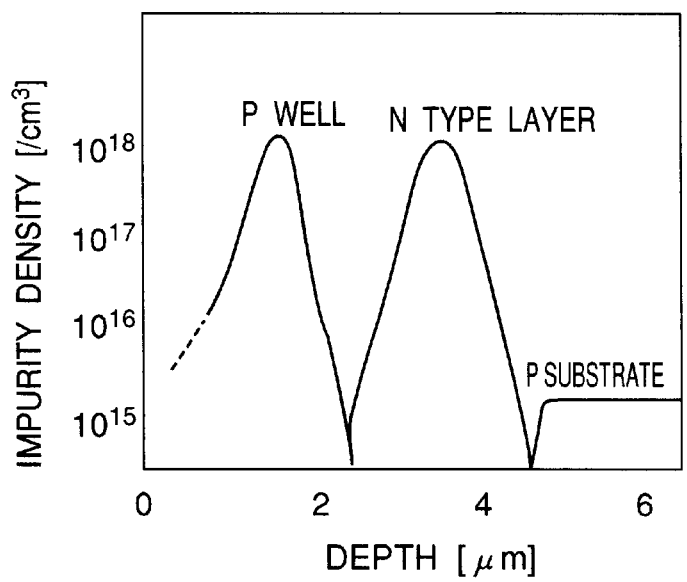
FIG. 81 is an impurity density distribution of the depth direction in a Y–Y' cross-section of the semiconductor device in FIG. 80.
Figure 82:
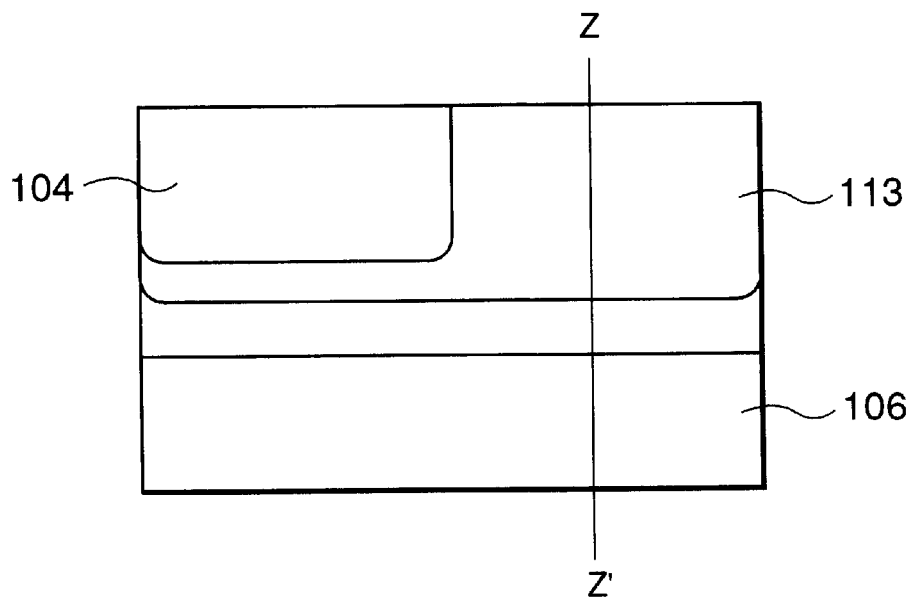
FIG. 82 is a sectional view of a part of a substrate of a conventional semiconductor device.
Figure 83:
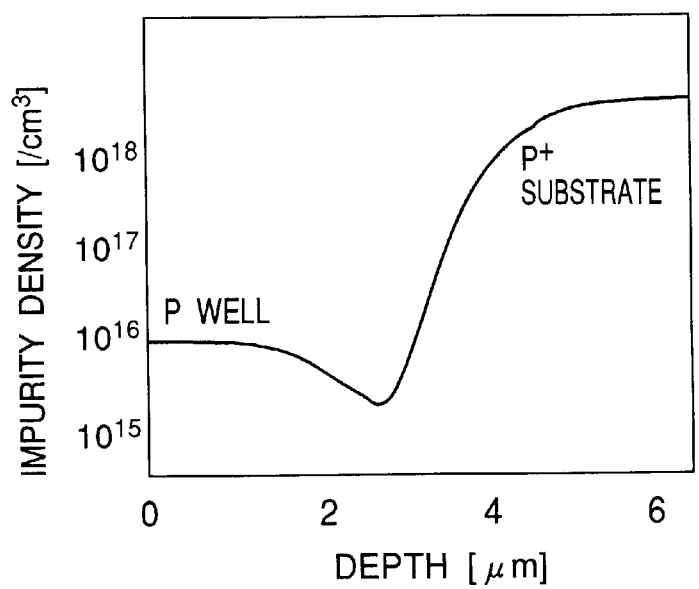
FIG. 83 is an impurity density distribution of the depth direction in a Z–Z' cross-section of the semiconductor device in FIG. 82.

FIG. 76 shows a sectional view of a process step of manufacturing the substrate of the semiconductor device of the thirteenth embodiment.

Like the twelfth embodiment, the p type impurity layer 2 is formed on the main surface of the p type semiconductor substrate 6 containing boron of concentration on the order of $1 \times 10^{19}/cm^3$. After that, the field oxide film 24 is formed on the separation region of the p type impurity layer 2. The oxide film 29 is formed on the active region of the p type impurity layer 2, and the n type impurity layer 7 is formed in the memory cell region of the semiconductor device.

Next, as shown in FIG. 76, a resist 47 is formed. The resist 47 has an opening portion on the logic circuit region. Boron, which is a source of p type impurity ions, is implanted with high energy through the opening portion in the formation region by conditions of 500 keV~10 MeV, $5 \times 10^{12} \sim 1 \times 10^{16}/cm^2$, and the p type impurity layer 10 is formed.

After that, as in the eighth embodiment, the retrograde p wells 3, 8 and the retrograde n wells 4, 9 are formed.

Conversely, the retrograde wells 3, 4, 8 and 9 are formed before the n type impurity layer 7 and the p type impurity layer 10.

The transistor, the interlayer dielectric film 30, the contact hole and the capacitor or the like are formed, and the wiring is formed (not shown).

According to the method of manufacturing of the semiconductor device in the thirteenth embodiment, as mentioned above, the retrograde p well 3 in the memory cell region and the retrograde p well 8 in the logic circuit region can be set as opposing electrical potentials respectively, because the retrograde p well 3 is separated from the retrograde p well 8 by the retrograde n wells 4,9. Therefore, the semiconductor device can be operated with the different substrate bias.

Further, according to the method of manufacturing of semiconductor device in the thirteenth embodiment, as mentioned above, the lifetime of electrons in the p type semiconductor substrate 6 of the memory cell region becomes shortened by high concentration p type semiconductor substrate 6. In addition, the flow of electrons generated by α-rays or the like in the p type semiconductor substrate 6 to the source/drain 25 on the retrograde p well 3 is interrupted, because the retrograde p well 3 is separated electrically by the retrograde n well 4 and the n type impurity region layer 7. Therefore, soft error can be more effectively controlled.

Furthermore, the substrate resistance is decreased by the existence the p type impurity layer 10 and the p type semiconductor substrate 6 in the logic circuit region. The latch up resistance can be improved effectively in the logic circuit region which needs particularly high latch up resistance. For improvement of the latch up resistance, it is preferred that the peak concentration of the p type impurity layer is higher than that of the retrograde p well 3.

Since the p type impurity layer 2 is formed by epitaxial growth, in the logic circuit region, the semiconductor device can obtain the p type semiconductor substrate 6 having high concentration and the retrograde well having a low impurity concentration surface for forming a transistor. Therefore, the p type semiconductor substrate 6, the p type impurity layer 10 and the retrograde p well 8 are easy to make with electrical continuity, degradation of transistor threshold voltage or the like is reduced, and range of process conditions, for example control of impurity concentration, can be set broadly in the manufacturing process.

In the logic circuit region, no setting of each potential independently is required. Accordingly, as mentioned above, restriction of element layout under increasing number of terminals disappears, and it is also possible to manufacture a fine semiconductor device.

What is claimed is:

1. A semiconductor device comprising:
   a semiconductor substrate of a first conductivity type and having a first impurity concentration,
   a retrograde well of said first conductivity type and having a second impurity concentration with an impurity concentration peak, formed in a main surface of said semiconductor substrate,
   a first impurity layer having a third impurity concentration in contact with the underside of said retrograde well being smaller in concentration than an impurity concentration peak of said first impurity concentration and the concentration peak of said second impurity concentration, and
   an element formed on said retrograde well
   wherein said element is a MOS type transistor, and
   said semiconductor device further comprising a second impurity layer of a second conductivity type having a fourth impurity concentration and adjoining a third impurity layer of said first conductivity type having a fifth impurity concentration, said second and said third impurity layers being formed in another main surface of said semiconductor substrate, and
   a CMOS transistor formed on at least said second and said third impurity layers for controlling said MOS type transistor.

2. The semiconductor device of claim 1,
   wherein a fourth impurity layer of said first conductivity type is formed under at least said second and third impurity layers.

3. The semiconductor device of claim 1,
   wherein said first impurity layer is of said second conductivity type.

4. The semiconductor device of claim 1,
   wherein said impurity concentration peak of said second impurity concentration and an impurity concentration peak of said third impurity concentration are smaller in concentration than said impurity concentration peak of said first impurity concentration.

5. The semiconductor device of claim 4,
   wherein a fifth impurity layer of said first conductivity type is formed under at least said second and third impurity layers.

6. The semiconductor device of claim 4,
   wherein said first impurity layer is of said second conductivity type.

7. The semiconductor device of claim 4,
   wherein said MOS type transistor is a transistor constituting a memory cell.

8. The semiconductor device of claim 4,
   wherein said first impurity layer is formed more deeply than a separation insulation film formed in the main surface of said semiconductor substrate.

9. The semiconductor device of claim 1,
   wherein said MOS type transistor is a transistor constituting a memory cell.

10. The semiconductor device of claim 1,
    wherein said first impurity layer is formed more deeply than a separation insulation film formed in the main surface of said semiconductor substrate.

11. The semiconductor device of claim 1:
    wherein said fifth impurity concentration has an impurity concentration peak, and said impurity concentration peak of said second impurity concentration and fifth impurity concentration are formed at roughly same depth position from the surface of said semiconductor substrate and having nearly same concentration.

12. The semiconductor device of claim 11:
    wherein said impurity concentration peak of said second impurity concentration and said third impurity concentration are smaller in concentration than said impurity concentration peak of said first impurity concentration.

13. A semiconductor device comprising:
    a semiconductor substrate of a first conductivity type and having a first impurity concentration,
    a first impurity layer of said first conductivity type and having a second impurity concentration with an impurity concentration peak smaller than said first impurity concentration, formed in a main surface of said semiconductor substrate,
    a second impurity layer of a second conductivity type and having a third impurity concentration with an impurity concentration peak smaller than said first impurity concentration, coming into contact with the underside of said first impurity layer, and
    a MOS type transistor formed on said first impurity layer,
    said semiconductor device further comprising a third impurity layer of said second conductivity type having a fourth impurity concentration adjoining a fourth impurity layer of said first conductivity type having a fifth impurity concentration, said third and said fourth impurity layers being formed in another main surface of said semiconductor substrate, and
    a CMOS transistor formed on at least said third and said fourth impurity layers for controlling said MOS type transistor.

14. The semiconductor device of claim 13, wherein a fifth impurity layer of said first conductivity type is formed under at least said third and fourth impurity layers.

15. The semiconductor device of claim 13, wherein said MOS type transistor is a transistor constituting a memory cell.

16. The semiconductor device of claim 13, wherein said second impurity layer is formed more deeply than a separation insulation film formed in the main surface of said semiconductor substrate.

17. The semiconductor device of claim 13, wherein said third impurity concentration is lower than said second impurity concentration.

18. The semiconductor device of claim 13:

wherein said fifth impurity concentration has an impurity concentration peak, and said impurity concentration peak of said second impurity concentration and fifth impurity concentration are formed at roughly same depth position from the surface of said semiconductor substrate and having nearly same concentration.

19. A semiconductor device comprising:

a semiconductor substrate of a first conductivity type and having a first impurity concentration, a first impurity layer having a second impurity concentration with an impurity concentration peak, formed in a main surface of said semiconductor substrate, a second impurity layer having an impurity concentration peak of a third impurity concentration in contact with the underside of said first impurity layer, wherein said impurity concentration peak of said third impurity concentration is smaller than said first impurity concentration and said impurity concentration peak of said second impurity concentration, a memory cell transistor formed in a main surface of said first impurity layer, a third impurity layer having a fourth impurity concentration of a second conductivity type, formed in a main surface of said semiconductor substrate adjoining mutually other portions of said main surface of said semiconductor substrate, a fourth impurity layer having a fifth impurity concentration of said first conductivity type, and transistors of CMOS type formed at least in said third impurity layer and said fourth impurity layer.

20. The semiconductor device of claim 19, further comprising a fifth impurity layer having said first conductivity type formed at least under said third impurity layer and said fourth impurity layer.

21. The semiconductor device of claim 19, wherein said first impurity layer is of said second conductivity type.

22. The semiconductor device of claim 19, wherein said second impurity layer is formed more deeply than a separation insulation film formed in the main surface of said semiconductor substrate.

23. The semiconductor device of claim 19, wherein said impurity concentration peak of said second impurity concentration and said third impurity concentration are smaller in concentration than an impurity concentration peak of said first impurity concentration.

24. The semiconductor device of claim 23, further comprising a fifth impurity layer having said first conductivity type formed at least under said third impurity layer and said fourth impurity layer.

25. The semiconductor device of claim 23, wherein said first impurity layer is of said second conductivity type.

26. The semiconductor device of claim 19:

wherein said fifth impurity concentration has an impurity concentration peak, and said impurity concentration peak of said second impurity concentration and fifth impurity concentration are formed at roughly same depth position from the surface of said semiconductor substrate and having nearly same concentration.

27. The semiconductor device of claim 26:

wherein said impurity concentration peak of said second impurity concentration and third impurity concentration are smaller in concentration than said impurity concentration peak of said first impurity concentration.

* * * * *